(12) United States Patent
Sato

(10) Patent No.: US 12,324,257 B2
(45) Date of Patent: Jun. 3, 2025

(54) IMAGING DEVICE AND ELECTRONIC DEVICE

(71) Applicant: SONY SEMICONDUCTOR SOLUTIONS CORPORATION, Kanagawa (JP)

(72) Inventor: Yusuke Sato, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 400 days.

(21) Appl. No.: 17/787,842

(22) PCT Filed: Dec. 18, 2020

(86) PCT No.: PCT/JP2020/047544
§ 371 (c)(1),
(2) Date: Jun. 21, 2022

(87) PCT Pub. No.: WO2021/132102
PCT Pub. Date: Jul. 1, 2021

(65) Prior Publication Data
US 2023/0025911 A1    Jan. 26, 2023

(30) Foreign Application Priority Data
Dec. 26, 2019    (JP) .................................. 2019-236904

(51) Int. Cl.
*H10K 39/32*    (2023.01)
*H04N 25/616*    (2023.01)
(Continued)

(52) U.S. Cl.
CPC ......... *H10F 39/182* (2025.01); *H04N 25/771* (2023.01); *H10K 30/30* (2023.02);
(Continued)

(58) Field of Classification Search
CPC ........ H10K 39/32; H10K 30/30; H10K 30/81; H10K 39/00; H04N 25/771; H04N 25/616;
(Continued)

(56) References Cited

U.S. PATENT DOCUMENTS

2013/0341491 A1* 12/2013 Hirose ................ H01L 27/1464
250/208.1
2018/0076252 A1    3/2018 Togashi et al.
(Continued)

FOREIGN PATENT DOCUMENTS

CN        103404124 A    11/2013
JP        2017157816 A    9/2017
(Continued)

OTHER PUBLICATIONS

International Search Report from corresponding PCT application PCT/JP2020/047544, dated Mar. 16, 2021.

*Primary Examiner* — Georgia Y Epps
*Assistant Examiner* — Monica T Taba
(74) *Attorney, Agent, or Firm* — K&L Gates LLP

(57) ABSTRACT

Provided is a multilayer imaging device capable of both securing a wide sensitive region and securing an accumulated amount of charges. An imaging device according to an embodiment comprises a pixel, the pixel including a photoelectric conversion layer (15); a first electrode (11) positioned close to a first surface of the photoelectric conversion layer and electrically connected to the photoelectric conversion layer; a second electrode (16) positioned on a second surface opposite to the first surface of the photoelectric conversion layer; a charge accumulation electrode (12) disposed close to the first surface of the photoelectric conversion layer and spaced apart from the first electrode in a direction parallel to the first surface; and a third electrode (200) disposed at a position to have a portion overlapping a
(Continued)

gap between the first electrode and the charge accumulation electrode in a direction perpendicular to the first surface.

18 Claims, 32 Drawing Sheets

(51) Int. Cl.
    *H04N 25/771*      (2023.01)
    *H10F 39/18*      (2025.01)
    *H10K 30/30*      (2023.01)
    *H10K 30/81*      (2023.01)

(52) U.S. Cl.
    CPC ............. *H10K 30/81* (2023.02); *H10K 39/32* (2023.02); *H04N 25/616* (2023.01)

(58) Field of Classification Search
    CPC ........ H04N 25/17; H04N 25/76; H04N 25/59; H01L 27/14621; H01L 27/14641; H01L 27/14603; H01L 27/14612; H01L 27/14638; H01L 27/14665; H01L 27/14645; H01L 27/14636; H01L 27/14609

See application file for complete search history.

(56) References Cited

U.S. PATENT DOCUMENTS

| | | |
|---|---|---|
| 2018/0175102 A1 | 6/2018 | Togashi |
| 2018/0342558 A1* | 11/2018 | Hirata .................... H04N 25/65 |
| 2019/0214417 A1 | 7/2019 | Matsuo |
| 2020/0244911 A1 | 7/2020 | Sato et al. |
| 2020/0295219 A1 | 9/2020 | Moriwaki et al. |
| 2021/0288092 A1 | 9/2021 | Watanabe et al. |

FOREIGN PATENT DOCUMENTS

| | | |
|---|---|---|
| JP | 2018046039 A | 3/2018 |
| JP | 2019009437 A | 1/2019 |
| JP | 2019041018 A | 3/2019 |
| JP | 2019047294 A | 3/2019 |
| TW | 201944590 A | 11/2019 |
| TW | 201946257 A | 12/2019 |
| WO | 2019035270 A1 | 12/2019 |

\* cited by examiner

FIG.8
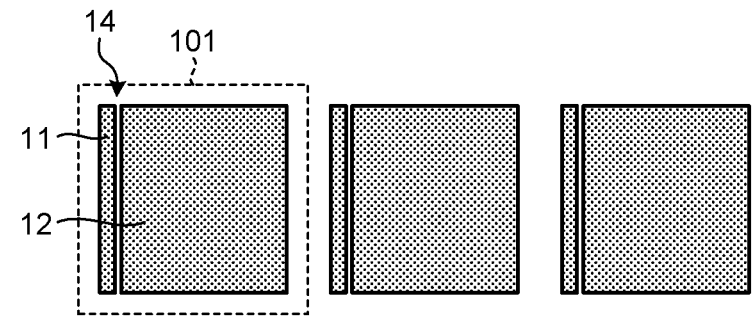
(a)
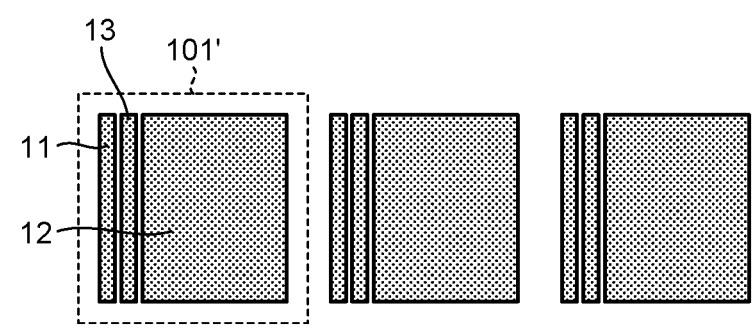
(b)

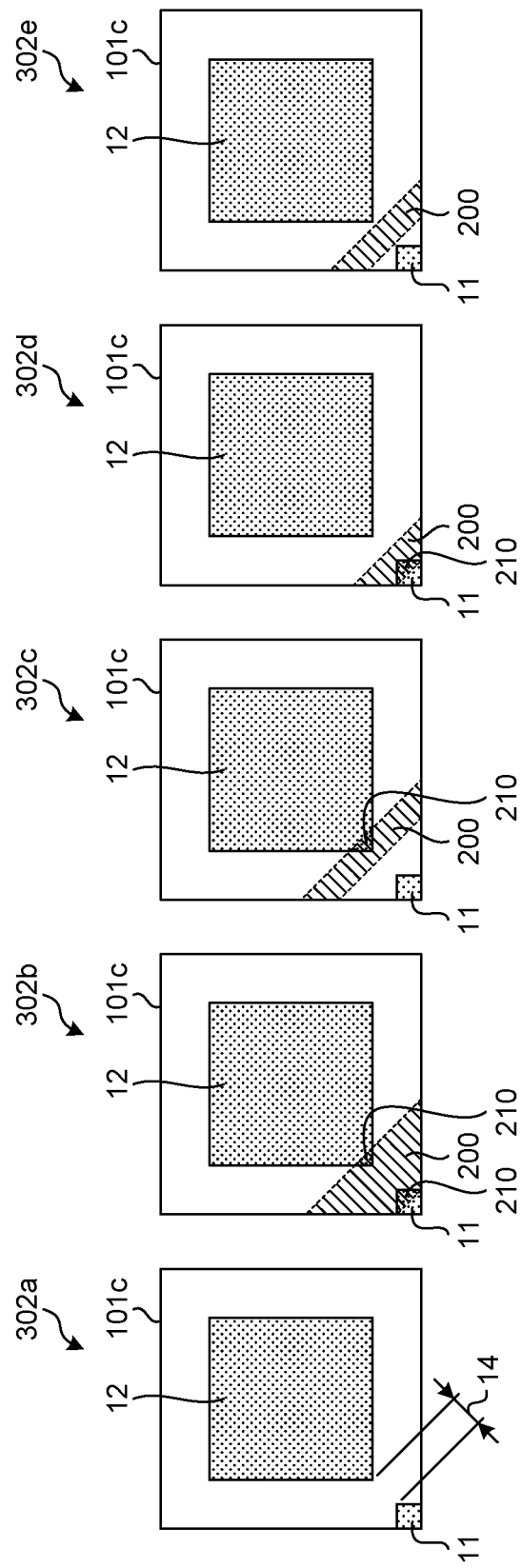

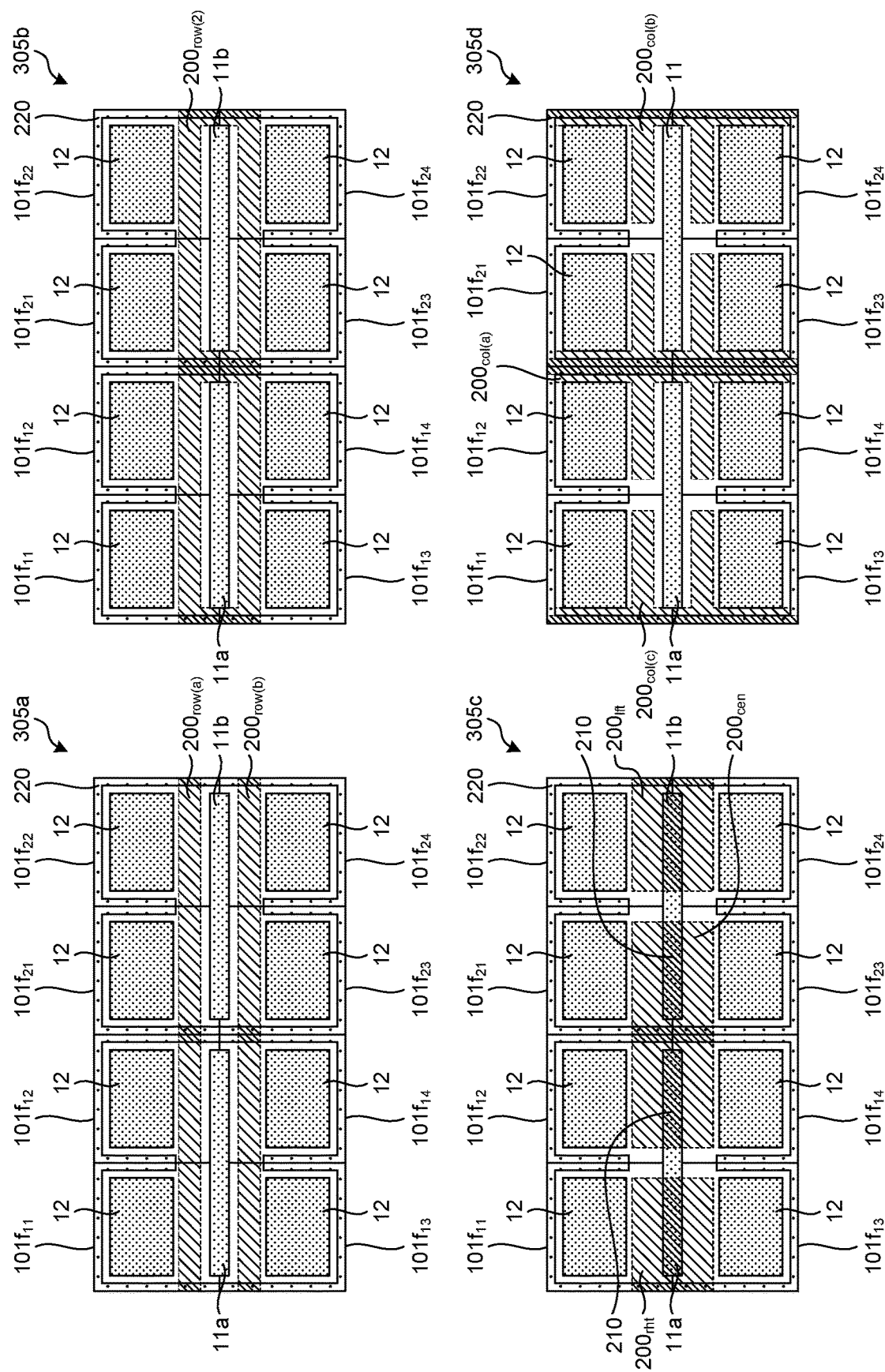

FIG.20A
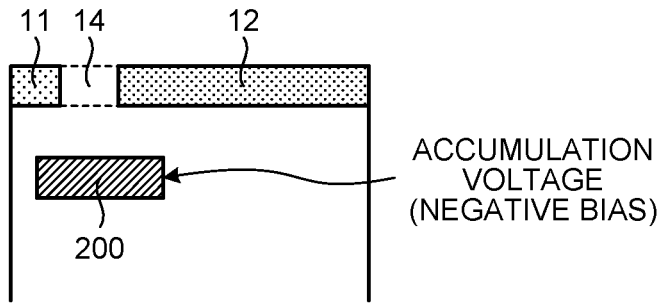
ACCUMULATION VOLTAGE (NEGATIVE BIAS)
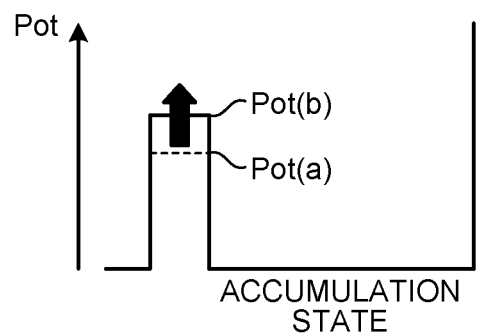
ACCUMULATION STATE
FIG.20B
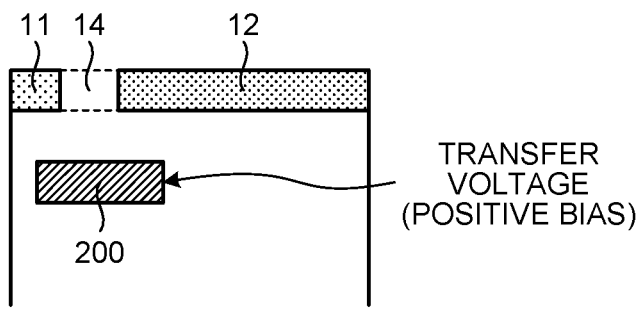
TRANSFER VOLTAGE (POSITIVE BIAS)
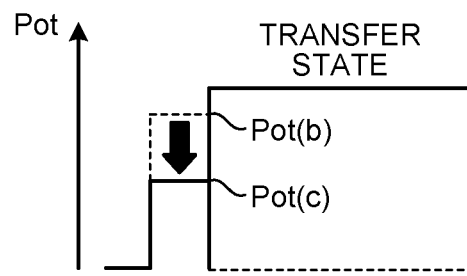
TRANSFER STATE

IMAGING DEVICE AND ELECTRONIC DEVICE

FIELD

The present disclosure relates to an imaging device and an electronic device.

BACKGROUND

A multilayer imaging device in which a plurality of photoelectric conversion units having different absorption coefficients for wavelengths of light are stacked has been proposed. In such a multilayer imaging device, for example, a first photoelectric conversion unit made of an organic film is formed on a semiconductor layer, and second and third photoelectric conversion units are formed in the semiconductor layer. The first photoelectric conversion unit performs photoelectric conversion according to light in a first wavelength region received on the organic film as a light receiving surface to generate charges. In addition, the second photoelectric conversion unit and the third photoelectric conversion unit perform photoelectric conversion according to the light in a second wavelength region and a third wavelength region received by penetrating through layers higher than the second photoelectric conversion unit and the third photoelectric conversion unit, respectively, to generate charges.

In such a configuration, the charges generated by the photoelectric conversion in the second and third photoelectric conversion units are temporarily accumulated in the second and third photoelectric conversion units, and are transferred to second and third floating diffusion regions formed in the semiconductor layer at predetermined timings, respectively. On the other hand, the charges generated in the first photoelectric conversion unit formed of the organic film are transferred to and accumulated in a first floating diffusion region formed in the semiconductor layer via a contact hole and a wiring layer. In a case where charges are directly transferred from the first photoelectric conversion unit to the first floating diffusion region so that the transferred charges are accumulated in the first floating diffusion region as described above, there is concern that kTC noise may increase, and random noise may deteriorate, resulting in a decrease in quality of a captured image.

In this regard, it has been disclosed that a charge accumulation electrode and a read-out electrode spaced apart from the charge accumulation electrode, which are transparent electrodes, are provided on a surface facing the light receiving surface of the first photoelectric conversion unit, and a common electrode shared by the charge accumulation electrode and the read-out electrode is provided on the light receiving surface (e.g., Patent Literature 1). In this configuration, a potential barrier is generated between the charge accumulation electrode and the read-out electrode by applying a bias from the common electrode. By controlling voltages applied to the charge accumulation electrode and the read-out electrode, the charges generated by the photoelectric conversion can be accumulated between the charge accumulation electrode and the common electrode, and the accumulated charges can be read out by the read-out electrode and transferred to the first floating diffusion region. According to this configuration, it is possible to suppress the occurrence of the above-described phenomena such as an increase in kTC noise and a deterioration in random noise.

CITATION LIST

Patent Literature

Patent Literature 1: JP 2017-157816 A

SUMMARY

Technical Problem

In the configuration of Patent Literature 1 described above, an amount of signal charges (an amount of accumulated charges) accumulated by the charge accumulation electrode is secured by the potential barrier between the charge accumulation electrode and the read-out electrode. In this case, by increasing a distance between the charge accumulation electrode and the read-out electrode, a high potential barrier can be generated and an amount of accumulated charges can be increased, but a sensitive region decreases, resulting in a reduction in sensitivity.

An object of the present disclosure is to provide an imaging device and an electronic device capable of both securing a wide sensitive region and securing an accumulated amount of charges.

Solution to Problem

For solving the problem described above, an imaging device according to one aspect of the present disclosure comprises a pixel, the pixel includes a photoelectric conversion layer; a first electrode positioned close to a first surface of the photoelectric conversion layer and electrically connected to the photoelectric conversion layer; a second electrode positioned on a second surface opposite to the first surface of the photoelectric conversion layer; a charge accumulation electrode disposed close to the first surface of the photoelectric conversion layer and spaced apart from the first electrode in a direction parallel to the first surface; and a third electrode disposed at a position to have a portion overlapping a gap between the first electrode and the charge accumulation electrode in a direction perpendicular to the first surface.

BRIEF DESCRIPTION OF DRAWINGS

FIG. 8 is a schematic diagram for explaining a relationship between an electrode configuration and an accumulated amount of charges according to the conventional art.

FIG. 13A is a schematic diagram illustrating an arrangement example of a first electrode, a charge accumulation electrode, and a barrier formation electrode applicable to the first embodiment.

FIG. 14B is a schematic diagram illustrating an arrangement example of a first electrode, a charge accumulation electrode, and a barrier formation electrode applicable to the first embodiment.

FIG. 20A is a schematic diagram illustrating an aspect of a potential barrier in a state where charges are accumulated according to a second embodiment.

FIG. 20B is a schematic diagram illustrating an aspect of a potential barrier in a state where charges are transferred according to the second embodiment.

DESCRIPTION OF EMBODIMENTS

Hereinafter, embodiments of the present disclosure will be described in detail with reference to the drawings. Note that, in the following embodiments, the same parts are denoted by the same reference signs, and redundant description will be omitted.

Hereinafter, embodiments of the present disclosure will be described in the following order.

1. Technologies Applicable to Each Embodiment
1-0-1. Electronic Device Applicable to Each Embodiment
1-0-2. Conventional Art Related to Each Embodiment
1-0-3. Relationship Between Electrode Configuration and Accumulated Amount of Charges According to Conventional Art
2. First Embodiment
2-0-1. Outline of Imaging Element According to First Embodiment
2-0-2. More Specific Configuration Example of Imaging Element According to First Embodiment
2-0-3. Electrode Configuration Example According to First Embodiment
2-0-4. Method of Applying Voltage to Barrier Formation Electrode According to First Embodiment
2-1. First Modification of First Embodiment
2-2. Second Modification of First Embodiment
3. Second Embodiment
4. Third Embodiment
5. Fourth Embodiment
5-1. Example of Application of Technology According to Present Disclosure
5-2. Example of Application to Endoscopic Surgery System
5-3. Example of Application to Moving Body 1. Technologies Applicable to Each Embodiment Prior to describing each embodiment of the present disclosure, technologies applicable to each embodiment will be schematically described for easy understanding.

1-0-1. Electronic Device Applicable to Each Embodiment

Figure 1:
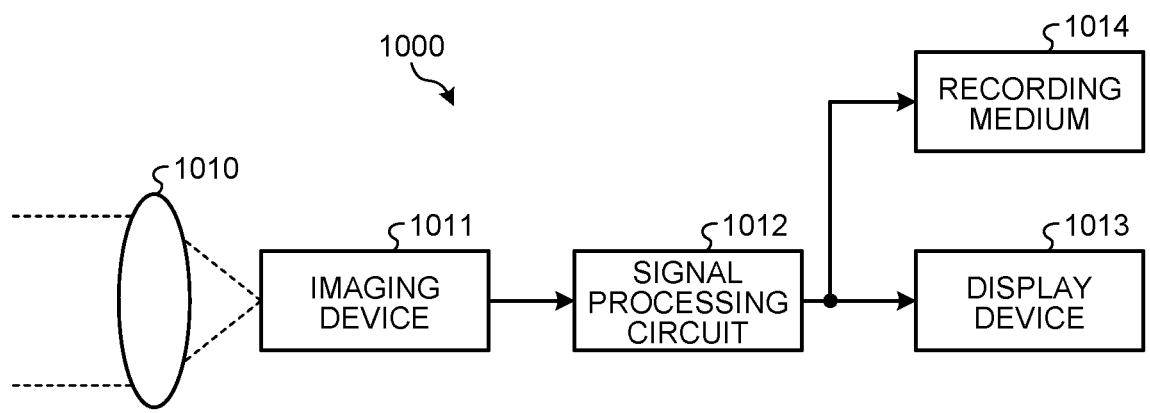
FIG. 1 is a block diagram illustrating a configuration of an example of an electronic device to which the technology according to each embodiment of the present disclosure is applicable.

First, an electronic device to which the technology according to each embodiment of the present disclosure is applicable will be described. FIG. 1 is a block diagram illustrating a configuration of an example of an electronic device to which the technology according to each embodiment of the present disclosure is applicable.

In FIG. 1, an electronic device 1000 includes an optical unit 1010, an imaging device 1011, a signal processing circuit 1012, a display device 1013, and a storage medium 1014. In FIG. 1, an imaging element that is an imaging device according to the present disclosure to be described in detail later is applied as the imaging device 1011. The imaging element includes a plurality of pixels, each converting incident light into an electric signal by photoelectric conversion, and a drive circuit driving the plurality of pixels. Here, as the electronic device 1000, a digital still camera, a digital video camera, a mobile phone or a smartphone with an imaging function, or the like can be applied.

The optical unit 1010 includes one or more lenses, a diaphragm mechanism, a focus mechanism, etc., and forms an image of image light (incident light) from a subject on an imaging surface of the imaging device 1011. As a result, a signal charge is accumulated in the imaging device 1011 for a certain period. The signal processing circuit 1012 performs various kinds of signal processing including image processing with respect to a pixel signal output from the imaging device 1011. The image signal subjected to the signal processing can be stored in the nonvolatile storage medium 1014 such as a flash memory or a hard disk drive. Furthermore, an image based on the pixel signal can also be output to the display device 1013.

1-0-2. Conventional Art Related to Each Embodiment

Figure 2:
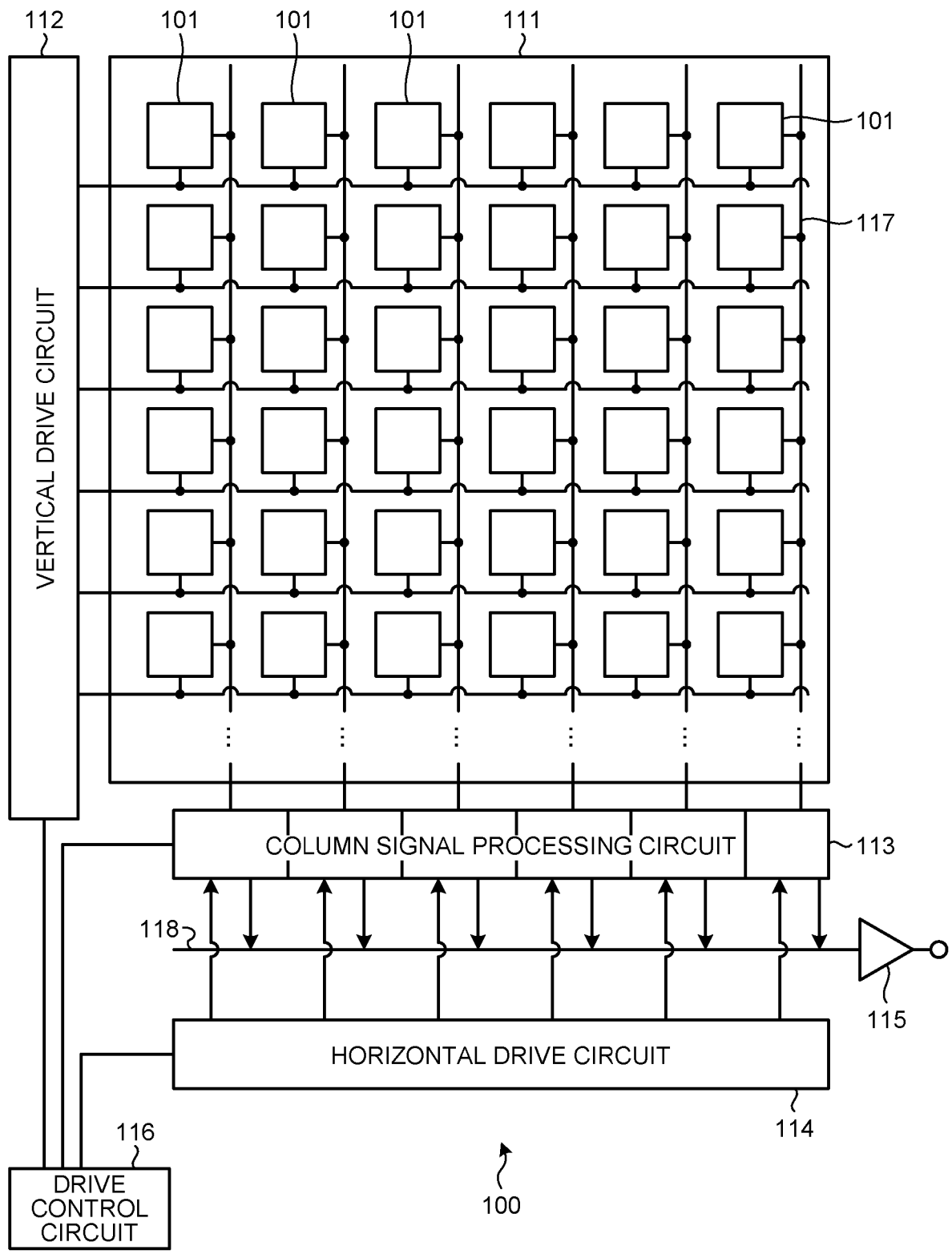
FIG. 2 is a block diagram illustrating a configuration of an example of an imaging element applicable to each embodiment of the present disclosure.

Next, the conventional art related to each embodiment will be schematically described. FIG. 2 is a block diagram illustrating a configuration of an example of an imaging element applicable to each embodiment of the present disclosure. In FIG. 2, an imaging element 100 includes a pixel array unit 111 in which pixels 101 are arranged in a matrix array, and a drive circuit for driving each of the pixels 101 included in the pixel array unit 111 as peripheral circuits of the pixel array unit 111. More specifically, the drive circuit includes a vertical drive circuit 112, a column signal processing circuit 113, a horizontal drive circuit 114, an output circuit 115, and a drive control circuit 116.

On the basis of a vertical synchronization signal, a horizontal synchronization signal, and a master clock supplied from the outside of the imaging element 100, the drive control circuit 116 generates a clock signal and a control signal, on which the operations of the vertical drive circuit 112, the column signal processing circuit 113, and the horizontal drive circuit 114 are based. The drive control circuit 116 supplies the generated clock signal and control signal to the vertical drive circuit 112, the column signal processing circuit 113, and the horizontal drive circuit 114.

The vertical drive circuit 112 includes, for example, a shift register, and selectively scans the pixels 101 of the pixel array unit 111 sequentially in a vertical direction in units of rows. Then, a pixel signal (image signal) based on a current (signal) generated according to an amount of received light in each of the pixels 101 is sent to the column signal processing circuit 113 via a vertical signal line 117 as a data output line. Note that the vertical signal line 117 will also be referred to as VSL.

The column signal processing circuit 113 is arranged, for example, for each column of pixels 101, and performs signal processing for noise removal and signal amplification, with respect to image signals output from one row of pixels 101, using a signal from a black reference pixel for each pixel 101. Note that the black reference pixel is a pixel 101 (not illustrated) disposed around a valid pixel region in the pixel array unit 111. A horizontal selection switch (not illustrated) is provided at an output stage of the column signal processing circuit 113, and connected between the column signal processing circuit 113 and a horizontal signal line 118.

The horizontal drive circuit 114 includes, for example, a shift register, and sequentially selects the column signal processing circuits 113 by sequentially outputting horizontal scanning pulses, so that a signal is output from each of the column signal processing circuits 113 to the horizontal signal line 118. The output circuit 115 outputs the signals sequentially supplied from the respective column signal processing circuits 113 via the horizontal signal line 118, after performing signal processing on the signals.

Figure 3:
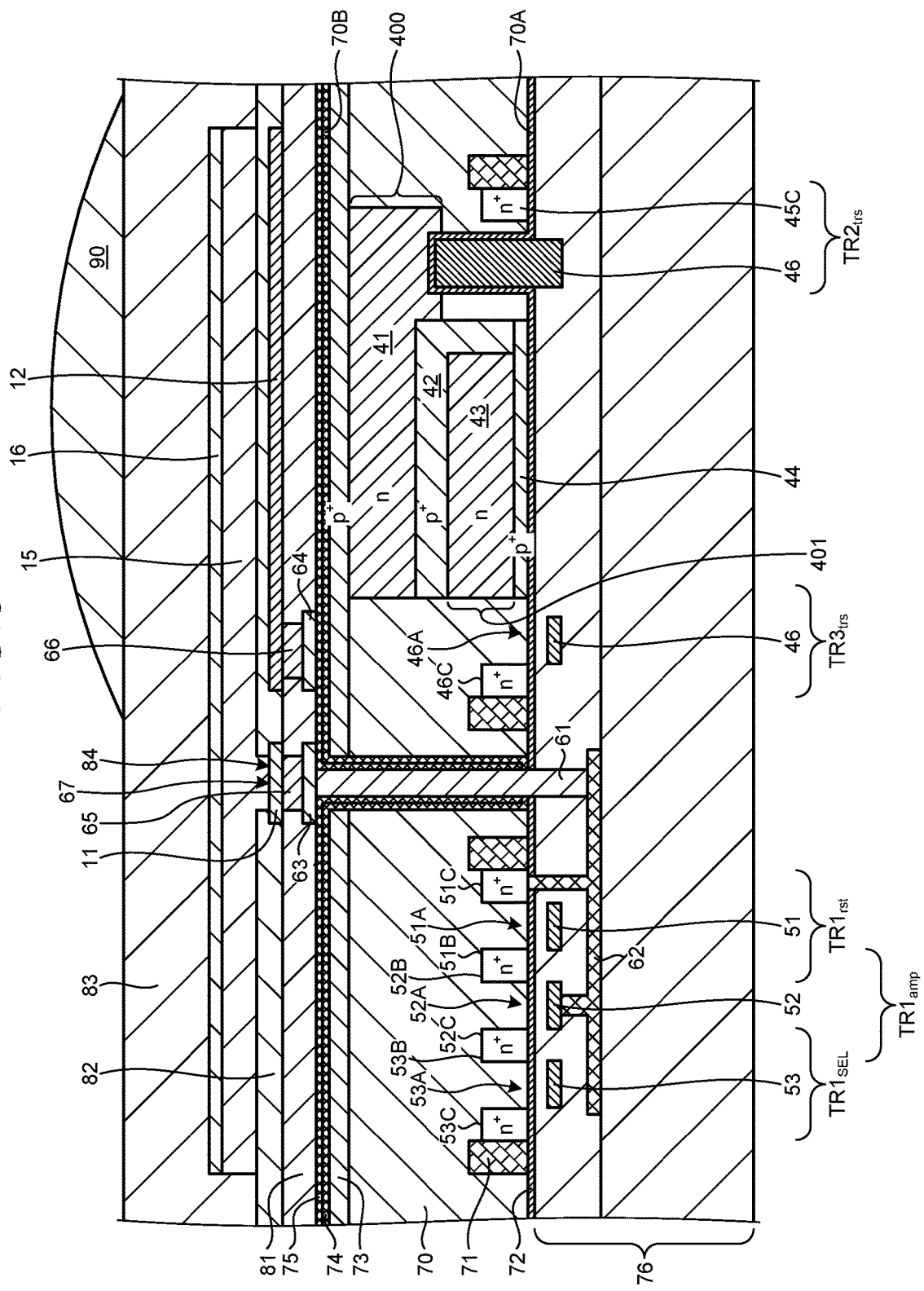
FIG. 3 is a schematic partial cross-sectional view of a pixel in the conventional art.
Figure 4:
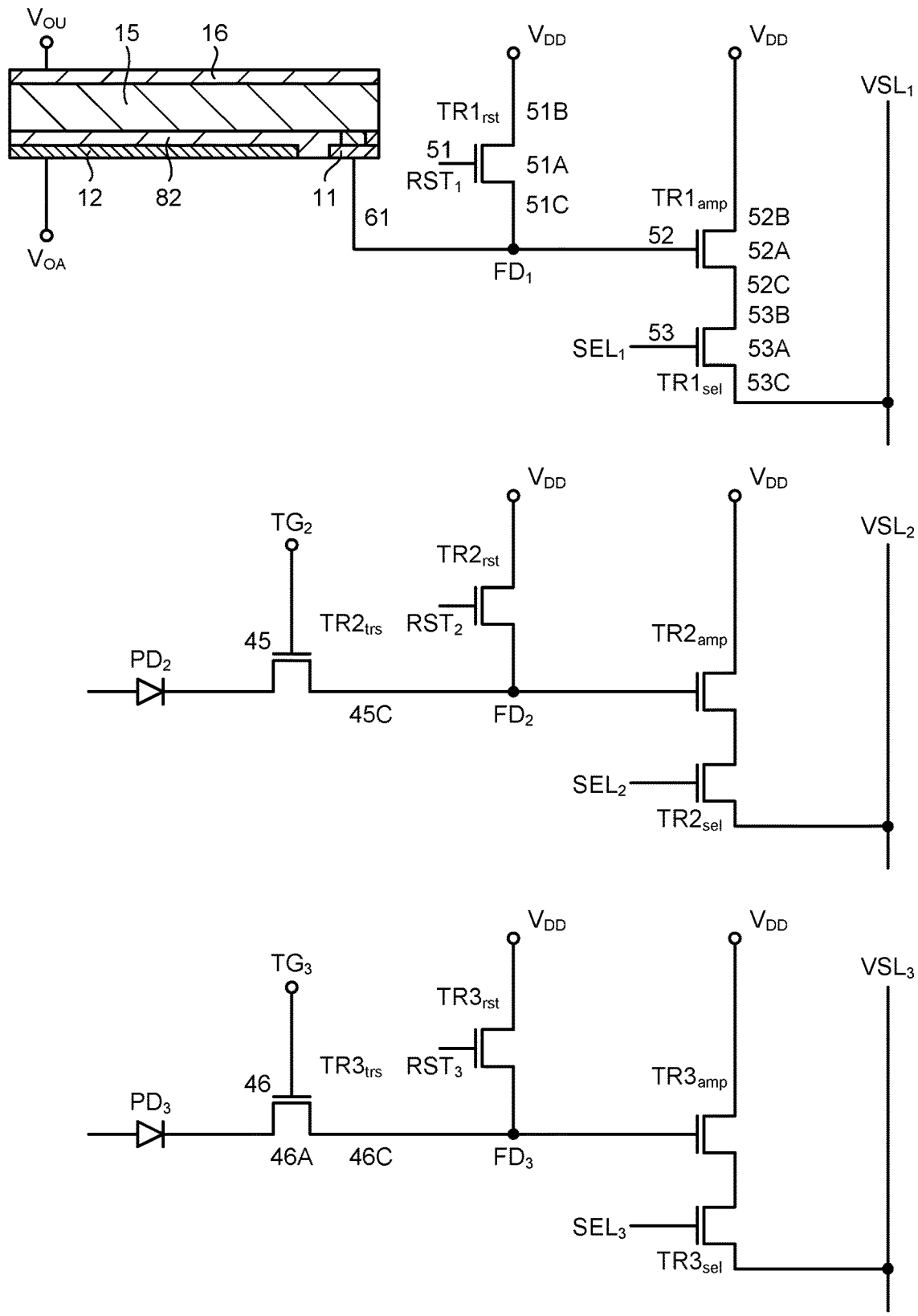
FIG. 4 is a diagram illustrating an equivalent circuit of the pixel in the conventional art.

FIG. 3 is a schematic partial cross-sectional view of a pixel 101 in the conventional art. In addition, FIG. 4 is a diagram illustrating an equivalent circuit of the pixel 101 illustrated in FIG. 3. The pixel 101 is a multilayer photoelectric conversion element in which a plurality of photoelectric conversion units are stacked. Hereinafter, the configuration of the pixel 101 will be described with reference to FIGS. 3 and 4.

The pixel 101 illustrated in FIG. 3 includes a plurality of photoelectric conversion units stacked, each performing photoelectric conversion. Hereinafter, a photoelectric conversion unit disposed closest to a light receiving surface of the pixel 101 will be referred to as a first photoelectric conversion unit, and this will be referred to as an uppermost photoelectric conversion unit among the plurality of photoelectric conversion units. In the example of FIG. 3, a second photoelectric conversion unit is disposed in a layer below the first photoelectric conversion unit, and a third photoelectric conversion unit is further disposed in a layer below the second photoelectric conversion unit.

The first photoelectric conversion unit includes a photoelectric conversion layer 15, a first electrode 11 located close to a first surface of the photoelectric conversion layer 15 and electrically connected to the photoelectric conversion layer 15, a second electrode 16 located on a second surface opposite to the first surface of the photoelectric conversion layer 15, and a charge accumulation electrode 12 located close to the first surface of the photoelectric conversion layer 15 and disposed apart from the first electrode 11 in a direction parallel to the first surface. As described above, the first electrode 11 and the charge accumulation electrode 12 are disposed to be spaced apart from each other with a gap therebetween.

The pixel 101 further includes a semiconductor substrate (more specifically, a silicon semiconductor layer) 70, and the first photoelectric conversion unit is disposed above the semiconductor substrate 70. The pixel further includes a controller provided in the semiconductor substrate 70 and including a drive circuit to which the first electrode 11 is connected. Here, a light incident surface of the semiconductor substrate 70 is defined as an upper side, and a surface opposite to the light incident surface of the semiconductor substrate 70 is defined as a lower side. A wiring layer 62 including a plurality of wirings is provided below the semiconductor substrate 70.

Furthermore, the semiconductor substrate 70 is provided with at least a first floating diffusion layer $FD_1$ (see FIG. 4) and an amplification transistor $TR1_{amp}$ (see FIGS. 3 and 4) constituting the controller, and the first electrode 11 is connected to the first floating diffusion layer $FD_1$ and a gate portion of the amplification transistor $TR1_{amp}$. The semiconductor substrate 70 is further provided with a reset transistor $TR1_{rst}$ and a selection transistor $TR1_{sel}$ constituting the controller (see FIGS. 3 and 4).

The first floating diffusion layer $FD_1$ is connected to one source/drain region of the reset transistor $TR1_{rst}$, one source/drain region of the amplification transistor $TR1_{amp}$ is connected to one source/drain region of the selection transistor $TR1_{sel}$, and the other source/drain region of the selection transistor $TR1_{sel}$ is connected to a signal line $VSL_1$ (see FIG. 4). The amplification transistor $TR1_{amp}$, the reset transistor $TR1_{rst}$, and the selection transistor $TR1_{sel}$ constitute the drive circuit.

Specifically, the pixel 101 illustrated in FIG. 3 is a backside-illuminated photoelectric conversion element, and is also a multilayer photoelectric conversion element having a structure in which three photoelectric conversion units are stacked: a first-type green photoelectric conversion unit (hereinafter referred to as a first photoelectric conversion unit) that is sensitive to green with a first-type green photoelectric conversion layer absorbing green light; a second-type blue photoelectric conversion unit (hereinafter referred to as a second photoelectric conversion unit) that is sensitive to blue with a second-type blue photoelectric conversion layer absorbing blue light; and a second-type red photoelectric conversion unit (hereinafter referred to as a third photoelectric conversion unit) that is sensitive to red with a second-type red photoelectric conversion layer absorbing red light.

Here, the red photoelectric conversion unit (third photoelectric conversion unit) and the blue photoelectric conversion unit (second photoelectric conversion unit) are provided in the semiconductor substrate 70, and the second photoelectric conversion unit is located closer to the light incident side than the third photoelectric conversion unit. The green photoelectric conversion unit (first photoelectric conversion unit) is provided above the blue photoelectric conversion unit (second photoelectric conversion unit). One pixel is configured with the structure in which the first photoelectric conversion unit, the second photoelectric conversion unit, and the third photoelectric conversion unit are stacked. No color filter is provided.

In the first photoelectric conversion unit, the first electrode 11 and the charge accumulation electrode 12 are formed apart from each other on an interlayer insulating layer 81. The interlayer insulating layer 81 and the charge accumulation electrode 12 are covered by an insulating layer 82. The photoelectric conversion layer 15 is formed on the insulating layer 82, and the second electrode 16 is formed on the photoelectric conversion layer 15. A protective layer 83 is formed on the entire surface including the second electrode 16, and an on-chip microlens 90 is provided on the protective layer 83.

The first electrode 11, the charge accumulation electrode 12, and the second electrode 16 include, for example, transparent electrodes made of indium tin oxide (ITO). The photoelectric conversion layer 15 includes a layer (organic film) containing a known organic photoelectric conversion material that is sensitive to at least green (e.g., an organic material such as a rhodamine dye, a merocyanine dye, or quinacridone). Furthermore, the photoelectric conversion layer 15 may further include a material layer suitable for charge accumulation. That is, a material layer suitable for charge accumulation may be further formed between the photoelectric conversion layer 15 and the first electrode 11 (for example, in a connector 67).

The interlayer insulating layer 81, the insulating layer 82, and the protective layer 83 are made of a known insulating material ($SiO_2$ or SiN). The photoelectric conversion layer 15 and the first electrode 11 are connected by the connector 67 provided in the insulating layer 82. The photoelectric conversion layer 15 extends through the connector 67. That is, the photoelectric conversion layer 15 is connected to the first electrode 11 by extending through an opening 84 provided in the insulating layer 82.

The charge accumulation electrode 12 is connected to the drive circuit. Specifically, the charge accumulation electrode 12 is connected to the vertical drive circuit 112 constituting the drive circuit via a connection hole 66, a pad 64, and a wiring $V_{OA}$ (not illustrated) provided in the interlayer insulating layer 81.

The charge accumulation electrode 12 has a larger size (area) than the first electrode 11. When the size of the charge accumulation electrode 12 is defined as an area $S_2$ and the size of the first electrode 11 is defined as an area $S_1$, a relationship between the areas $S_1$ and $S_2$ preferably satisfies the following formula (1).

$$4 \leq S_2/S_1 \tag{1}$$

Figure 5:
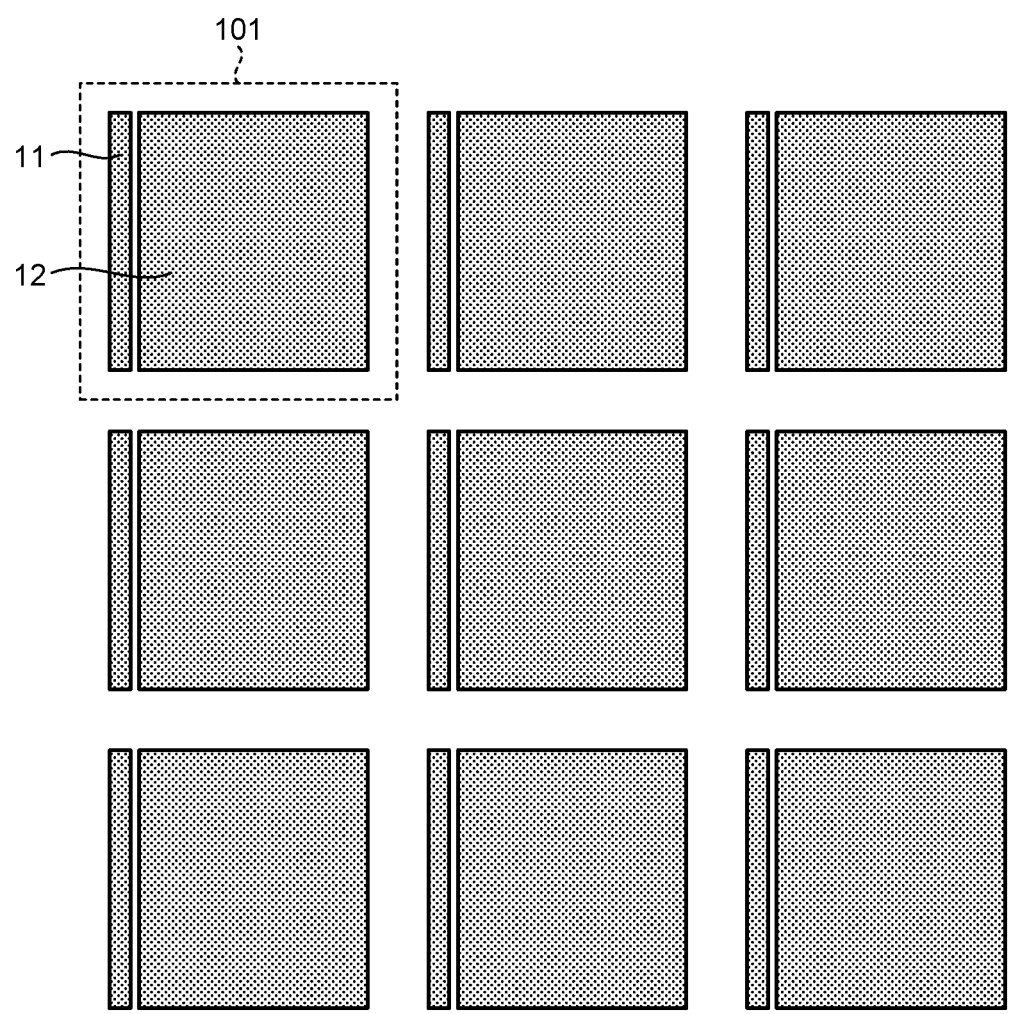
FIG. 5 is a diagram illustrating an arrangement example of a first electrode and a charge accumulation electrode in the pixel.

FIG. 5 is a schematic diagram illustrating an arrangement example of the first electrode 11 and the charge accumulation electrode 12 in the pixel 101. FIG. 5 schematically illustrates a state in which the pixel 101 is viewed from above the light receiving surface. In the example of FIG. 5, the first electrode 11 is disposed along one side of the pixel 101 having a rectangular shape, and the charge accumulation electrode 12 is disposed apart from the first electrode 11, that is, with a gap having a predetermined width from the first electrode 11. In the example of FIG. 5, the first electrode 11 and the charge accumulation electrode 12 are formed and disposed such that the area S1 of the first electrode 11 and the area S2 of the charge accumulation electrode 12 have a relationship satisfying the following formula (2).

$$S_2/S_1 = 8 \tag{2}$$

Note that the relationship between the areas S1 and S2 is not limited to the relationship represented by the above-described formulas (1) and (2).

Figure 6:
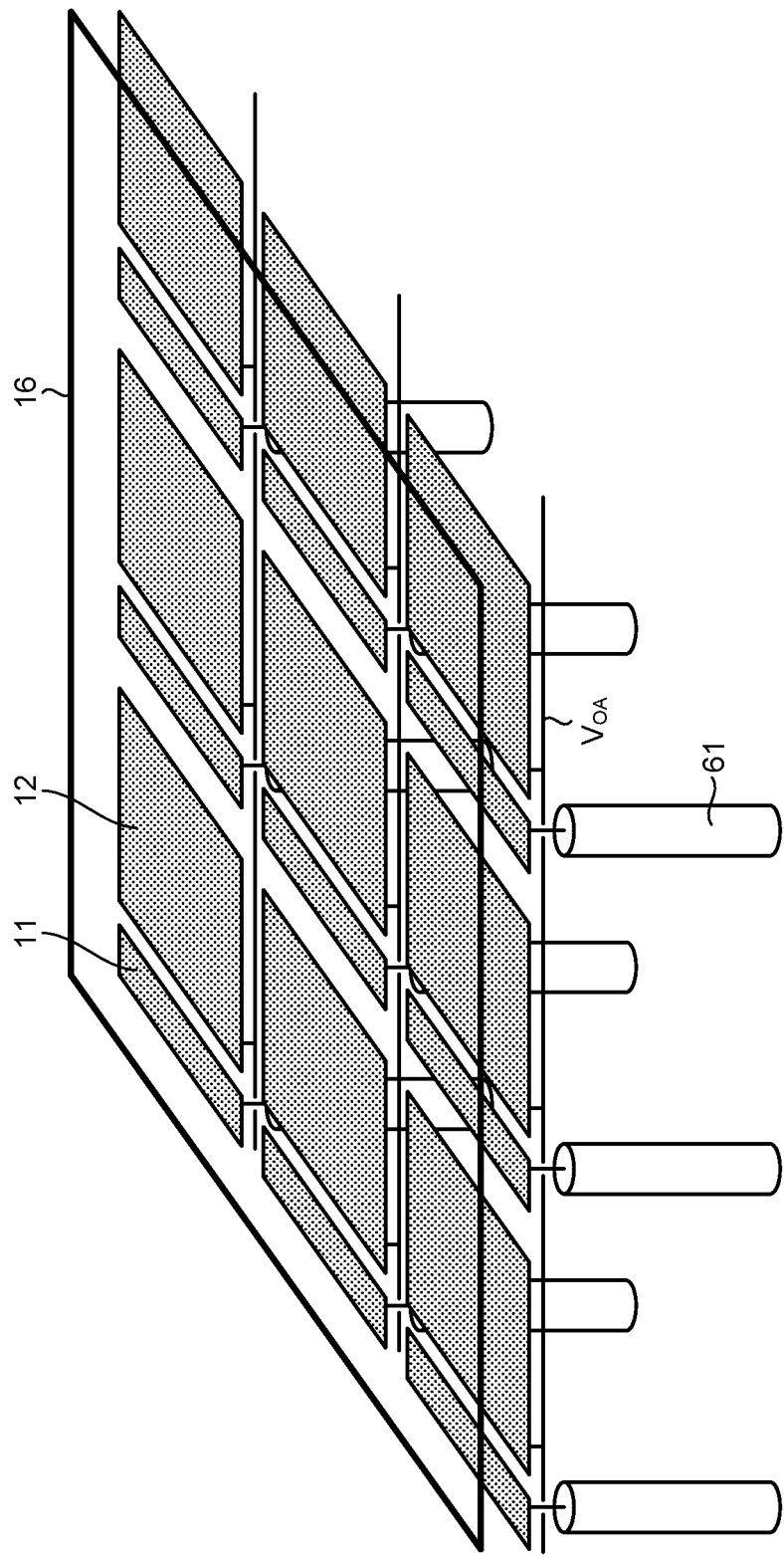
FIG. 6 is a schematic diagram illustrating an arrangement example of a second electrode in an imaging element.

FIG. 6 is a schematic diagram illustrating an arrangement example of the second electrode 16 in the imaging element 100. FIG. 6 schematically illustrates an aspect in which a part of the pixel array unit 111 is viewed from above the light receiving surface in an oblique direction. As illustrated in FIG. 6, the second electrode 16 is a common electrode shared in common by the pixels 101. Furthermore, the wiring $V_{OA}$ provided for each row of the pixel array unit 111 in a layer below the charge accumulation electrode 12 is connected to the charge accumulation electrode 12 of each of the pixels 101 arranged in the row.

By controlling a voltage to be applied to each of the first electrode 11, the charge accumulation electrode 12, and the second electrode 16 to a predetermined value, it is possible to accumulate and transfer charges generated by photoelectric conversion in the first photoelectric conversion unit.

For example, when the first photoelectric conversion unit is exposed, a negative bias voltage is applied to the second electrode 16, and a positive bias voltage is applied from the wiring $V_{OA}$ to the charge accumulation electrode 12. In addition, a predetermined positive bias voltage is also applied to the first electrode 11. As a result, a potential barrier is generated in the gap between the first electrode 11 and the charge accumulation electrode 12, and the charges generated by photoelectric conversion are accumulated between the charge accumulation electrode 12 and the second electrode 16.

As the exposure ends, a negative bias voltage is applied from the wiring $V_{OA}$ to the charge accumulation electrode 12, such that a potential corresponding to the charge accumulation electrode 12 is higher than the potential barrier in the gap between the first electrode 11 and the charge accumulation electrode 12. As a result, the charges accumulated between the charge accumulation electrode 12 and the second electrode 16 flow into the first electrode 11 beyond the potential barrier. The charges flowing into the first electrode 11 are supplied as a current to a predetermined wiring of the wiring layer 62 via a contact hole 61 to be described later.

Next, the configuration of the semiconductor substrate 70 will be described in more detail. A pixel isolation region 71 is formed close to a first surface (front surface) 70A of the semiconductor substrate 70, and an oxide film 72 is formed on the first surface 70A of the semiconductor substrate 70. Furthermore, the reset transistor $TR1_{rst}$, the amplification transistor $TR1_{amp}$, and the selection transistor $TR1_{sel}$ constituting the controller of the first photoelectric conversion unit are provided close to the first surface of the semiconductor substrate 70, and the first floating diffusion layer $FD_1$ is further provided.

The reset transistor $TR1_{rst}$ includes a gate portion 51, a channel formation region 51A, and source/drain regions 51B and 51C. The gate portion 51 of the reset transistor $TR1_{rst}$ is connected to a reset line $RST_1$, one source/drain region 51C of the reset transistor $TR1_{rst}$ also serves as the first floating diffusion layer $FD_1$, and the other source/drain region 51B is connected to a power supply $V_{DD}$ (see FIG. 4).

The first electrode 11 is connected to one source/drain region 51C (the first floating diffusion layer $FD_1$) of the reset transistor $TR1_{rst}$ via a connection hole 65 and a pad 63 provided in the interlayer insulating layer 81, the contact hole 61 formed in the semiconductor substrate 70 and an interlayer insulating layer 76, and the wiring layer 62 formed in the interlayer insulating layer 76.

The amplification transistor $TR1_{amp}$ includes a gate portion 52, a channel formation region 52A, and source/drain regions 52B and 52C. The gate portion 52 is connected to the first electrode 11 and one source/drain region 51C (the first floating diffusion layer $FD_1$) of the reset transistor $TR1_{rst}$ via the wiring layer 62. Furthermore, one source/drain region 52B is connected to the power supply $V_{DD}$ while sharing a region with the other source/drain region 51B constituting the reset transistor $TR1_{rst}$.

The selection transistor $TR1_{sel}$ includes a gate portion 53, a channel formation region 53A, and source/drain regions 53B and 53C. The gate portion 53 is connected to a selection line $SEL_1$ (see FIG. 4). Furthermore, one source/drain region 53B shares a region with the other source/drain region 52C constituting the amplification transistor TR1amp, and the other source/drain region 53C is connected to the vertical signal line 117 (see FIG. 2). In this case, the vertical signal line 117 corresponds to the $VSL_1$ in FIG. 4.

The second photoelectric conversion unit includes an n-type semiconductor region 41 provided in the semiconductor substrate 70 as a photoelectric conversion layer 400. A gate portion 45 of a transfer transistor $TR2_{trs}$ formed of a vertical transistor extends to the n-type semiconductor region 41, and is connected to a transfer gate line $TG_2$ (see FIG. 4). In addition, a second floating diffusion layer $FD_2$ (see FIG. 4) is provided in a region 45C of the semiconductor substrate 70 in the vicinity of the gate portion 45 of the transfer transistor $TR2_{trs}$. Charges accumulated in the n-type semiconductor region 41 are read out to the second floating diffusion layer $FD_2$ via a transfer channel formed along the gate portion 45.

In the second photoelectric conversion unit, a reset transistor $TR2_{rst}$, an amplification transistor $TR2_{amp}$, and a selection transistor $TR2_{sel}$ constituting a controller of the second photoelectric conversion unit are further provided close to the first surface of the semiconductor substrate 70.

The reset transistor $TR2_{rst}$ includes a gate portion, a channel formation region, and source/drain regions. The gate portion of the reset transistor $TR2_{rst}$ is connected to a reset line $RST_2$, one source/drain region of the reset transistor $TR2_{rst}$ is connected to the power supply $V_{DD}$, and the other source/drain region also serves as the second floating diffusion layer $FD_2$ (see FIG. 4).

The amplification transistor $TR2_{amp}$ includes a gate portion, a channel formation region, and source/drain regions. The gate portion is connected to the other source/drain region (the second floating diffusion layer $FD_2$, see FIG. 4) of the reset transistor $TR2_{rst}$. Furthermore, one source/drain region is connected to the power supply $V_{DD}$ (see FIG. 4) while sharing a region with one source/drain region constituting the reset transistor $TR2_{rst}$.

The selection transistor $TR2_{sel}$ includes a gate portion, a channel formation region, and source/drain regions. The gate portion is connected to a selection line $SEL_2$ (see FIG. 4). Furthermore, one source/drain region shares a region with the other source/drain region constituting the amplification transistor $TR2_{amp}$, and the other source/drain region is connected to the vertical signal line 117 (see FIG. 2). In this case, the vertical signal line 117 corresponds to a $VSL_2$ in FIG. 4.

The third photoelectric conversion unit includes an n-type semiconductor region 43 provided in the semiconductor substrate 70 as a photoelectric conversion layer 401. A gate portion 46 of a transfer transistor $TR_{trs}$ is connected to a transfer gate line $TG_3$ (see FIG. 4). In addition, a third floating diffusion layer $FD_3$ (see FIG. 4) is provided in a region 46C of the semiconductor substrate 70 in the vicinity of the gate portion 46 of the transfer transistor $TR3_{trs}$. Charges accumulated in the n-type semiconductor region 43 are read out to the third floating diffusion layer $FD_3$ via a transfer channel 46A formed along the gate portion 46.

In the third photoelectric conversion unit, a reset transistor $TR3_{rst}$, an amplification transistor $TR3_{amp}$, and a selection transistor $TR3_{sel}$ constituting a controller of the third photoelectric conversion unit are further provided close to the first surface of the semiconductor substrate 70.

The reset transistor $TR3_{rst}$ includes a gate portion, a channel formation region, and source/t drain regions. The gate portion of the reset transistor $TR3_{rst}$ is connected to a reset line $RST_3$, one source/drain region of the reset transistor $TR3_{rst}$ is connected to the power supply $V_{DD}$, and the other source/drain region also serves as the third floating diffusion layer $FD_3$ (see FIG. 4).

The amplification transistor $TR3_{amp}$ includes a gate portion, a channel formation region, and source/drain regions. The gate portion is connected to the other source/drain region (the third floating diffusion layer $FD_3$) of the reset transistor $TR3_{rst}$. Furthermore, one source/drain region is connected to the power supply $V_{DD}$ (see FIG. 4) while sharing a region with one source/drain t region constituting the reset transistor $TR3_{rst}$.

The selection transistor $TR3_{sel}$ includes a gate portion, a channel formation region, and source/drain regions. The gate portion is connected to a selection line $SEL_3$ (see FIG.

4). Furthermore, one source/drain region shares a region with the other source/drain region constituting the amplification transistor $TR3_{amp}$, and the other source/drain region is connected to the vertical signal line 117 (see FIG. 2). In this case, the vertical signal line 117 corresponds to a $VSL_3$ in FIG. 4.

The reset lines $RST_1$, $RST_2$, and $RST_3$, the selection lines $SEL_1$, $SEL_2$, and $SEL_3$, and the transfer gate lines $TG_2$ and $TG_3$ described above are connected to the vertical drive circuit 112 constituting the drive circuit. In addition, each of the vertical signal lines 117 ($VSL_1$, $VSL_2$, and $VSL_3$) of the first photoelectric conversion unit, the second photoelectric conversion unit, and the third photoelectric conversion unit is connected to the column signal processing circuit 113 constituting the drive circuit.

A $p^+$ layer 44 is provided between the n-type semiconductor region 43 and the front surface 70A of the semiconductor substrate 70 to suppress generation of dark current. A $p^+$ layer 42 is formed between the n-type semiconductor region 41 and the n-type semiconductor region 43, and a side surface of the n-type semiconductor region 43 is partially surrounded by the $p^+$ layer 42. A $p^+$ layer 73 is formed close to a back surface 70B of the semiconductor substrate 70, and an $HfO_2$ film 74, which is a film having a negative fixed charge, and an insulating film 75 are formed from the $p^+$ layer 73 to a portion where the contact hole 61 is formed inside the semiconductor substrate 70. Note that, in the interlayer insulating layer 76, the wirings are formed over a plurality of layers, but are omitted in FIG. 3.

Next, the operation of the first photoelectric conversion unit described above will be described with reference to FIG. 7. Here, the first electrode 11 is set to have a higher potential than the second electrode 16. That is, for example, the first electrode 11 is set to have a positive potential, and the second electrode 16 is set to have a negative potential, such that electrons are read out to the floating diffusion layer after photoelectric conversion in the photoelectric conversion layer 15. Note that, in a mode the first electrode 11 is set to have a negative potential, and the second electrode 16 is set to have a positive potential, such that holes generated on the basis of photoelectric conversion in the photoelectric conversion layer 15 are read out to the floating diffusion layer, it is only required that levels of potentials to be described below be reversed.

Figure 7:
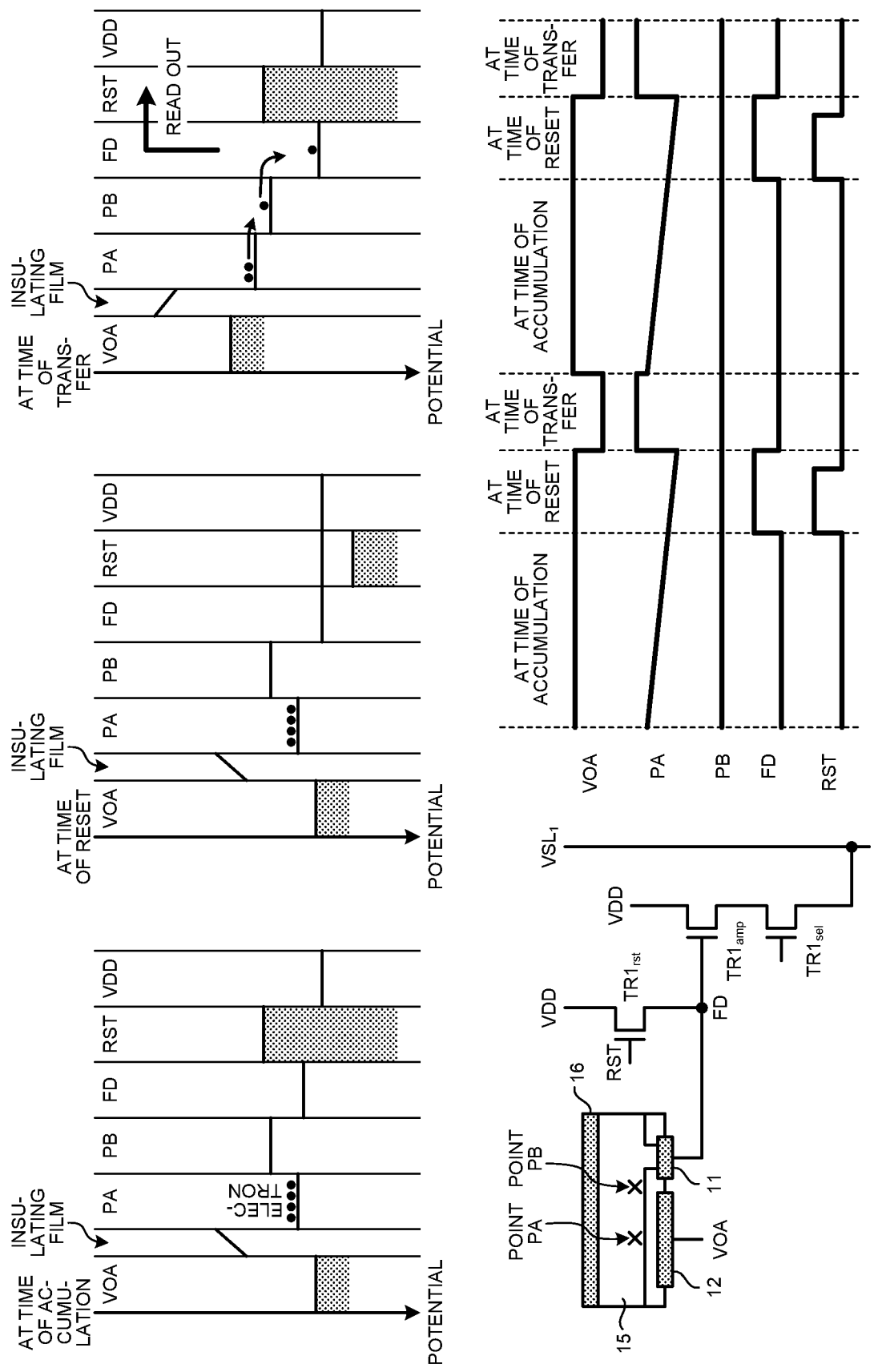
FIG. 7 is a diagram for explaining an operation of a first photoelectric conversion unit.

The meanings of the reference signs used in FIG. 7 are as follows.

(1) PA: a potential of the photoelectric conversion layer 15 at a point PA in a region facing the charge accumulation electrode 12 (see a lower left diagram of FIG. 7).

(2) PB: a potential of the photoelectric conversion layer 15 at a point PB in a region facing a region located between the charge accumulation electrode 12 and the first electrode 11 (see the lower left diagram in FIG. 7).

(3) FD: a potential of the first floating diffusion layer $FD_1$.

(4) VOA: a potential of the charge accumulation electrode 12.

(5) RST: a potential of the gate portion 51 of the reset transistor $TR1_{rst}$.

(6) VDD: a potential of the power supply $V_{DD}$.

A charge accumulation period will be described with reference to an upper left diagram of FIG. 7. In the charge accumulation period, a potential $V_{11}$ is applied to the first electrode 11 and a potential $V_{12}$ is applied to the charge accumulation electrode 12 from the drive circuit. Photoelectric conversion occurs in the photoelectric conversion layer 15 by light incident on the photoelectric conversion layer 15.

Holes generated by the photoelectric conversion are sent from the second electrode 16 to the drive circuit via a wiring $V_{OU}$ (not illustrated).

On the other hand, since the first electrode 11 is set to have a higher potential than the second electrode 16, in other words, for example, a positive potential is applied to the first electrode 11, and a negative potential is applied to the second electrode 16, $V_{12} \geq V_{11}$, preferably $V_{12} > V_{11}$. As a result, electrons (charges) generated by the photoelectric conversion are attracted to the charge accumulation electrode 12, and remain in a region of the photoelectric conversion layer 15 facing the charge accumulation electrode 12. That is, the charges are accumulated in the photoelectric conversion layer 15. Since $V_{12} > V_{11}$, the charges generated inside the photoelectric conversion layer 15 do not move toward the first electrode 11. As photoelectric conversion time passes, the potential of the photoelectric conversion layer 15 in the region facing the charge accumulation electrode 12 becomes a more negative value.

In a period following the charge accumulation period, a reset operation is performed. An upper middle diagram of FIG. 7 schematically illustrates an example of a state of each unit at the time of the reset operation. By the reset operation, the potential FD of the first floating diffusion layer $FD_1$ is reset, and the potential of the first floating diffusion layer $FD_1$ becomes the potential VDD of the power supply $V_{DD}$.

After the reset operation is completed, charges are read out. An upper right diagram of FIG. 7 schematically illustrates a state of each unit at the time of reading out charges, that is, at the time of transferring charges from the charge accumulation electrode 12 to the first electrode 11. In the charge transfer period, a potential $V_{21}$ is applied to the first electrode 11 and a potential $V_{22}$ is applied to the charge accumulation electrode 12 from the drive circuit. Here, the potentials are set to be $V_{22} < V_{21}$. As a result, the charges remaining in the region of the photoelectric conversion layer 15 facing the charge accumulation electrode 12 are read out to the first electrode 11, and further read out from the first electrode 11 to the first floating diffusion layer $FD_1$ via the contact hole 61. That is, the charges accumulated in the photoelectric conversion layer 15 are read out to the controller.

Then, a series of operations of the first photoelectric conversion unit, such as charge accumulation, reset operation, and charge transfer, are completed. A lower right diagram of FIG. 7 illustrates an example of a change in each of the potentials VOA, PA, PB, FD, and RST during each of the operations.

The operations of the amplification transistor $TR1_{amp}$ and the selection transistor $TR1_{sel}$ after electrons are read out to the first floating diffusion layer $FD_1$ are the same as those of conventional amplification and selection transistors. In addition, a series of operations of the second photoelectric conversion unit and the third photoelectric conversion unit, such as charge accumulation, reset operation, and charge transfer, are similar to a series of conventional operations such as charge accumulation, reset operation, and charge transfer. Furthermore, reset noise of the first floating diffusion layer $FD_1$ can be removed by correlated double sampling (CDS) processing in a similar manner to that in the conventional art.

1-0-3. Relationship Between Electrode Configuration and Accumulated Amount of Charges According to Conventional Art Next, a relationship between an electrode configuration and an accumulated amount of charges according to the conventional art will be schematically described with reference to FIG. 8. In a section (a) of FIG. 8, which corresponds to the electrode configuration described with reference to FIG. 5, the first electrode 11 is provided along one side of the pixel 101 having a rectangular shape, and the charge accumulation electrode 12 is provided with a predetermined gap from the first electrode 11.

In the configuration of this section (a), while a gap 14 is provided between the first electrode 11 and the charge accumulation electrode 12 as described above, a bias is applied by the second electrode 16 to generate a potential barrier corresponding to a position of the gap 14. At this time, by providing the gap 14 widely, an accumulated amount Qs of charges accumulated by the charge accumulation electrode 12 increases. On the other hand, when the gap 14 is provided widely, an area of the charge accumulation electrode 12 decreases, that is, a sensitive region decreases, resulting in a reduction in sensitivity.

A section (b) of FIG. 8 is an example in which a transfer gate electrode 13 is provided between the first electrode 11 and the charge accumulation electrode 12. In this case, a potential barrier between the first electrode 11 and the charge accumulation electrode 12 is generated by applying a voltage to the transfer gate electrode 13. In the configuration of this section (b), since the potential barrier is formed by applying a voltage to the transfer gate electrode 13, a higher potential barrier can be generated, and it is easy to increase an accumulated amount Qs of charges accumulated by the charge accumulation electrode 12. On the other hand, the provision of the transfer gate electrode 13 causes a decrease in area of the charge accumulation electrode 12, resulting in a reduction in sensitivity.

Figure 9:
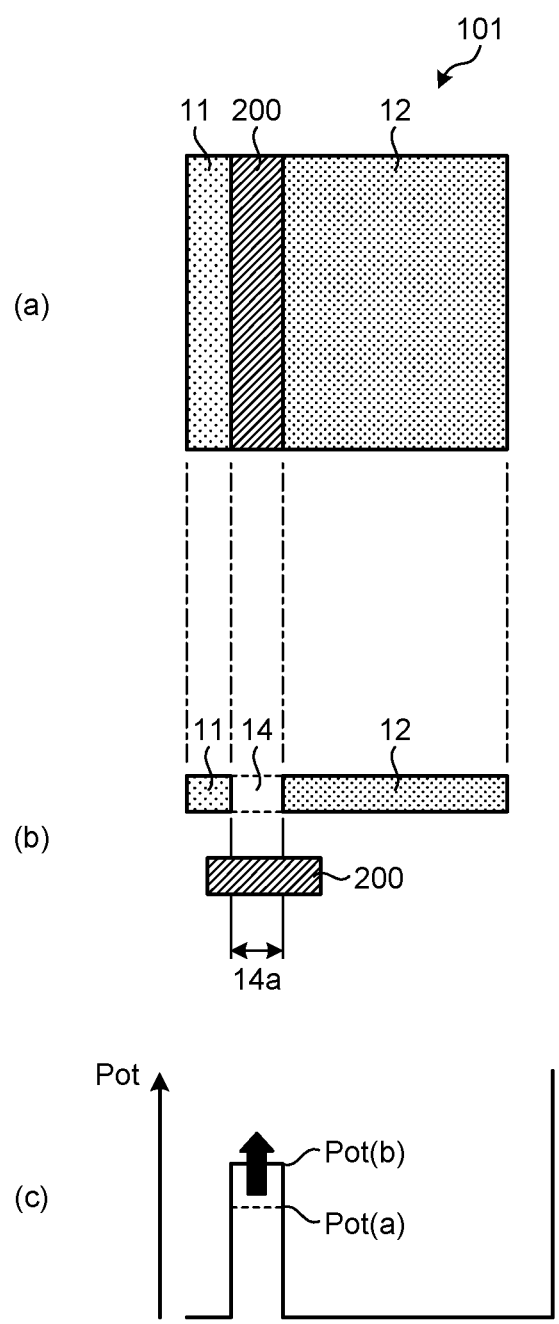
FIG. 9 is a schematic diagram for explaining an electrode configuration and an operation in a pixel according to a first embodiment.

2. First Embodiment 2-0-1. Outline of Imaging Element According to First Embodiment Next, a first embodiment will be described. First, an imaging element according to the first embodiment will be schematically described. FIG. 9 is a schematic diagram for explaining an electrode configuration and an operation in a pixel 101 according to the first embodiment. In FIG. 9, a section (a) is a schematic diagram of the pixel according to the first embodiment as viewed from above an upper surface (light receiving surface), and a section (b) is a schematic diagram illustrating a cross section of the pixel. Furthermore, a section (c) is a diagram schematically illustrating a state of a potential Pot corresponding to the sections (a) and (b).

As illustrated in the section (b) of FIG. 9, in the pixel 101 according to the first embodiment, a first electrode 11 and a charge accumulation electrode 12 are spaced apart from each other with a gap 14, and a barrier formation electrode 200 as a third electrode is disposed close to lower surfaces (surfaces opposite to the light receiving surface) of the first electrode 11 and the charge accumulation electrode 12. In other words, the barrier formation electrode 200 is disposed between the first electrode 11 and the charge accumulation electrode 12 and the semiconductor substrate 70. In this case, the barrier formation electrode 200 is disposed without being electrically connected to the first electrode 11 and the charge accumulation electrode 12. In addition, the barrier formation electrode 200 is disposed at a position including a portion where the gap 14 between the first electrode 11 and the charge accumulation electrode 12 overlaps a first surface of a photoelectric conversion layer 15 in a vertical direction.

In the example of FIG. 9, as illustrated in the section (b), a width of the barrier formation electrode 200 is larger than a width 14a of the gap 14, and the barrier formation electrode 200 is disposed to have a portion overlapping the entire width of the gap 14. The barrier formation electrode 200 is not limited to this example, and may be disposed to have a portion overlapping a part of the gap 14. Alternatively, the width of the barrier formation electrode 200 may be smaller than the width 14a of the gap 14, such that the overlapping portion is disposed within the gap 14. In this case, the barrier formation electrode 200 does not have any portion overlapping the first electrode 11 and the charge accumulation electrode 12.

In the pixel 101 having such a configuration, a bias voltage is applied to the barrier formation electrode 200 to make a potential barrier in the gap 14 high. As schematically illustrated in the section (c) of FIG. 9, a predetermined bias voltage is applied to the barrier formation electrode 200, so that a potential Pot in the gap 14 portion becomes a potential Pot(b) higher than a potential Pot(a) in the gap 14 portion when no bias voltage is applied to the barrier formation electrode 200, and a potential barrier is generated according to the potential Pot(b). In this case, the bias voltage applied to the barrier formation electrode 200 is a negative bias voltage lower than voltages applied to the first electrode 11 and the charge accumulation electrode 12.

In the first embodiment, as described above, the barrier formation electrode 200 is disposed to have a portion overlapping the gap 14 in a direction downward of the gap 14 between the first electrode 11 and the charge accumulation electrode 12. Then, by applying a negative bias to the barrier formation electrode 200, a higher potential barrier can be generated at a position corresponding to the gap 14. The gap 14 has a width 14a to such an extent that at least the first electrode 11 and the charge accumulation electrode 12 are not in contact with each other.

The pixel 101 to which the first embodiment having such a configuration is applied can secure an accumulated amount Qs of charges while maintaining a wide sensitive region in the photoelectric conversion unit including a layer (organic film) containing an organic photoelectric conversion material.

Figure 10:
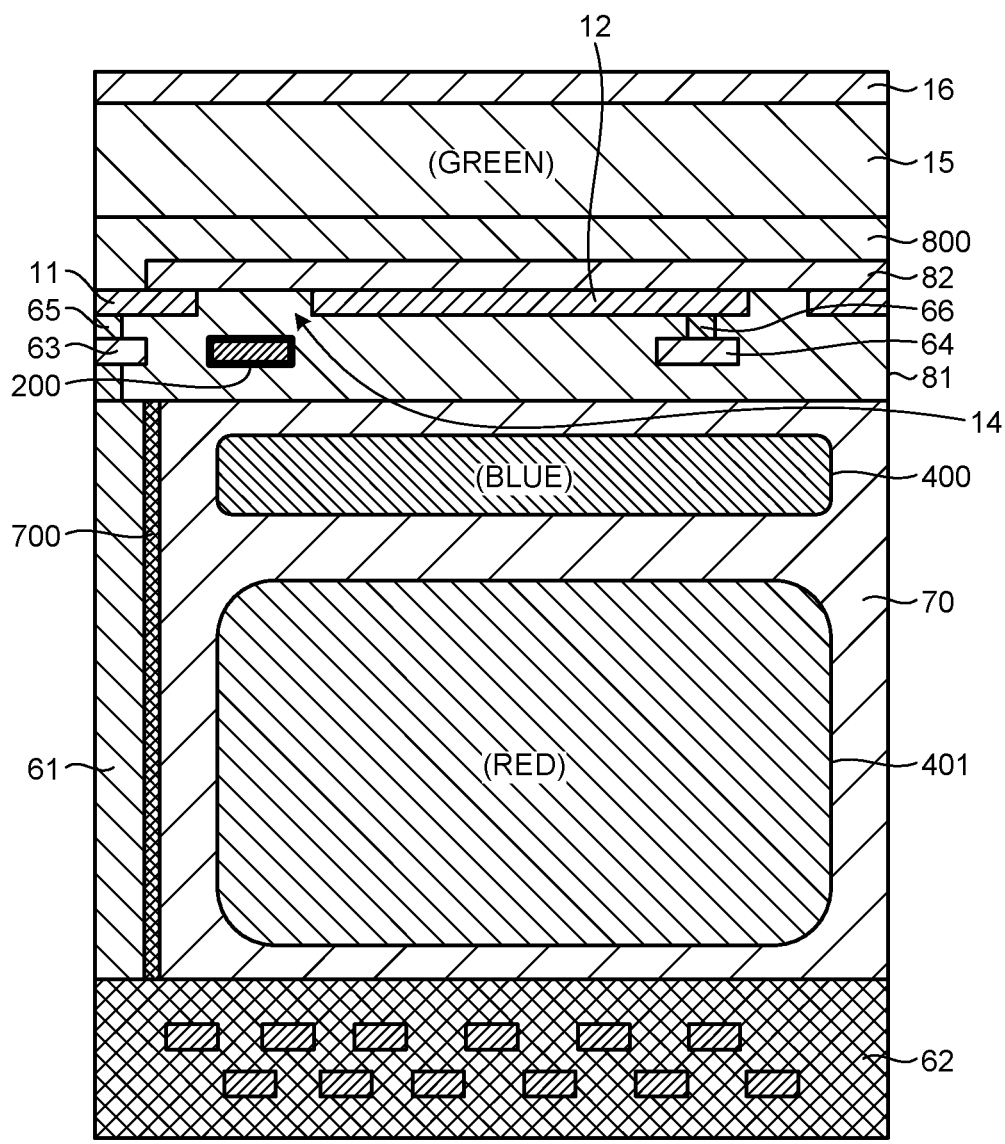
FIG. 10 is a schematic partial cross-sectional view of the pixel according to the first embodiment.

2-0-2. More Specific Configuration Example of Imaging Element According to First Embodiment Next, a more specific configuration example of the imaging element according to the first embodiment will be described. FIG. 10 is a schematic partial cross-sectional view of the pixel 101 according to the first embodiment.

FIG. 10 is a diagram corresponding to FIG. 3 described above, and the $HfO_2$ film 74 and the insulating film 75 of FIG. 3 are collectively illustrated as an insulating film 700. Furthermore, in FIG. 10, the respective transistors and the like arranged on the first surface 70A of the semiconductor substrate 70 are omitted. Furthermore, in FIG. 10, an accumulation transfer layer 800 made of a material suitable for charge accumulation is disposed on a surface opposite to a surface on which the second electrode 16 is disposed of the photoelectric conversion layer 15.

In the example of FIG. 10, the barrier formation electrode 200 has a portion overlapping the gap 14 between the first electrode 11 and the charge accumulation electrode 12 in a direction toward the semiconductor substrate 70, and is disposed in the same layer as the pads 63 and 64. The barrier formation electrode 200 has a width such that the portion overlapping the gap 14 is within the gap 14. That is, in the example of FIG. 10, the barrier formation electrode 200 is formed and disposed to have no portions overlapping the first electrode 11 and the charge accumulation electrode 12 in the direction toward the semiconductor substrate 70. For example, similarly to the pad 64 and the like, the barrier formation electrode 200 is connected to a wiring in the interlayer insulating layer 81, and a fixed bias voltage is applied to the barrier formation electrode 200 via the wiring.

Figure 11:
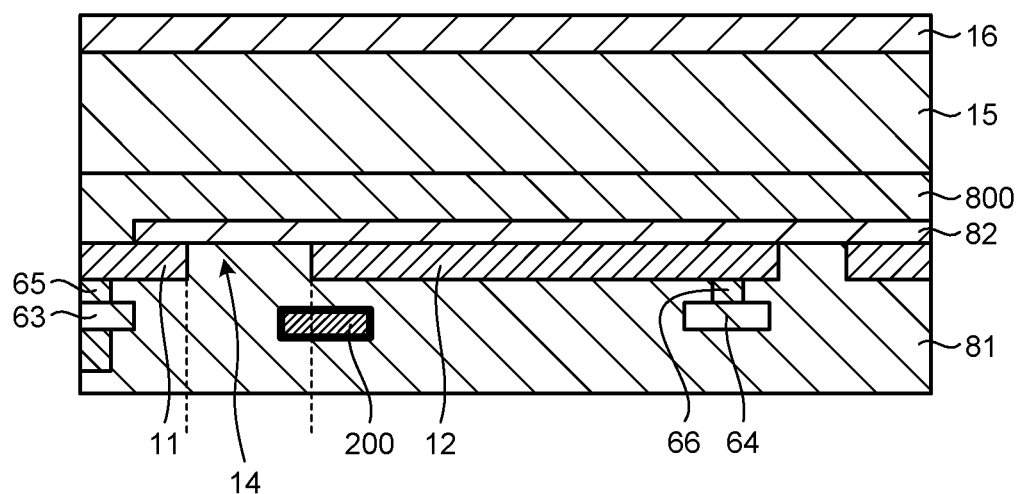
FIG. 11 is a diagram illustrating another arrangement example of a barrier formation electrode applicable to the first embodiment.

As described above, the arrangement of the barrier formation electrode 200 is not limited to the arrangement of the barrier formation electrode 200 completely included the gap 14 or the arrangement completely including the gap 14. That is, the barrier formation electrode 200 only needs to have a portion overlapping the gap 14 in the direction toward the semiconductor substrate 70, and for example, the barrier formation electrode 200 may be disposed partially beyond the gap 14 as illustrated in another arrangement example of FIG. 11.

Note that, hereinafter, in order to avoid complexity, "a portion overlapping the gap 14 (or the first electrode 11 and the charge accumulation electrode 12) in the direction toward the semiconductor substrate 70" will be described as "a portion overlapping the gap 14 (or the first electrode 11 and the charge accumulation electrode 12)" or the like.

2-0-3. Electrode Configuration Example According to First Embodiment

Next, some arrangement examples of the first electrode 11, the charge accumulation electrode 12, and the barrier formation electrode 200 applicable to the first embodiment will be described with reference to FIGS. 12A to 16B.

Figure 12A:
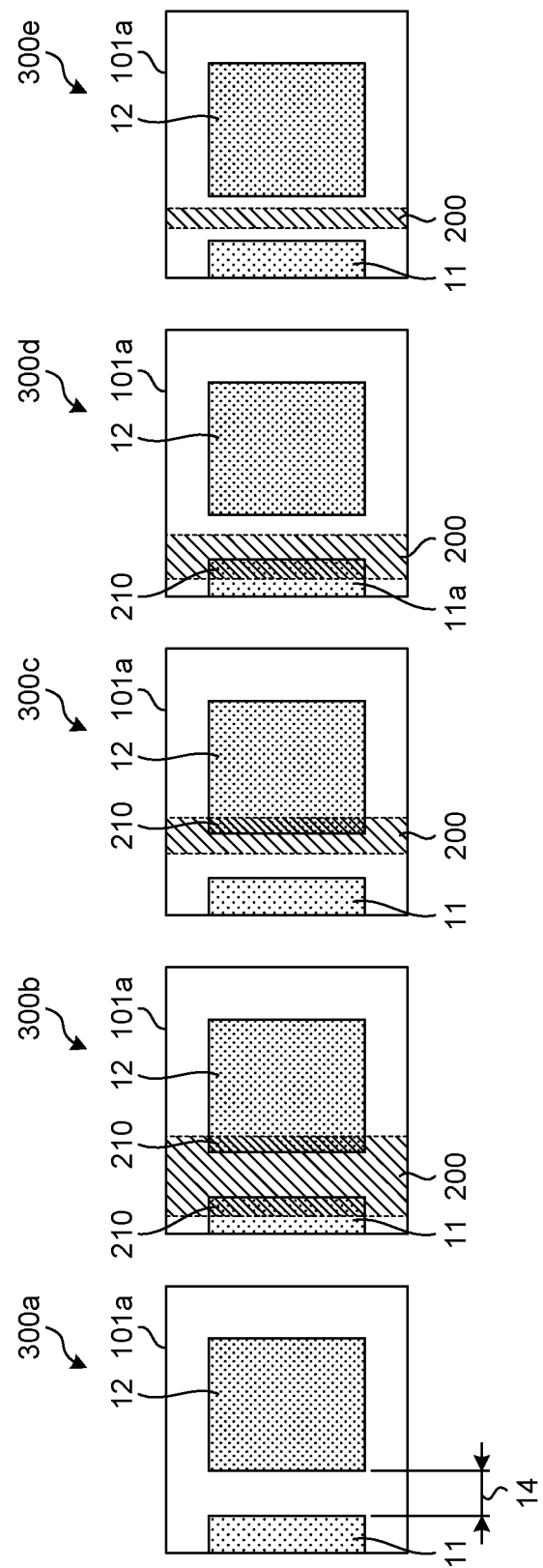
FIG. 12A is a schematic diagram illustrating an arrangement example of a first electrode, a charge accumulation electrode, and a barrier formation electrode applicable to the first embodiment.

A pixel 101a illustrated in FIG. 12A is an example of a pixel 101a in which a first electrode 11 is disposed along one side of the pixel 101a having a rectangular shape, and a charge accumulation electrode 12 is disposed with a gap 14 from the first electrode 11, as illustrated in a leftmost pattern 300a, similarly to the example of FIG. 9. In this case, the gap 14 is formed between a side of the first electrode 11 facing a side contacting the side of the pixel 101a and a side of the charge accumulation electrode 12 closest thereto.

Hereinafter, the pattern in which the first electrode 11 is disposed along one side of the pixel 101a, like the pattern 300a, will be referred to as a straight line pattern.

A pattern 300b in FIG. 12A is an example in which a barrier formation electrode 200 is disposed to have portions 210 overlapping the first electrode 11 and the charge accumulation electrode 12, respectively, with respect to the arrangement of the pattern 300a. In the pattern 300b, the barrier formation electrode 200 has a portion overlapping an entire width of the gap 14.

A pattern 300c in FIG. 12A is an example in which a barrier formation electrode 200 is disposed to have a portion 210 overlapping the charge accumulation electrode 12 with respect to the arrangement of the pattern 300a. In the pattern 300c, the barrier formation electrode 200 has a portion overlapping the gap 14 on the charge accumulation electrode 12 side, and has no portion overlapping the gap 14 on the first electrode 11 side. A pattern 300d in FIG. 12A is an example in which a barrier formation electrode 200 is disposed to have a portion 210 overlapping the first electrode 11 with respect to the arrangement of the pattern 300a. In the pattern 300c, the barrier formation electrode 200 has a portion overlapping the gap 14 on the first electrode 11 side, and has no portion overlapping the gap 14 on the charge accumulation electrode 12 side.

A pattern 300e in FIG. 12A is an example in which a barrier formation electrode 200 is disposed to have no portions overlapping both the first electrode 11 and the charge accumulation electrode 12 with respect to the arrangement of the pattern 300a. In the pattern 300e, the barrier formation electrode 200 has a portion overlapping the gap 14 within the gap 14.

Figure 12B:
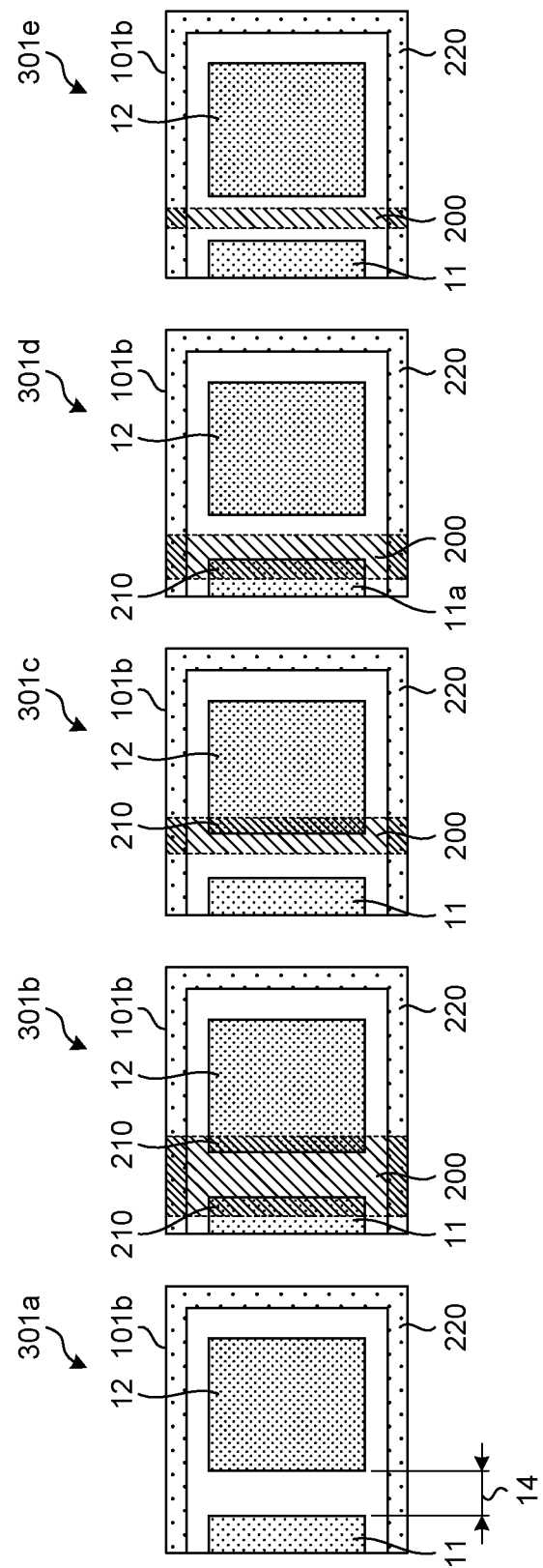
FIG. 12B is a schematic diagram illustrating an arrangement example of a first electrode, a charge accumulation electrode, and a barrier formation electrode applicable to the first embodiment.

As illustrated in a leftmost pattern 301a of FIG. 12B, FIG. 12B illustrates an example of a pixel 101b in which a pixel separation electrode 220 is arranged with respect to the pattern 300a of FIG. 12A described above. The pixel separation electrode 220 is disposed in an outer edge portion of the pixel 101b, and electrically separates the pixel 101b from an adjacent pixel 101b by applying a predetermined voltage (e.g., a negative bias) thereto. In the straight line pattern, the pixel separation electrode 220 is not disposed on a side on which first electrode 11 is disposed.

Patterns 301b, 301c, 301d, and 301e in FIG. 12B correspond to the patterns 300b, 300c, 300d, and 300e described with reference to FIG. 12A, respectively. That is, the pattern 301b is an example in which a barrier formation electrode 200 is disposed to have portions 210 overlapping a first electrode 11 and a charge accumulation electrode 12, respectively, with respect to the arrangement of the pattern 301a. The pattern 301c is an example in which a barrier formation electrode 200 is disposed to have a portion 210 overlapping the charge accumulation electrode 12 with respect to the arrangement of the pattern 301a. The pattern 301d is an example in which a barrier formation electrode 200 is disposed to have a portion 210 overlapping the first electrode 11 with respect to the arrangement of the pattern 301a. The pattern 301e is an example in which a barrier formation electrode 200 is disposed to have no portions overlapping both the first electrode 11 and the charge accumulation electrode 12 with respect to the arrangement of the pattern 301a.

As illustrated in a leftmost pattern 302a of FIG. 13A, FIG. 13A is an example of a pixel 101c in which a first electrode 11 is disposed at one corner of the pixel 101c having a rectangular shape, and a charge accumulation electrode 12 is disposed with a gap 14 from the first electrode 11. In this case, the gap 14 is formed between a corner of the first electrode 11 facing a corner contacting the corner of the pixel 101c and a corner of the charge accumulation electrode 12 closest thereto. That is, in this case, the gap 14 is formed in an oblique direction with respect to the rectangular shape of the pixel 101c.

Hereinafter, the pattern in which the first electrode 11 is disposed at the corner of the pixel 101c, like the pattern 302a, will be referred to as a corner arrangement pattern.

A pattern 302b in FIG. 13A is an example in which a barrier formation electrode 200 is disposed to have portions 210 overlapping the first electrode 11 and the charge accumulation electrode 12, respectively, with respect to the arrangement of the pattern 302a. In the pattern 302b, the barrier formation electrode 200 has a portion overlapping an entire width of the gap 14.

A pattern 302c in FIG. 13A is an example in which a barrier formation electrode 200 is disposed to have a portion 210 overlapping the charge accumulation electrode 12 with respect to the arrangement of the pattern 302a. In the pattern 302c, the barrier formation electrode 200 has a portion overlapping the gap 14 on the charge accumulation electrode 12 side, and has no portion overlapping the gap 14 on the first electrode 11 side. A pattern 302d in FIG. 13A is an example in which a barrier formation electrode 200 is disposed to have a portion 210 overlapping the first electrode 11 with respect to the arrangement of the pattern 302a. In the pattern 302c, the barrier formation electrode 200 has a portion overlapping the gap 14 on the first electrode 11 side, and has no portion overlapping the gap 14 on the charge accumulation electrode 12 side.

A pattern 302e in FIG. 13A is an example in which a barrier formation electrode 200 is disposed to have no portions overlapping both the first electrode 11 and the charge accumulation electrode 12 with respect to the arrangement of the pattern 302a. In the pattern 302e, the barrier formation electrode 200 has a portion overlapping the gap 14 within the gap 14.

Figure 13B:
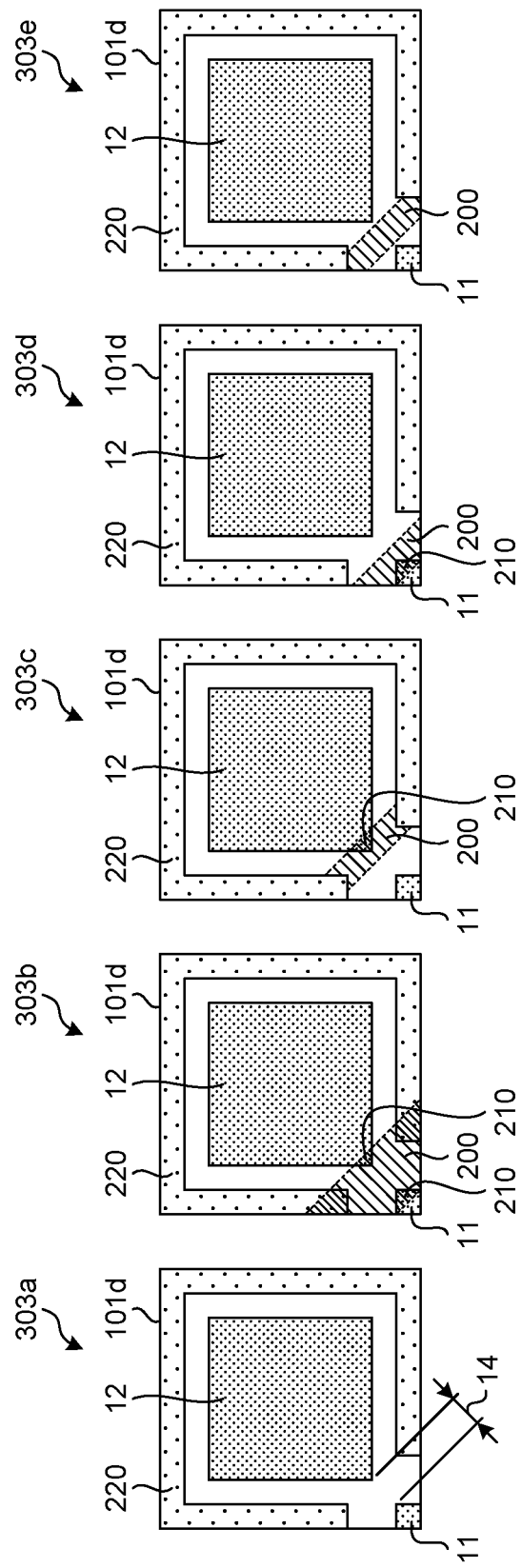
FIG. 13B is a schematic diagram illustrating an arrangement example of a first electrode, a charge accumulation electrode, and a barrier formation electrode applicable to the first embodiment.

As illustrated in a leftmost pattern 303a of FIG. 13B, FIG. 13B illustrates an example of a pixel 101d in which a pixel separation electrode 220 is arranged with respect to the pattern 302a of FIG. 13A described above. In the corner arrangement pattern, the pixel separation electrode 220 is not provided around the corner at which the first electrode 11 is disposed.

Patterns 303b, 303c, 303d, and 303e in FIG. 13B correspond to the patterns 302b, 302c, 302d, and 302e described with reference to FIG. 13A, respectively. That is, the pattern 303b is an example of a pixel 101d in which a barrier formation electrode 200 is disposed to have portions 210 overlapping a first electrode 11 and a charge accumulation electrode 12, respectively, with respect to the arrangement of the pattern 303a. The pattern 303c is an example in which a barrier formation electrode 200 is disposed to have a portion 210 overlapping the charge accumulation electrode 12 with respect to the arrangement of the pattern 303a. The pattern 303d is an example in which a barrier formation electrode 200 is disposed to have a portion 210 overlapping the first electrode 11 with respect to the arrangement of the pattern 303a. The pattern 303e is an example in which a barrier formation electrode 200 is disposed to have no portions overlapping both the first electrode 11 and the charge accumulation electrode 12 with respect to the arrangement of the pattern 303a.

Figure 14A:
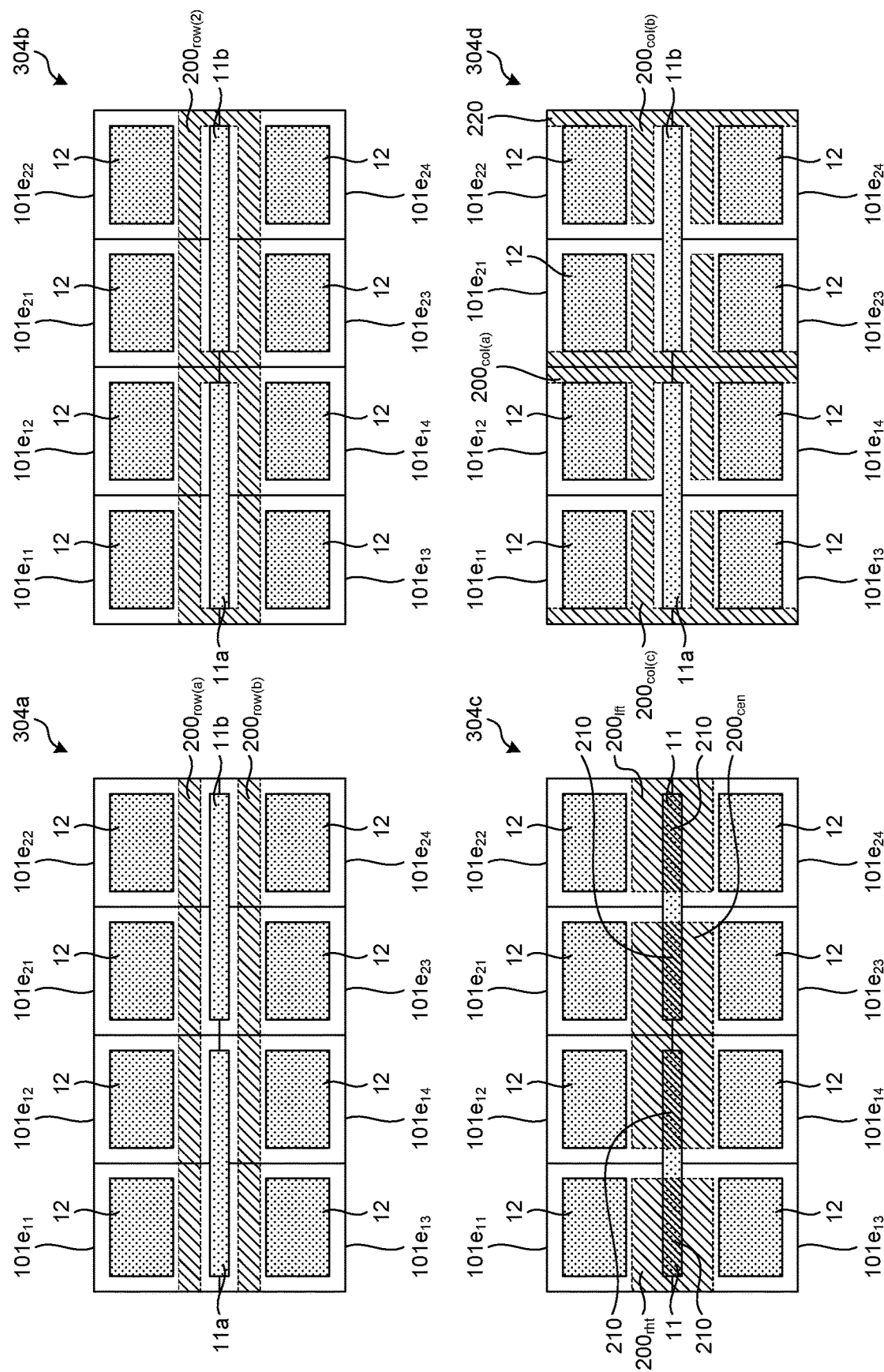
FIG. 14A is a schematic diagram illustrating an arrangement example of a first electrode, a charge accumulation electrode, and a barrier formation electrode applicable to the first embodiment.

FIG. 14A is a diagram illustrating an arrangement example of a barrier formation electrode 200 in a case where one first electrode 11 is shared by a plurality of pixels 101 when the pixels 101 are of the straight line pattern. Note that, not only in FIG. 14A but also in FIGS. 14B, 15A, 15B, 16A, and 16B to be described later, the horizontal direction of the drawing is a row direction and the vertical direction of the drawing is a column direction in a pixel array unit 111.

As illustrated in an upper left pattern 304a of FIG. 14A, one first electrode 11a is shared by four pixels $101e_{11}$, $101e_{12}$, $101e_{13}$, and $101e_{14}$ contacting each other at one point. Similarly, one first electrode 11b is shared by four pixels $101e_{21}$, $101e_{22}$, $101e_{23}$, and $101e_{24}$ contacting each other at one point. That is, in the pattern 304a, one first electrode 11 is shared by four pixels 101 contacting each other at one point as a sharing unit. In a case where one first electrode 11 is shared by a plurality of pixels 101 as described above, charges are read out from the charge accumulation electrode 12 of each of the pixels 101, for example, at a different time for each of the pixels 101.

In the pattern 304a, in this case, a barrier formation electrode $200_{row(a)}$ is shared by all the pixels $101e_{11}$, $101e_{12}$, $101d_{21}$, $102d_{22}$, . . . arranged in one row of the pixel array unit 111. Similarly, a barrier formation electrode $200_{row(b)}$ is shared by the pixels $101e_{13}$, $101e_{14}$, $101d_{23}$, $102d_{24}$, Since a fixed voltage is applied to each of the barrier formation electrodes $200_{row(a)}$ and $200_{row(b)}$ according to the first embodiment, the barrier formation electrode can be shared between the pixels 101. For example, concerning the pixels $101e_{11}$ to $101e_{14}$, while fixing potentials of the barrier formation electrodes $200_{row(a)}$ and $200_{row(b)}$, a charge accumulation electrode 12 of a target pixel among the pixels $101e_{11}$, $101e_{12}$, $101e_{13}$, and $101e_{14}$ is selectively controlled to read out charges from the charge accumulation electrode 12.

Note that the barrier formation electrodes $200_{row(a)}$ and $200_{row(b)}$ in the pattern 304a are illustrated as having no portions overlapping each of the first electrodes 11 and each of the charge accumulation electrodes 12, but are not limited to this example. That is, the barrier formation electrodes $200_{row(a)}$ and $200_{row(b)}$ may have portions overlapping both each first electrode 11 and each charge accumulation electrode 12, or may have a portion overlapping one of each first electrode 11 and each charge accumulation electrode 12.

In a pattern 304b of FIG. 14A, which is a straight line pattern with a first electrode 11 shared by four pixels 101 contacting each other at one point, one barrier formation electrode $200_{row(2)}$ is shared by all the pixels arranged in two adjacent rows of the pixel array unit 111, i.e., the pixels $101e_{11}$, $101e_{12}$, $101d_{21}$, $102d_{22}$, . . . , and the pixels $101e_{13}$, $101e_{14}$, $101d_{23}$, $102d_{24}$, . . . . That is, in the pattern 304b, one barrier formation electrode $200_{row(2)}$ is shared by every two rows of the pixel array unit 111.

Note that the barrier formation electrode $200_{row(2)}$ in the pattern 304b is illustrated as having no portions overlapping each of the first electrodes 11 and each of the charge accumulation electrodes 12, but is not limited to this example. That is, the barrier formation electrode $200_{row(2)}$ may have portions overlapping both each first electrode 11 and each charge accumulation electrode 12, or may have a portion overlapping one of each first electrode 11 and each charge accumulation electrode 12.

In a pattern 304c of FIG. 14A, which is a straight line pattern where one first electrode 11 is shared by four pixels 101 contacting each other at one point as a sharing unit, one barrier formation electrode 200 is shared by a plurality of pixels 101 across the sharing unit of pixels. For example, a first sharing unit sharing one first electrode 11a includes pixels $101e_{11}$ to $102e_{14}$. Similarly, a second sharing unit sharing one first electrode 11b includes pixels $101e_{21}$ to $102e_{24}$. In this case, one barrier formation electrode $200_{cen}$ is shared by the pixels $101e_{12}$, $101e_{21}$, $101e_{14}$, and $101e_{23}$ contacting each other at one point across the first sharing unit and the second sharing unit.

Similarly, the pixels $101e_{11}$ and $101e_{13}$ share a barrier formation electrode $200_{rht}$ with two pixels 101 adjacent thereto on the left side, although not illustrated, while contacting each other at one point across sharing units. In addition, the pixels $101e_{22}$ and $101e_{24}$ also share a barrier formation electrode $200_{lft}$ with two pixels 101 adjacent thereto on the right side, although not illustrated, while contacting each other at one point across sharing units.

Note that the barrier formation electrode $200_{cen}$ in the pattern 304c is illustrated as having portions overlapping the first electrodes 11a and 11b and having no portions overlapping the charge accumulation electrodes 12 on the upper and lower sides as an example, but is not limited to this example. For example, the barrier formation electrode 200cen may have overlapping portions with both the first electrodes 11a and 11b and the charge accumulation electrodes 12 on the upper and lower sides.

In a pattern 304d of FIG. 14A, which is a straight line pattern with a first electrode 11 shared by four pixels 101 contacting each other at one point, one barrier formation electrode $200_{col(a)}$ is shared by all the pixels arranged in two adjacent columns of the pixel array unit 111, i.e., the pixels $101e_{12}$, $101e_{14}$, $101d_{21}$, $102d_{23}$, . . . . That is, in the pattern 304d, one barrier formation electrode $200_{col(a)}$ is shared by every two columns of the pixel array unit 111.

In this case, the barrier formation electrode $200_{col(a)}$ has a vertical portion disposed in the column direction between the adjacent charge accumulation electrodes 12, and a protrusion portion disposed in a gap 14 between the first electrode 11 and the charge accumulation electrode 12 in one pixel 101 and extending from the vertical portion. The protrusion portion is a portion that contributes to generation of a potential barrier at a position corresponding to the gap 14 between the first electrode 11 and the charge accumulation electrode 12.

Similarly, the pixels $101e_{11}$, $101e_{13}$, . . . arranged in one column share a barrier formation electrode $200_{col(c)}$ with pixels 101 arranged in a column adjacent to the pixels $101e_{11}$, $101e_{13}$, . . . on the left side. In addition, the pixels $101e_{22}$, $101e_{24}$, . . . arranged in one column also share a barrier formation electrode $200_{col(b)}$ with pixels 101 arranged in a column adjacent to the pixels $101e_{22}$, $101e_{24}$, . . . on the right side.

Note that, for example, each protrusion portion of the barrier formation electrode $200_{col(a)}$ in the pattern 304d is illustrated as having no portions overlapping each of the first electrodes 11 and each of the charge accumulation electrodes 12, but is not limited to this example. That is, each protrusion portion of the barrier formation electrode $200_{col(a)}$ may have portions overlapping both each first electrode 11 and each charge accumulation electrode 12, or may have a portion overlapping one of each first electrode 11 and each charge accumulation electrode 12.

FIG. 14B is a diagram illustrating an example in which pixel separation electrodes 220 are arranged in pixels $101f_{11}$ to $101f_{14}$ and pixels $101f_{21}$ to $101f_{24}$ for each of the patterns 304a to 304d of FIG. 14A described above. That is, in FIG. 14B, a pattern 305a is an example in which pixel separation electrodes 220 are arranged in the pattern 304a, a pattern 305b is an example in which pixel separation electrodes 220 are arranged in the pattern 304b, a pattern 305c is an example in which pixel separation electrodes 220 are arranged in the pattern 304c, and a pattern 305d is an example in which pixel separation electrodes 220 are arranged in the pattern 304a. The arrangement of barrier formation electrodes 200 in each of the patterns 305a to 305d is similar to that in the example of each of the patterns 304a to 304d described above, and thus the description thereof is omitted here.

Note that, in each of the patterns 305a to 305d illustrated in FIG. 14B, each of the barrier formation electrodes $200_{row(a)}$, $200_{row(b)}$, $200_{row(2)}$, $200_{cen}$, $200_{rht}$, $200_{lft}$, $200_{col(a)}$, $200_{col(b)}$, and $200_{col(c)}$ has a portion overlapping the pixel separation electrode 220. This overlapping portion can be disregarded, because the pixel separation electrode 220 does not contribute to generation of a potential barrier between the first electrode 11 and the charge accumulation electrode 12.

Figure 15A:
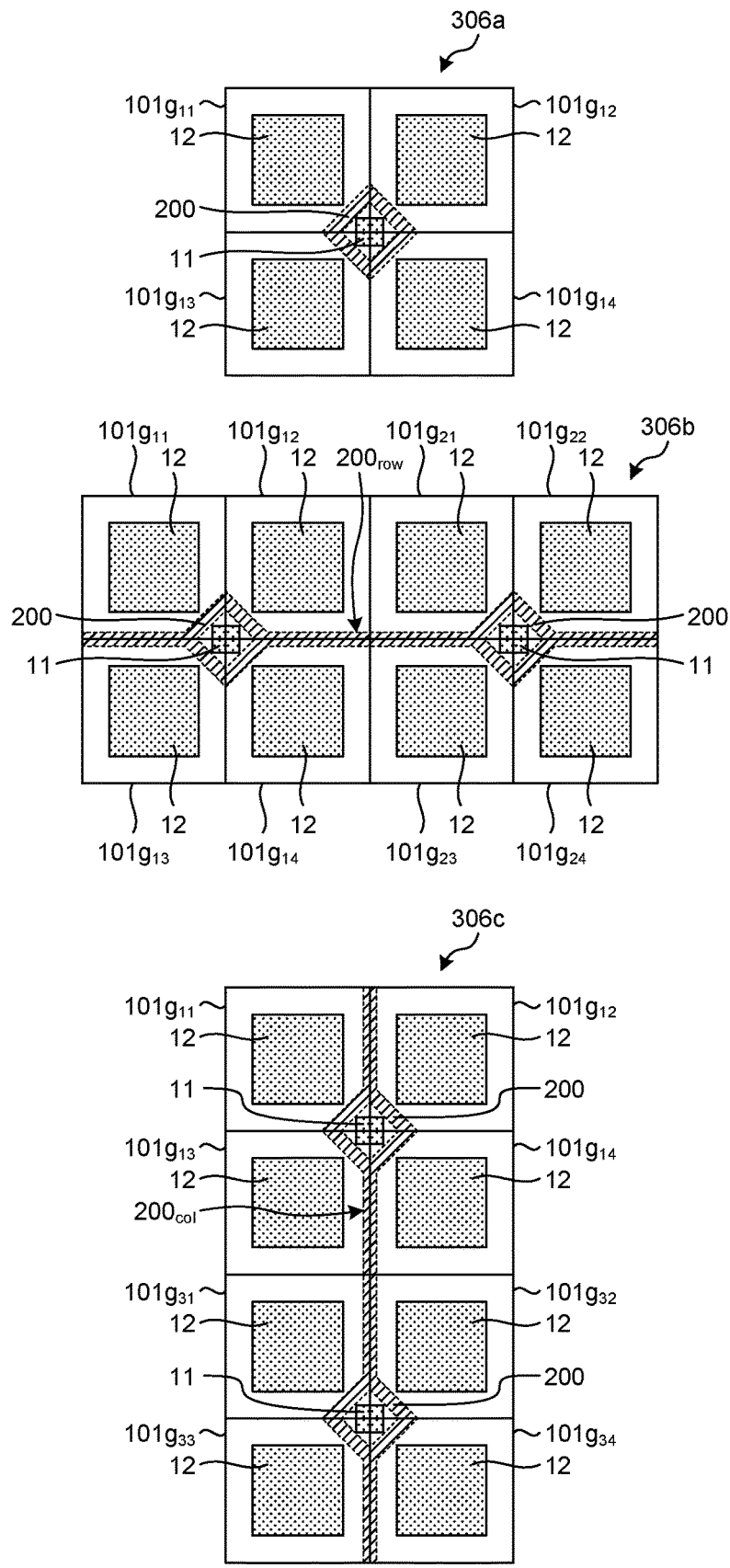
FIG. 15A is a schematic diagram illustrating an arrangement example of a first electrode, a charge accumulation electrode, and a barrier formation electrode applicable to the first embodiment.

FIG. 15A is a diagram illustrating an arrangement example of a barrier formation electrode 200 in a case where one first electrode 11 is shared by a plurality of pixels 101 when the pixels 101 are of the corner arrangement pattern. In FIG. 15A, a pattern 306a is an example in which one first electrode 11 is shared by four pixels $101g_{11}$, $101g_{12}$, $101g_{13}$, and $101g_{14}$ of the corner arrangement pattern. In the pattern 306a, the four pixels $101g_{11}$ to $101g_{14}$ contacting each other at one point constitute a unit sharing the first electrode 11, and the first electrode 11 is disposed to include the point at which the four pixels $101g_{11}$ to $101g_{14}$ contact each other.

In the example of FIG. 15A, in the pattern 306a which is a corner arrangement pattern, the barrier formation electrode 200 has a rhombus shape by connecting barrier formation electrodes, each arranged in a gap 14 between the first electrode 11 and a charge accumulation electrode 12 for each of the pixels $101g_{11}$ to $101g_{14}$, to each other.

Note that the barrier formation electrode 200 in the pattern 306a is illustrated as having no portions overlapping each of the first electrodes 11 and each of the charge accumulation electrodes 12, but is not limited to this example. That is, the barrier formation electrode 200 may have portions overlapping both each first electrode 11 and each charge accumulation electrode 12, or may have a portion overlapping one of each first electrode 11 and each charge accumulation electrode 12.

In a pattern 306b of FIG. 15A, which is a corner arrangement pattern with a first electrode 11 shared by four pixels 101 contacting each other at one point, one barrier formation electrode $200_{row}$ is shared by all the pixels arranged in two adjacent rows of the pixel array unit 111, i.e., the pixels $101g_{11}$, $101g_{12}$, $101g_{21}$, $102g_{22}$, . . . , and the pixels $101g_{13}$, $101g_{14}$, $101g_{23}$, $102g_{24}$, . . . . That is, in the pattern 306b, one barrier formation electrode $200_{row}$ is shared by every two rows of the pixel array unit 111.

Here, in the pattern 306b, a plurality of barrier formation electrodes 200 arranged in one row, that is, a barrier formation electrode 200 shared by the pixels $101g_{11}$ to $101g_{14}$, which constitute a unit sharing the first electrode 11, and a barrier formation electrode 200 shared by the pixels $101g_{21}$ to $101g_{24}$, . . . , are connected to each other by wirings or the like, to constitute one barrier formation electrode $200_{row}$ in terms of the entirety of the row. The barrier formation electrodes 200 arranged in one row are not limited thereto, and may be connected to each other by extending each of the barrier formation electrodes 200.

In a pattern 306c of FIG. 15A, which is a corner arrangement pattern with a first electrode 11 shared by four pixels 101 contacting each other at one point, one barrier formation electrode 200col is shared by all the pixels arranged in two adjacent columns of the pixel array unit 111, i.e., the pixels $101g_{11}$, $101g_{13}$, $101g_{31}$, $102g_{33}$, . . . , and the pixels $101g_{12}$, $101g_{14}$, $101g_{32}$, $102g_{34}$, . . . . That is, in the pattern 306c, one barrier formation electrode $200_{col}$ is shared by every two columns of the pixel array unit 111.

Here, in the pattern 306c, a plurality of barrier formation electrodes 200 arranged in a column direction, that is, a barrier formation electrode 200 shared by the pixels $101g_{11}$ to $101g_{14}$, which constitute a unit sharing the first electrode 11, and a barrier formation electrode 200 shared by the pixels $101g_{31}$ to $101g_{34}$, . . . , are connected to each other by wirings or the like, to constitute one barrier formation electrode $200_{col}$ in terms of the entirety of the row. The barrier formation electrodes 200 arranged in one column are not limited thereto, and may be connected to each other by extending each of the barrier formation electrodes 200.

Note that the barrier formation electrode 200 in each of the patterns 306a, 306b, and 306c described above is illustrated as having no portions overlapping each of the first electrodes 11 and each of the charge accumulation electrodes 12, but is not limited to this example. That is, the barrier formation electrode 200 may have portions overlapping both each first electrode 11 and each charge accumulation electrode 12, or may have a portion overlapping one of each first electrode 11 and each charge accumulation electrode 12.

Figure 15B:
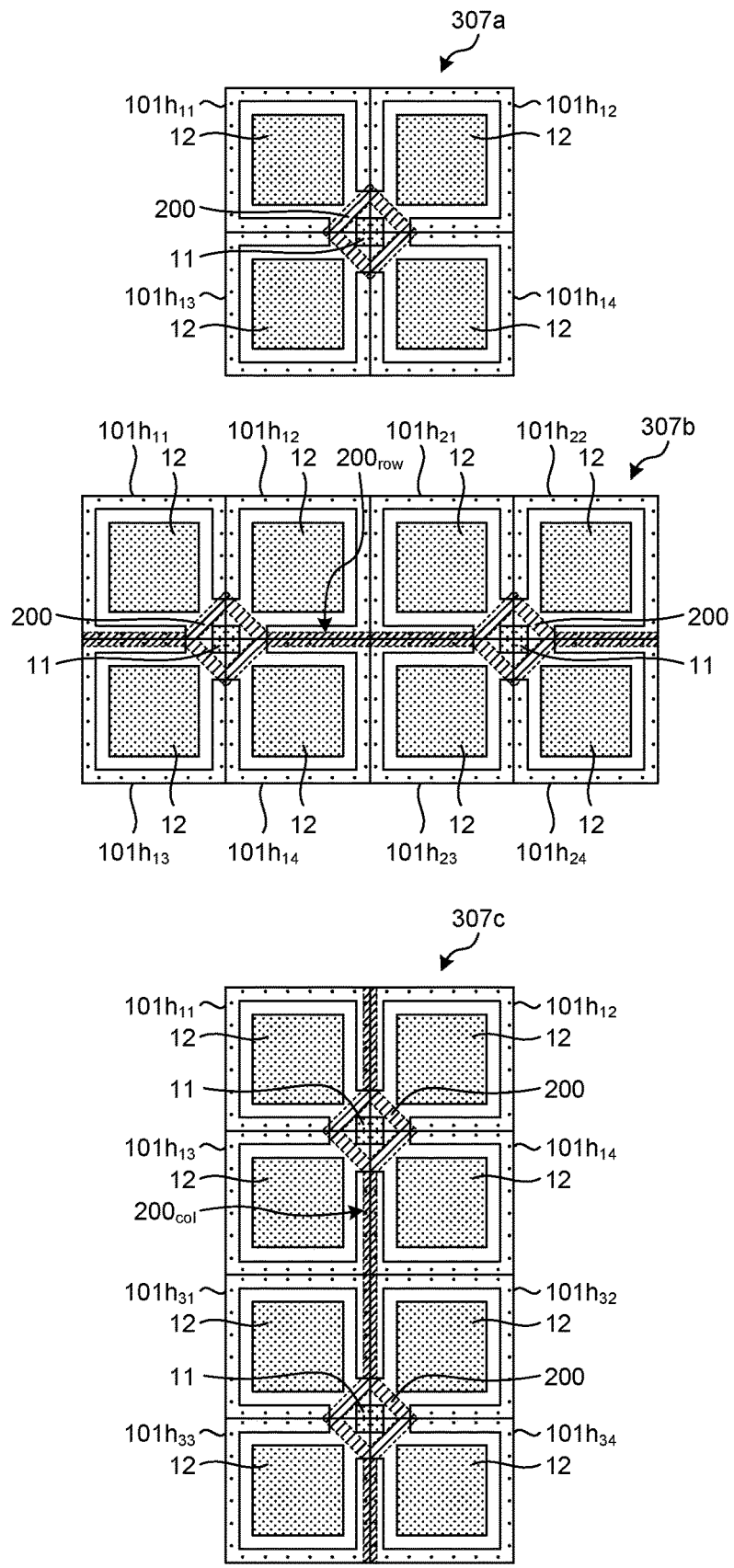
FIG. 15B is a schematic diagram illustrating an arrangement example of a first electrode, a charge accumulation electrode, and a barrier formation electrode applicable to the first embodiment.

FIG. 15B is a diagram illustrating an example in which pixel separation electrodes 220 are arranged in pixels $101h_{11}$ to $101h_{14}$ and pixels $101h_{21}$ to $101h_{24}$ for each of the patterns 306a to 306c of FIG. 15A described above. That is, in FIG. 15B, a pattern 307a is an example in which pixel separation electrodes 220 are arranged in the pattern 306a, a pattern 307b is an example in which pixel separation electrodes 220 are arranged in the pattern 306b, and a pattern 307c is an example in which pixel separation electrodes 220 are arranged in the pattern 306c. The arrangement of barrier formation electrodes 200 in each of the patterns 307a to 307c is similar to that in the example of each of the patterns 306a to 306c described above, and thus the description thereof is omitted here.

In each of the patterns 307b and 307c illustrated in FIG. 15B, a wiring connecting the barrier formation electrodes 200 to each other has a portion overlapping the pixel separation electrode 220. This overlapping portion can be disregarded, because the pixel separation electrode 220 does not contribute to generation of a potential barrier between the first electrode 11 and the charge accumulation electrode 12.

Here, in each of the patterns 307a to 307d, the periphery of the first electrode 11 is a region where no pixel separation electrode 220 is provided. That is, in each of the patterns 307a to 307d, the pixel separation electrodes 220 arranged in the pixels $101h_{11}$ to $101h_{14}$ sharing the first electrode 11 have such a shape that a central portion between lattices formed by outer peripheral portions of the pixels $101h_{11}$ to $101h_{14}$ is cut out.

2-0-4. Method of Applying Voltage to Barrier Formation Electrode According to First Embodiment Next, a method of applying a voltage to the barrier formation electrode 200 according to the first embodiment will be described. For example, in each of the patterns 300b to 300e and 301b to 301e described with reference to FIGS. 12A and 12B, which are straight line patterns, a voltage can be applied to the barrier formation electrode 200 from an outer peripheral portion of the pixel array unit 111 by sharing the barrier formation electrode 200 by the pixels 101 in each row or column of the pixel array unit 111 or connecting the barrier formation electrodes 200 to each other, referring to, for example, the patterns 304a, 304b, and 304d described with reference to FIG. 14A, the patterns 305a, 305b, and 305d, and the like. The same applies to the patterns 304a, 304b, and 304d described with reference to FIG. 14A, and the patterns 305a, 305b, and 305d.

In addition, in each of the patterns 300b to 300e and 301b to 301e, a voltage can be applied to the barrier formation electrode 200 by providing a through electrode penetrating through the semiconductor substrate 70 and connected to the wiring layer 62. The same applies to the patterns 302b to 302e and 303b to 303e described with reference to FIGS. 13A and 13B, which are corner arrangement patterns.

Here, a voltage application method in a case where a barrier formation electrode is shared by a plurality of pixels in a corner arrangement pattern will be described. For example, in an arrangement in which the first electrode 11 is shared by the four pixels $101h_{11}$ to $101h_{14}$ in the corner arrangement pattern as in the pattern 307a of FIG. 15B, it may be difficult to directly provide a through electrode with respect to the barrier formation electrode 200. An example of a method of applying a voltage to the barrier formation electrode 200 in such a case will be described with reference to FIGS. 16A to 16C.

Figure 16A:
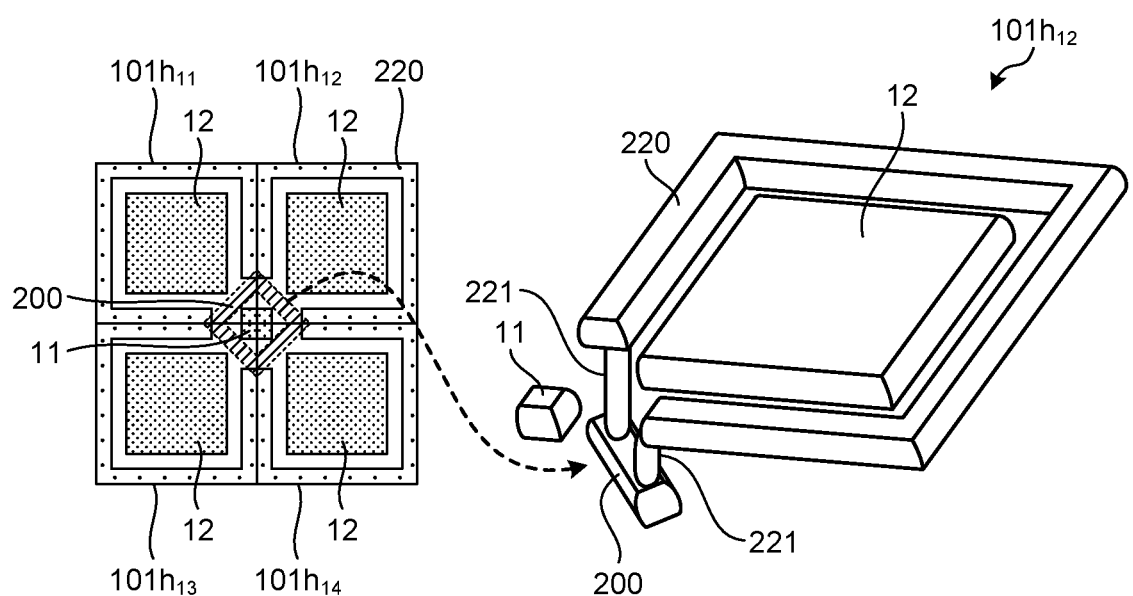
FIG. 16A is a schematic diagram illustrating a first example of a method of applying a voltage to the barrier formation electrode applicable to the first embodiment.

FIG. 16A is a schematic diagram illustrating a first example of a method of applying a voltage to the barrier formation electrode 200 applicable to the first embodiment. In the first example of the voltage application method, the barrier formation electrode 200 and the pixel separation electrode 220 are connected to each other, and a voltage is applied from the pixel separation electrode 220 to the barrier formation electrode 200.

In an arrangement according to the pattern 307a of FIG. 15B illustrated on a left side of FIG. 16A, the barrier formation electrode 200 is disposed lower than the pixel separation electrode 220. Therefore, as illustrated on a right side of FIG. 16A, the pixel separation electrode 220 and the barrier formation electrode 200 are connected to each other via a vertical via 221. In the example of FIG. 16A, an end portion of the pixel separation electrode 220 cut out in accordance with the arrangement of the first electrode 11 and an end portion of the barrier formation electrode 200 disposed obliquely between the first electrode 11 and the charge accumulation electrode 12 are connected to each other via the vertical via 221. A predetermined negative bias voltage is applied to the pixel separation electrode 220 to be electrically separated from adjacent pixels. Accordingly, the negative bias voltage can be applied to the barrier formation electrode 200, which is connected to the pixel separation electrode 220 via the vertical via 221.

Figure 16B:
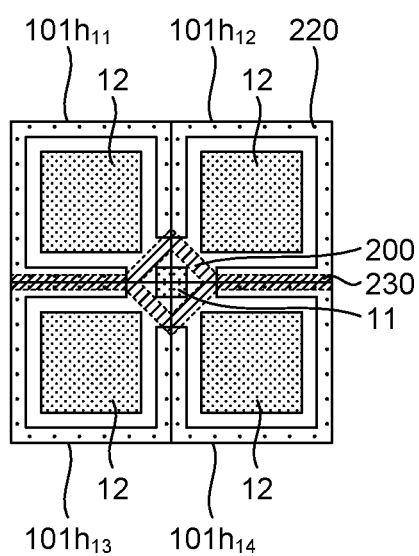
FIG. 16B is a schematic diagram illustrating a second example of a method of applying a voltage to the barrier formation electrode applicable to the first embodiment.

FIG. 16B is a schematic diagram illustrating a second example of a method of applying a voltage to the barrier formation electrode 200 applicable to the first embodiment. In the second example of the voltage application method, a wiring 230 is provided above the semiconductor substrate 70, and a voltage is applied to the barrier formation electrode 200 via the wiring 23. This second example can be applied to, for example, the patterns 307b and 307c of FIG. 15B described above.

Figure 16C:
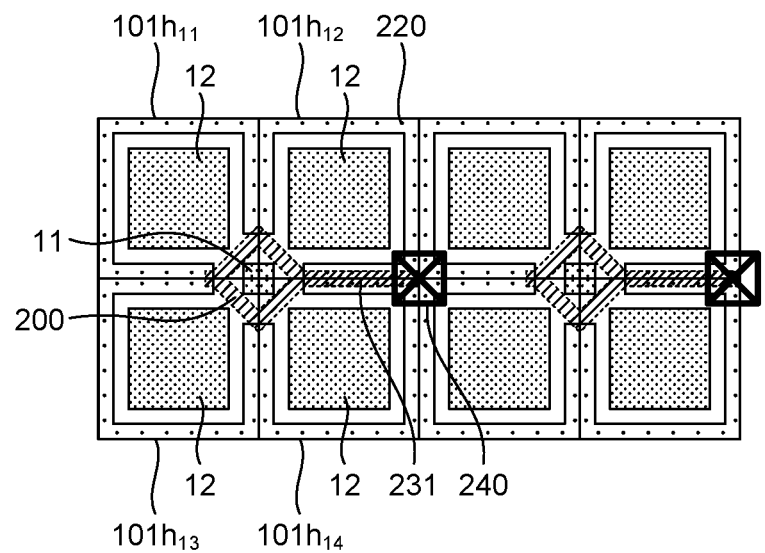
FIG. 16C is a schematic diagram illustrating a third example of a method of applying a voltage to the barrier formation electrode applicable to the first embodiment.

FIG. 16C is a schematic diagram illustrating a third example of a method of applying a voltage to the barrier formation electrode 200 applicable to the first embodiment. In the third example of the voltage application method, by using a through electrode 240 connected to the wiring layer 62, a voltage is applied to the barrier formation electrode 200 from the wiring layer 62 via the through electrode 240. In this case, the through electrode 240 is provided, for example, at a position to have a small influence on the operation of each of the pixels $101h_{11}$ to $101h_{14}$ sharing the first electrode 11, and the barrier formation electrode 200 and the through electrode 240 are connected to each other by a wiring 231. In the example of FIG. 16C, the through electrode 240 is provided at a predetermined position outside the charge accumulation electrode 12 of each of the pixels $101h_{11}$ to $101h_{14}$.

Among the first to third examples of the voltage application method described above, the first example is more advantageous than the second and third examples, because the barrier formation electrode 200 does not occupy a plane on which the first electrode 11, the charge accumulation electrode 12, and the pixel separation electrode 220 are disposed, and has small interference in the other electrodes.

Further, a voltage application method in a case where a barrier formation electrode is shared by a plurality of pixels in a straight line pattern across a unit sharing a first electrode will be described. In the pattern 305c of FIG. 14B described above, for example, the barrier formation electrode $200_{cen}$ is shared across the first sharing unit (pixels $101f_{11}$ to $101f_{14}$) sharing the first electrode 11a and the second sharing unit (pixels $101f_{21}$ to $102f_{24}$) sharing the first electrode 11b. In this case, it is difficult to apply a voltage to the barrier formation electrode $200_{cen}$ from the outer peripheral portion of the pixel array unit 111, for example, as in the patterns 305a, 305b, and 305d of FIG. 14B.

Figure 17:
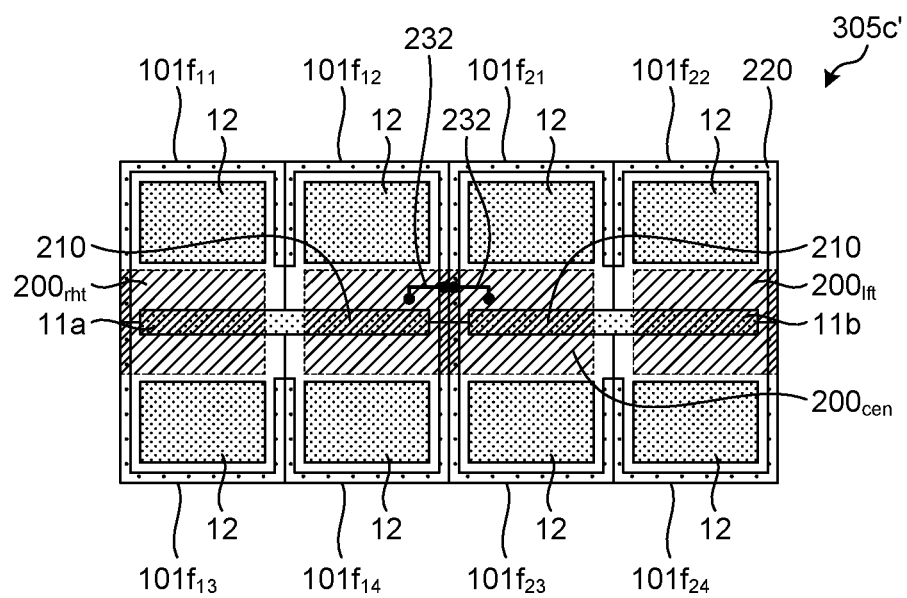
FIG. 17 is a schematic diagram illustrating a fourth example of a method of applying a voltage to the barrier formation electrode applicable to the first embodiment.

FIG. 17 is a schematic diagram illustrating a fourth example of a method for applying a voltage to the barrier formation electrode $200_{cen}$ applicable to the first embodiment. In a pattern 305c' illustrated in FIG. 17, a vertical via 232 for connecting the barrier formation electrode $200_{cen}$ and the pixel separation electrode 220 to each other is provided with respect to the pattern 305c of FIG. 14B. The vertical via 232 schematically illustrated in FIG. 17 is actually provided, for example, to connect a portion of the pixel separation electrode 220 disposed between the pixels $101f_{12}$ and $101f_{14}$ and the pixels $101f_{21}$ and $101f_{23}$ and the barrier formation electrode $200_{cen}$. By providing the vertical via 232 in this manner, the voltage applied to the pixel separation electrode 220 can be applied to the barrier formation electrode $200_{cen}$.

2-1. First Modification of First Embodiment

Next, a first modification of the first embodiment will be described. In the first embodiment described above, the pixel 101 has a structure in which the first photoelectric conversion unit that is a green photoelectric conversion unit, the second photoelectric conversion unit that is a blue photoelectric conversion unit, and the third photoelectric conversion unit that is a red photoelectric conversion unit are stacked. The technology according to the present disclosure is not limited to this example, and can also be applied to a pixel 101 having another configuration as long as the pixel 101 includes a first electrode 11 and a charge accumulation electrode 12, and a potential barrier is generated between a gap 14 between the first electrode 11 and the charge accumulation electrode 12 to accumulate charges.

A pixel 101 having another configuration to which the technology according to the present disclosure can be applied will be schematically described with reference to FIGS. 18A to 18C.

Figure 18A:
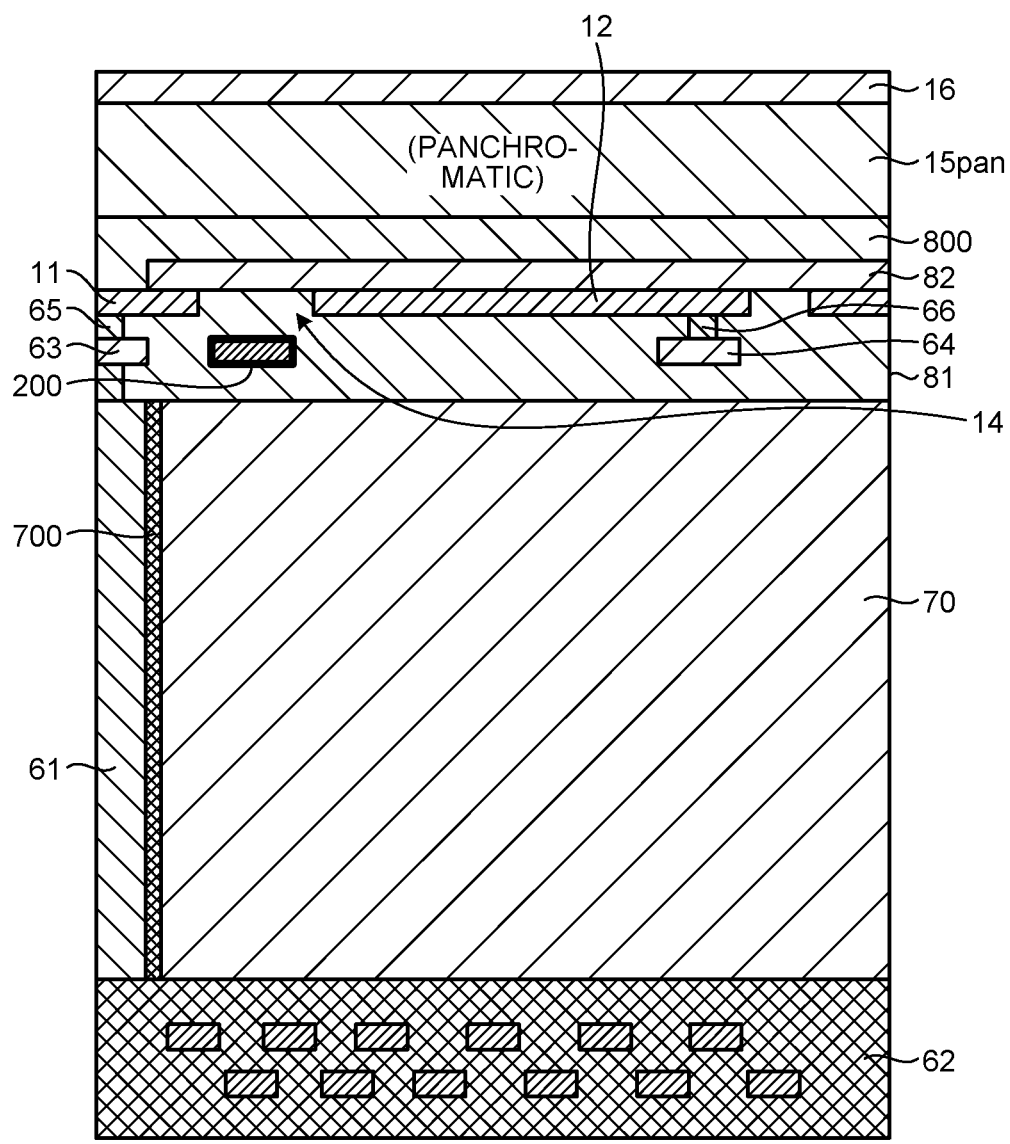
FIG. 18A is a schematic diagram illustrating a first example of a pixel configuration according to a first modification of the first embodiment.

FIG. 18A is a schematic diagram illustrating a first example of a pixel configuration according to the first modification of the first embodiment. The first example is an example in which the first photoelectric conversion unit is adapted as a panchromatic photoelectric conversion unit. That is, in the example of FIG. 18A, the first photoelectric conversion unit includes a photoelectric conversion layer 15pan using an organic photoelectric conversion material that is sensitive to light having a wavelength in a visible light region. In addition, the semiconductor substrate 70 is not provided with a photoelectric conversion layer 400 constituting a second photoelectric conversion unit and a photoelectric conversion layer 401 constituting a third photoelectric conversion unit. For example, by providing color filters such as red, green, and blue on the light receiving surface, a pixel signal corresponding to the color of the color filter can be output. No color filter can be provided, and in this case, a monochrome (grayscale) pixel signal can be output.

In the configuration of FIG. 18A as well, by disposing the barrier formation electrode 200 to have a portion overlapping the gap 14 between the first electrode 11 and the charge accumulation electrode 12, it is possible to secure an accumulated amount Qs of charges while maintaining a wide sensitive region.

Figure 18B:
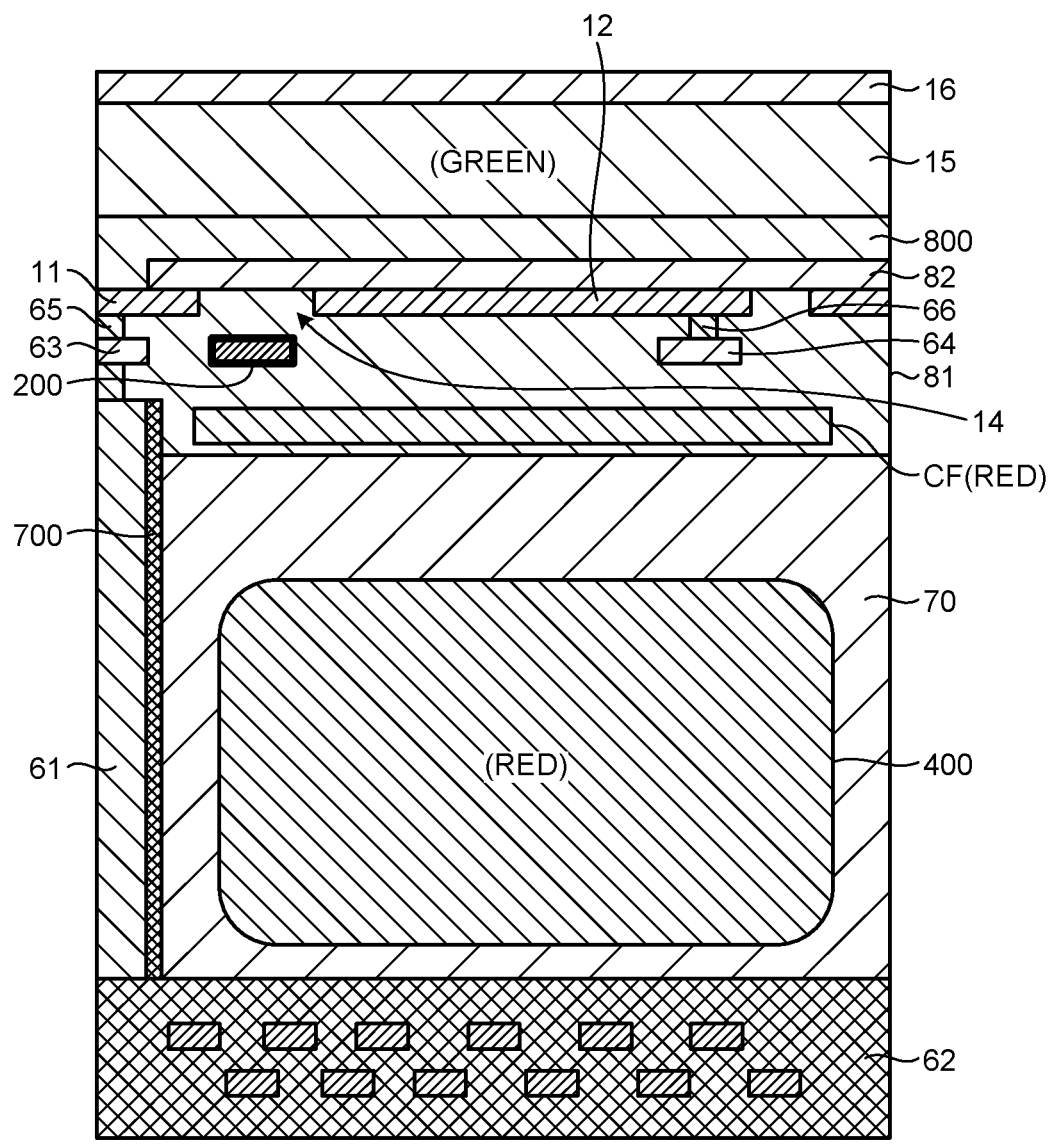
FIG. 18B is a schematic diagram illustrating a first example of a pixel configuration according to the first modification of the first embodiment.

FIG. 18B is a schematic diagram illustrating a second example of a pixel configuration according to the first modification of the first embodiment. The second example is an example in which the first photoelectric conversion unit remains as a green photoelectric conversion unit, and the second photoelectric conversion unit is a red photoelectric conversion unit. In this case, a color filter CF(RED) transmitting light in a red wavelength region is disposed above the semiconductor substrate 70. As a result, green and red pixel signals can be output. In addition, FIG. 18C is a schematic diagram illustrating a third example of a pixel configuration according to the first modification of the first embodiment. The third example is an example in which the first photoelectric conversion unit remains as a green photoelectric conversion unit as in FIG. 18B, and the second photoelectric conversion unit is a blue photoelectric conversion unit. In this case, a color filter CF(BLUE) transmitting light in a blue wavelength region is disposed above the semiconductor substrate 70. As a result, green and blue pixel signals can be output.

Figure 18C:
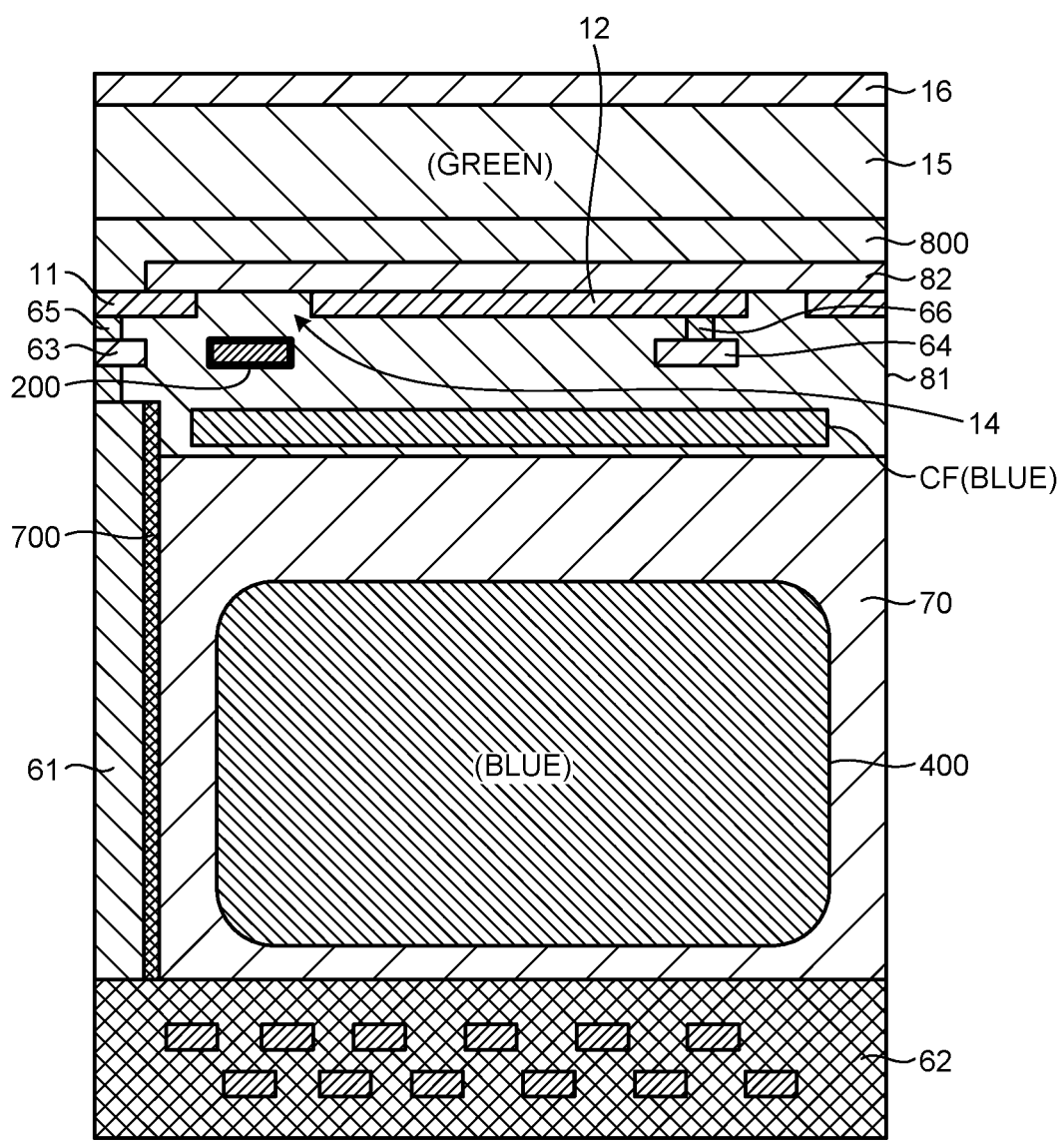
FIG. 18C is a schematic diagram illustrating a first example of a pixel configuration according to the first modification of the first embodiment.

By arranging pixels 101 having the configuration illustrated in FIG. 18B and pixels 101 having the configuration illustrated in FIG. 18C, for example, in a checkered pattern in the pixel array unit 111, full-color imaging can be achieved.

In the configurations of FIGS. 18B and 18C as well, by disposing the barrier formation electrode 200 to have a portion overlapping the gap 14 between the first electrode 11 and the charge accumulation electrode 12, it is possible to secure an accumulated amount Qs of charges while maintaining a wide sensitive region.

2-2. Second Modification of First Embodiment

Figure 19:
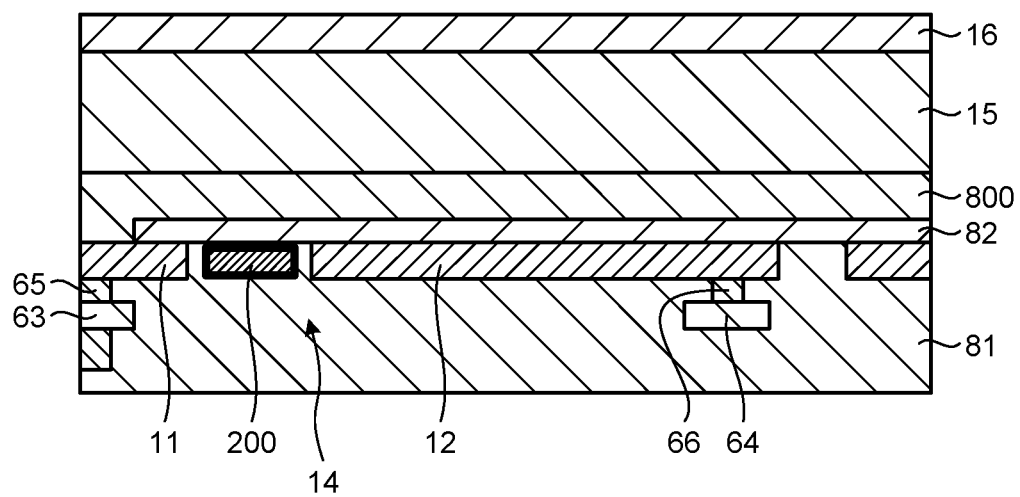
FIG. 19 is a diagram for explaining an arrangement example of electrodes according to a second modification of the first embodiment.

Next, a second modification of the first embodiment will be described. In the first embodiment and the first modification of the first embodiment described above, the barrier formation electrode 200 is disposed below the layer in which the first electrode 11 and the charge accumulation electrode 12 are disposed. In contrast, in the second modification of the first embodiment, as illustrated in FIG. 19, the barrier formation electrode 200 is disposed in the same layer as the first electrode 11 and the charge accumulation electrode 12, that is, in the gap 14 between the first electrode 11 and the charge accumulation electrode 12. In the arrangement of FIG. 19 as well, by applying a negative bias voltage to the barrier formation electrode 200, a higher potential barrier can be generated between the first electrode 11 and the charge accumulation electrode 12. On the other hand, in the configuration of FIG. 19, since the barrier formation electrode 200 is disposed in the same layer as the first electrode 11 and the charge accumulation electrode 12, the sensitive region decreases as much as a width of the barrier formation electrode 200.

3. Second Embodiment

Next, a second embodiment of the present disclosure will be described. In the first embodiment and the modifications thereof described above, a fixed voltage is applied to the barrier formation electrode 200. In contrast, in the second embodiment, the barrier formation electrode 200 is driven to change a voltage applied to the barrier formation electrode 200.

FIG. 20A is a schematic diagram illustrating an aspect of a potential barrier in an accumulation state in which charges are accumulated in the charge accumulation electrode 12 according to the second embodiment. In addition, FIG. 20B is a schematic diagram illustrating an aspect of a potential barrier in a transfer state in which the charges accumulated in the charge accumulation electrode 12 are transferred to the first electrode 11 according to the second embodiment.

In FIG. 20A, potential Pot(a) is, for example, a potential in a state where no voltage is applied to the barrier formation electrode 200. For example, the potential Pot(a) is generated according to a voltage applied to the second electrode 16. In the accumulation state, a negative bias voltage is applied to the barrier formation electrode 200 as an accumulation voltage. As a result, the potential at a position corresponding to the gap 14 is raised from the potential Pot(a) to potential Pot(b), and the potential barrier becomes high.

In the transfer state in which the charges accumulated in the charge accumulation electrode 12 are transferred to the first electrode 11, as illustrated in FIG. 20B, a positive bias voltage is applied to the barrier formation electrode 200 as a transfer voltage. That is, a higher voltage is applied to the barrier formation electrode 200 at the time of transfer than at the time of accumulation. As a result, the potential at the position corresponding to the gap 14 is lowered to potential Pot(c) lower than the potential Pot(b), and the potential barrier becomes low. At this time, the voltage applied to the barrier formation electrode 200 is preferably a voltage enabling the potential Pot(c) to be lower than the potential Pot(a).

At the time of transfer, while the transfer voltage is applied to the barrier formation electrode 200, a voltage lower than that at the time of accumulation is applied to the charge accumulation electrode 12. More specifically, a voltage enabling a potential corresponding to the charge accumulation electrode 12 to be higher than the potential Pot(c) is applied to the charge accumulation electrode 12. As a result, the potential corresponding to the charge accumulation electrode 12 becomes higher than the potential Pot(c) at the position corresponding to the gap 14, and the charges accumulated in the charge accumulation electrode 12 flow into the first electrode 11 beyond the potential barrier. At this time, since the voltage applied to the barrier formation electrode 200 is controlled to lower the potential barrier, a voltage applied to the charge accumulation electrode 12 can be reduced for transfer.

Note that it is not preferable to apply the second embodiment to an electrode arrangement in which the barrier formation electrode 200 is shared by a plurality of pixels 101. As an example, a case where the second embodiment is applied to the pattern 307a illustrated in FIG. 15B may be considered. In this case, since the barrier formation electrode 200 is shared by the pixels $101e_{11}$ to $101e_{14}$, when a transfer voltage is applied to the barrier formation electrode 200, a potential barrier at a position corresponding to the gap 14 between the charge accumulation electrode 12 and the first electrode 11 is lowered in each of the pixels $101e_{11}$ to $101e_{14}$. Accordingly, in the pixels $101e_{12}$ to $101e_{14}$ other than a pixel desired to read out charges (assumed as the pixel $101e_{11}$) among the plurality of pixels $101e_{11}$ to $101e_{14}$ sharing the barrier formation electrode 200, charges are also transferred to the first electrode 11 from their charge accumulation electrodes 12.

4. Third Embodiment

Next, a third embodiment of the present disclosure will be described. In the first embodiment, the modifications thereof, and the second embodiment described above, it has been described that the barrier formation electrode 200 is not connected to the first electrode 11 and the charge accumulation electrode 12. In contrast, in the third embodiment, a barrier formation electrode 200 is connected to a first electrode 11.

Figure 21:
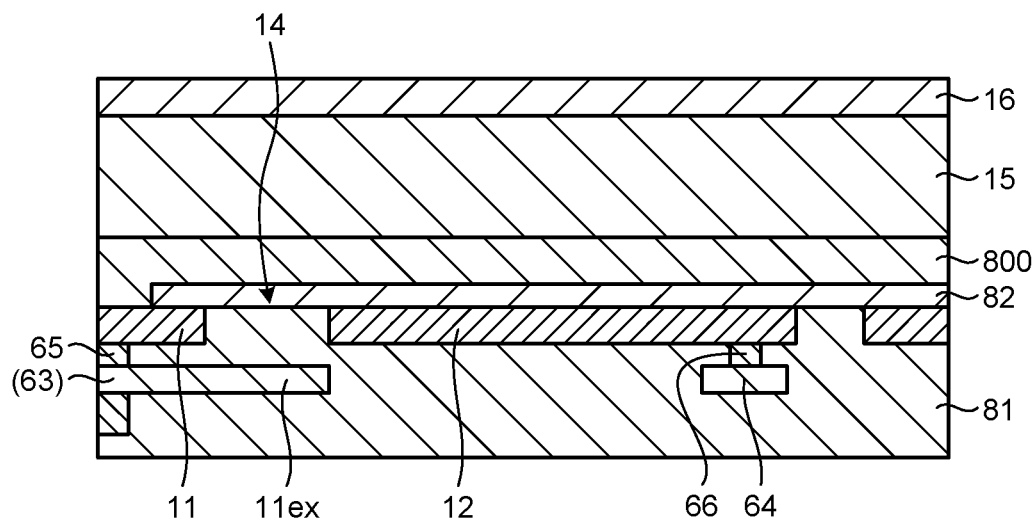
FIG. 21 is a diagram illustrating an arrangement example of a barrier formation electrode applicable to the second embodiment.

FIG. 21 is a diagram illustrating an arrangement example of the barrier formation electrode 200 applicable to the second embodiment. As illustrated in FIG. 21, in the second embodiment, a barrier formation electrode 11ex is connected to a connector for connecting the first electrode 11 to a wiring layer 22. More specifically, the pad 63, which constitutes the connector for connecting the first electrode 11 to the wiring layer 22, extends to a position of the gap 14, so that the pad 63 is used as the barrier formation electrode 11ex. The barrier formation electrode 11ex only needs to have a portion overlapping the gap 14, but preferably does not reach a position of the charge accumulation electrode 12.

Figure 22:
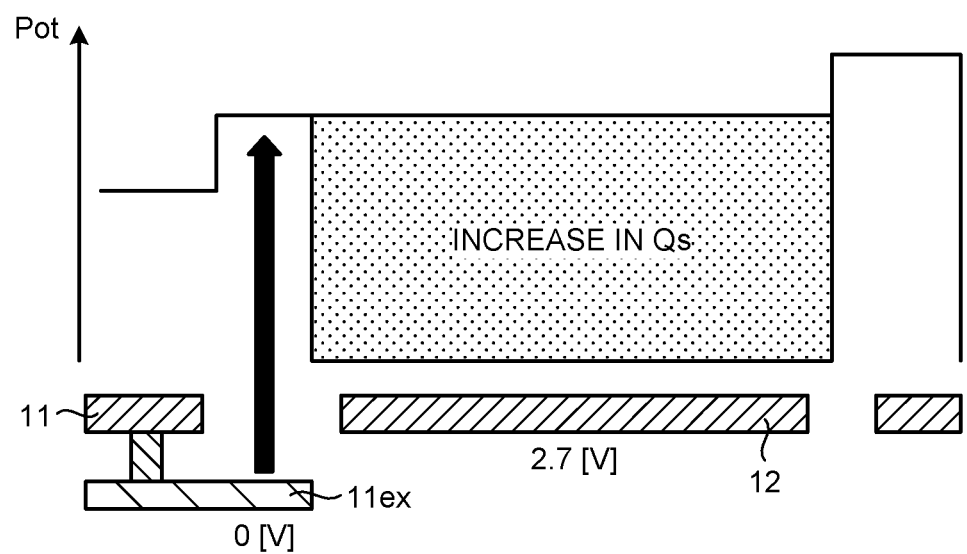
FIG. 22 is a schematic diagram illustrating the aspect of the potential barrier in the accumulation state according to the second embodiment.

FIG. 22 is a schematic diagram illustrating an aspect of a potential barrier in an accumulation state in which charges are accumulated in the charge accumulation electrode 12 according to the second embodiment. In the accumulation state, for example, a voltage of 2.7 [V] is applied to the charge accumulation electrode 12, and a voltage of 0 [V] is applied to the first electrode 11. At this time, a voltage applied to the second electrode 16 enables a potential at a position corresponding to the gap 14 to become higher than a potential of the first electrode 11.

As a result, a higher potential barrier is generated at the position corresponding to the gap 14 between the first electrode 11 and the charge accumulation electrode 12 than in a case where the barrier formation electrode 11ex is not provided. Accordingly, an accumulated amount Qs of charges accumulated by the charge accumulation electrode 12 increases as compared with that in the case where the barrier formation electrode 11ex is not provided.

At the time of transferring the charges accumulated in the charge accumulation electrode 12 to the first electrode 11, a voltage of 2.7 [V] is applied to the first electrode 11, and a voltage of 0 [V] is applied to the charge accumulation electrode 12. As a result, the potential of the charge accumulation electrode 12 is raised, and the potential of the first electrode 11 is lowered. In addition, a potential of the barrier formation electrode 11ex becomes, for example, a potential intermediate between the potential of the charge accumulation electrode 12 and the potential of the first electrode 11, according to the voltage applied to the second electrode 16. Therefore, the charges accumulated by the charge accumulation electrode 12 flow into the first electrode 11 beyond the potential barrier.

According to the third embodiment, since the barrier formation electrode 11ex is formed by extending the existing pad 63, it is possible to secure an accumulated amount Qs of charges while maintaining a wide sensitive region, without adding a new configuration.

Note that it is not preferable to apply the third embodiment to an electrode arrangement in which the barrier formation electrode 200 is shared by a plurality of pixels 101, for the same reason as the second embodiment.

5. Fourth Embodiment

5-1. Example of Application of Technology According to Present Disclosure

Figure 23:
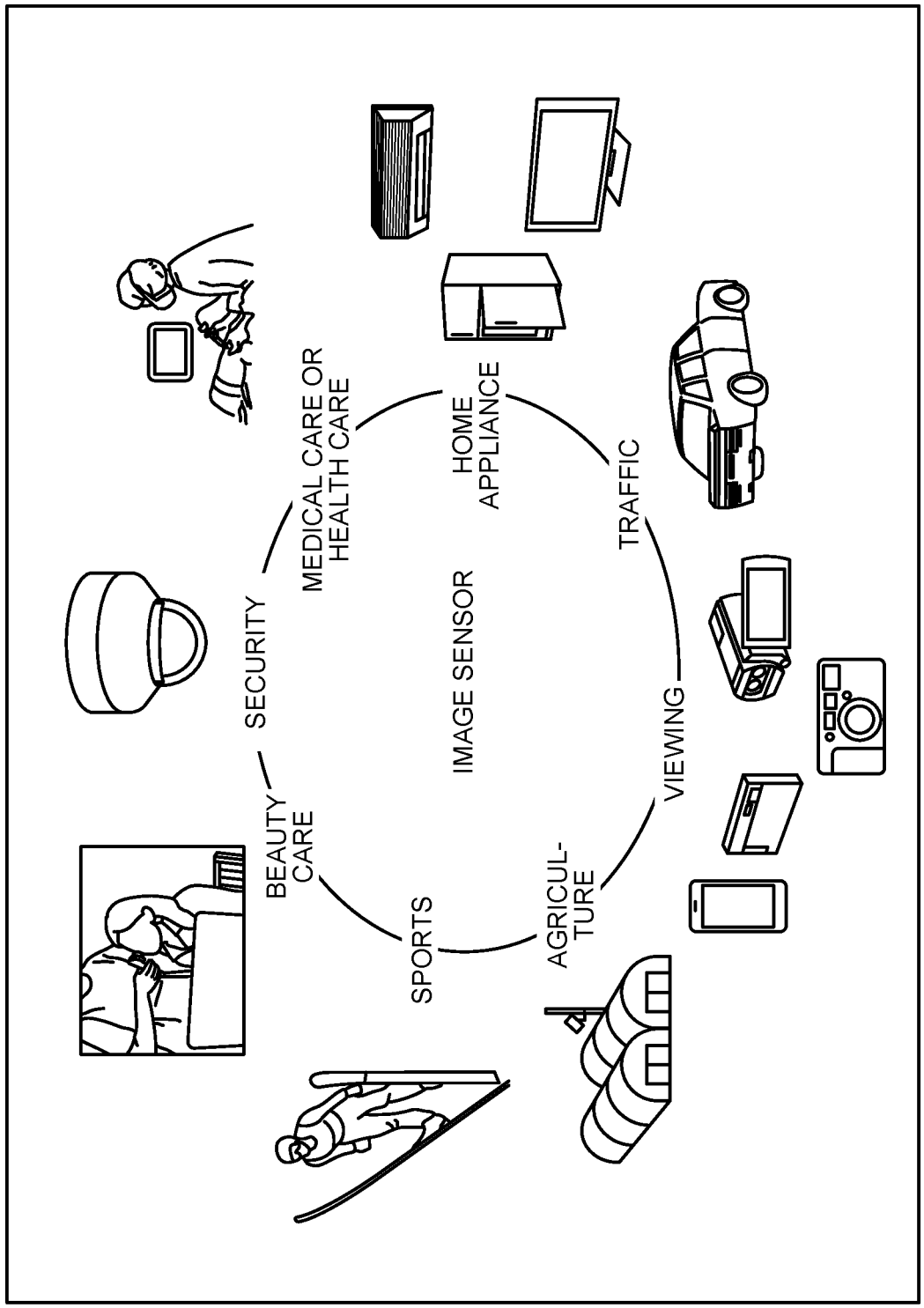
FIG. 23 is a diagram explaining a usage example of an imaging device to which the technology of the present disclosure is applied.

Next, as a fourth embodiment, examples of application of the imaging elements according to the first embodiment and the modifications thereof and the second and third embodiments of the present disclosure will be described. FIG. 23 is a diagram illustrating examples in which the imaging elements according to the first embodiment and the modifications thereof and the second embodiment described above are used.

The imaging elements according to the first embodiment and the modifications thereof and the second and third embodiments described above can be used, for example, in various cases where light such as visible light, infrared light, ultraviolet light, and X-rays is sensed, which will be described below.

A device capturing images to be used for viewing, such as a digital camera or a portable device having a camera function.

A device used for traffic, such as an in-vehicle sensor imaging the front, the rear, the surroundings, the inside, and the like of an automobile for safe driving, such as automatic stop, recognition of a driver's condition, or the like, a monitoring camera monitoring traveling vehicles and roads, or a distance measurement sensor measuring a distance between vehicles and the like.

A device used for a home appliance, such as a TV, a refrigerator, or an air conditioner, to image a user's gesture and operate the appliance according to the gesture.

A device used for medical care or health care, such as an endoscope or a device performing angiography by receiving infrared light.

A device used for security, such as a monitoring camera for crime prevention or a camera for person authentication.

A device used for beauty care, such as a skin measurement instrument for imaging a skin or a microscope for imaging a scalp.

A device used for sports, such as an action camera or a wearable camera for sports or the like.

A device used for agriculture, such as a camera for monitoring a condition of a farm or a crop.

5-2. Example of Application to Endoscopic Surgery System

The technology according to the present disclosure (the present technology) can be applied to various products. For example, the technology according to the present disclosure may be applied to an endoscopic surgery system.

Figure 24:
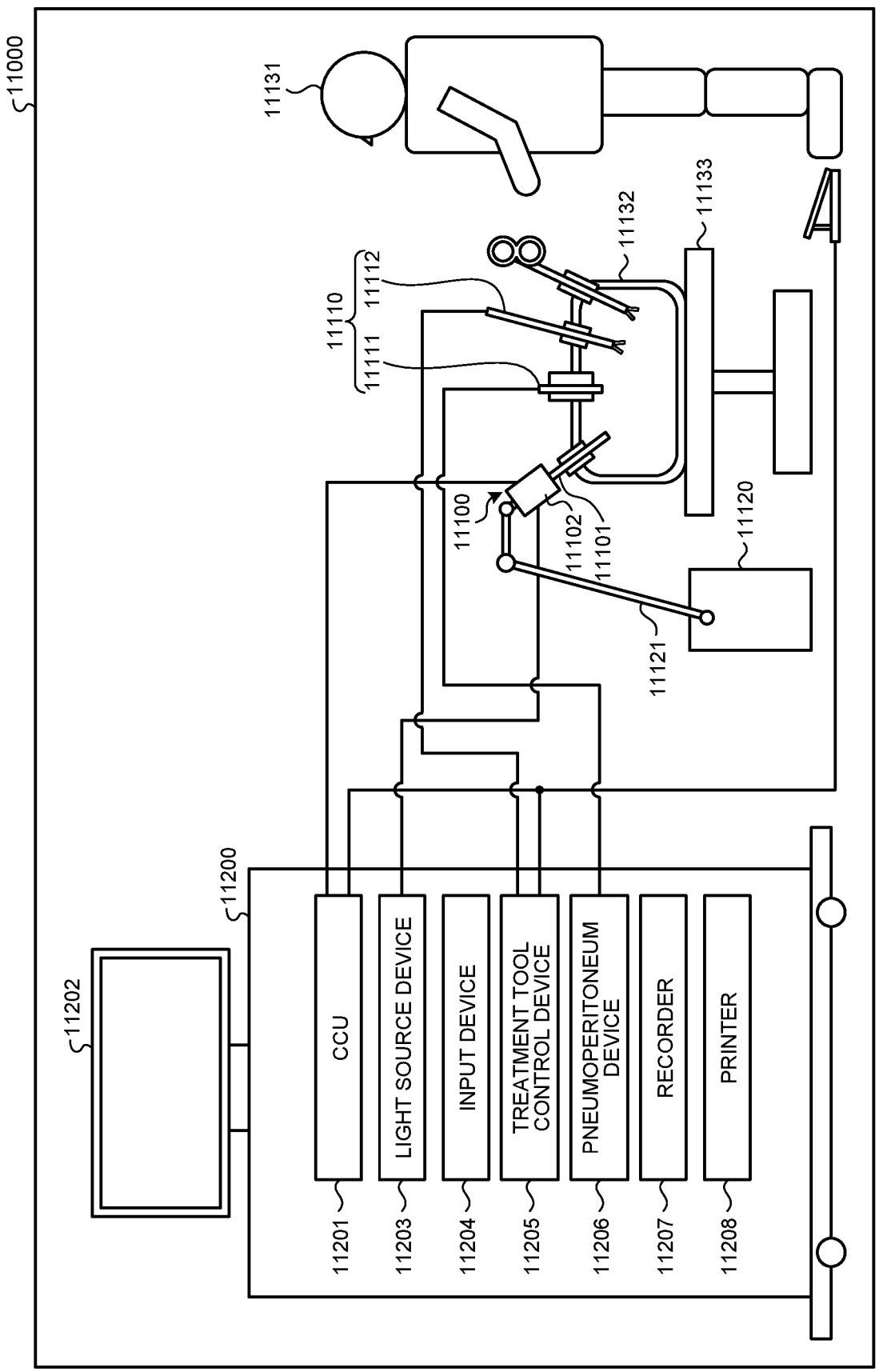
FIG. 24 is a diagram illustrating a schematic configuration example of an endoscopic surgery system.

FIG. 24 is a diagram illustrating a schematic configuration example of an endoscopic surgery system to which the technology according to the present disclosure (the present technology) can be applied.

In FIG. 24, it is illustrated that an operator (doctor) 11131 is performing surgery on a patient 11132 on a patient bed 11133 using an endoscopic surgery system 11000. As illustrated, the endoscopic surgery system 11000 includes an endoscope 11100, other surgical tools 11110 such as a pneumoperitoneum tube 11111 and an energy treatment tool 11112, a support arm device 11120 supporting the endoscope 11100, and a cart 11200 on which various kinds of devices for endoscopic surgery are mounted.

The endoscope 11100 includes a lens barrel 11101 whose region of a predetermined length from a front end thereof is inserted into a somatic cavity of the patient 11132, and a camera head 11102 connected to a rear end of the lens barrel 11101. In the illustrated example, the endoscope 11100 is configured as a so-called rigid scope having the lens barrel 11101 that is rigid. However, the endoscope 11100 may be configured as a so-called flexible scope having a lens barrel that is flexible.

An opening into which an objective lens has been fitted is provided at the front end of the lens barrel 11101. A light source device 11203 is connected to the endoscope 11100, light generated by the light source device 11203 is guided up to the front end of the lens barrel by a light guide that is provided to extend inside the lens barrel 11101, and the light is irradiated toward an observation target in the somatic cavity of the patient 11132 via the objective lens. Note that the endoscope 11100 may be a forward-viewing scope, an oblique-viewing scope, or a side-viewing scope.

An optical system and an imaging element are provided inside the camera head 11102, and reflected light (observation light) from the observation target is condensed on the imaging element by the optical system. The observation light is photoelectrically converted by the imaging element, and an electric signal corresponding to the observation light, that is, an image signal corresponding to the observation image is generated. The image signal is transmitted to a camera control unit (CCU) 11201 as RAW data.

The CCU 11201 includes a central processing unit (CPU), a graphics processing unit (GPU), etc., and comprehensively controls the operations of the endoscope 11100 and a display device 11202. Further, the CCU 11201 receives an image signal from the camera head 11102, and performs various kinds of image processing for displaying an image based on the image signal, for example, development processing (demosaicing processing) and the like, on the image signal.

The display device 11202 displays an image based on the image signal subjected to the image processing by the CCU 11201 according to the control of the CCU 11201.

The light source device 11203 includes a light source, for example, a light emitting diode (LED) or the like, and supplies irradiation light to the endoscope 11100 at the time of imaging a surgical site or the like.

An input device 11204 is an input interface for the endoscopic surgery system 11000. A user can input various kinds of information and instructions to the endoscopic surgery system 11000 via the input device 11204. For example, the user inputs an instruction for changing an imaging condition of the endoscope 11100 (such as type of irradiation light, magnification, or focal length) or the like.

A treatment tool control device 11205 controls driving of the energy treatment tool 11112 for cauterization or incision of tissue, sealing of a blood vessel, or the like. A pneumoperitoneum device 11206 feeds gas into the somatic cavity of the patient 11132 via the pneumoperitoneum tube 11111 to inflate the somatic cavity of the patient 11132 for the purpose of securing a visual field for the endoscope 11100 and securing a working space for the operator. A recorder 11207 is a device capable of recording various kinds of information regarding surgery. A printer 11208 is a device capable of printing out various kinds of information regarding surgery in any format such as text, image, or graph.

Note that the light source device 11203 supplying irradiation light to the endoscope 11100 at the time of imaging a surgical site can include, for example, an LED, a laser light source, or a white light source constituted by a combination thereof. In a case where the white light source is constituted by a combination of RGB laser light sources, it is possible to control an output intensity and an output timing of each color (each wavelength) with high accuracy, thereby adjusting a white balance of an image to be captured in the light source device 11203. Furthermore, in this case, by irradiating the observation target with laser light from each of the RGB laser light sources in a time division manner and controlling the driving of the imaging element in the camera head 11102 in synchronization with the irradiation timing, an image corresponding to each of RGB can be captured in a time division manner. According to this method, a color image can be obtained without providing color filters in the imaging element.

In addition, the driving of the light source device 11203 may be controlled to change an intensity of light to be output every predetermined time interval. By controlling the driving of the imaging element in the camera head 11102 in synchronization with the timing at which the intensity of the light is changed to acquire an image in a time division manner and synthesizing the image, a high dynamic range image without so-called underexposure and overexposure can be generated.

In addition, the light source device 11203 may be configured to be able to supply light having a predetermined wavelength band corresponding to special light observation. In the special light observation, so-called narrow band imaging is performed to image predetermined tissue such as a blood vessel of a superficial portion of a mucous membrane with high contrast, by irradiating light having a narrower band than irradiation light (that is, white light) at the time of normal observation, for example, using the fact that absorption of light by body tissue depends on a wavelength of the light Alternatively, in the special light observation, fluorescence observation may be performed to obtain an image using fluorescence generated by irradiating excitation light. In the fluorescence observation, fluorescence can be observed from body tissue by irradiating the body tissue with excitation light (autofluorescence observation), or a fluorescent image can be obtained by locally injecting a reagent such as indocyanine green (ICG) into body tissue and irradiating the body tissue with excitation light corresponding to a fluorescence wavelength of the reagent. The light source device 11203 can be configured to be able to supply narrow band light and/or excitation light corresponding to such special light observation.

Figure 25:
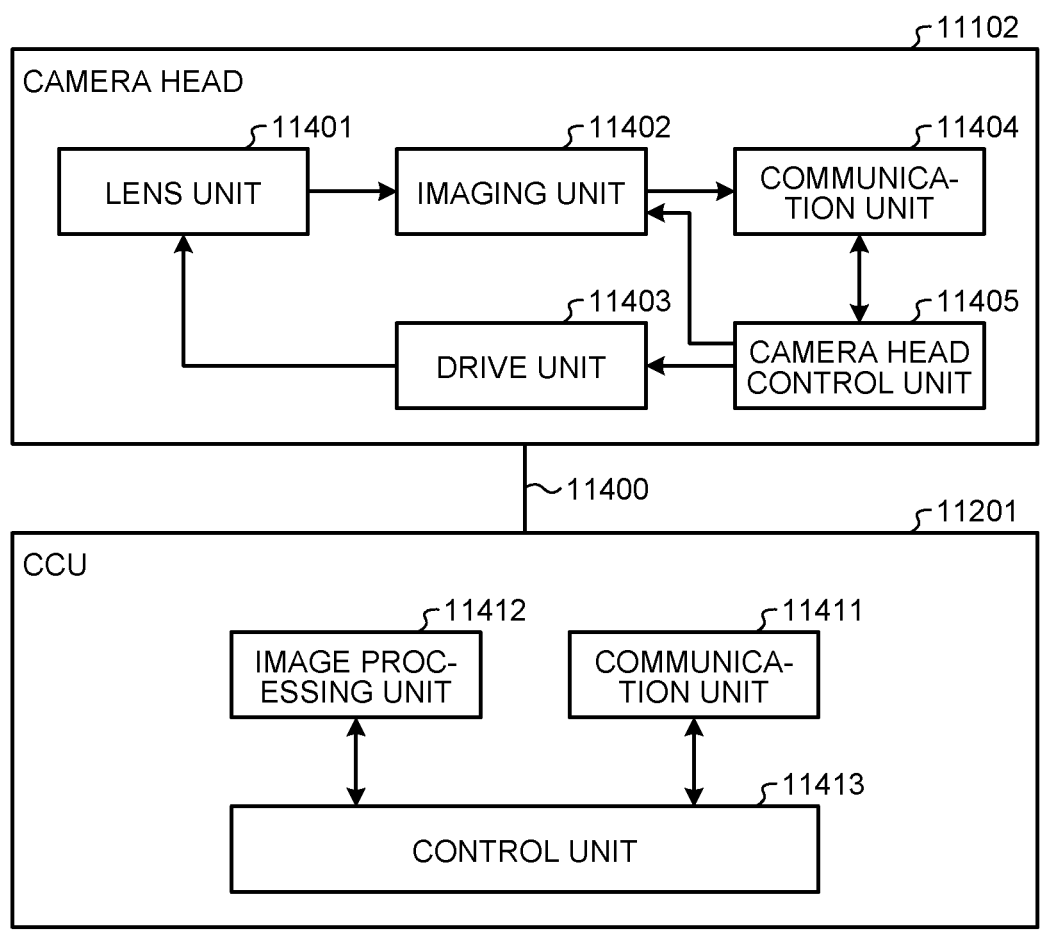
FIG. 25 is a block diagram illustrating an example of a functional configuration between a camera head and a CCU.

FIG. 25 is a block diagram illustrating an example of a functional configuration between the camera head 11102 and the CCU 11201 illustrated in FIG. 24.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicably connected to each other by a transmission cable 11400.

The lens unit 11401 is an optical system provided in a portion for connection with the lens barrel 11101. The observation light taken in from the front end of the lens barrel 11101 is guided to the camera head 11102 and incident on the lens unit 11401. The lens unit 11401 is configured by combining a plurality of lenses including a zoom lens and a focus lens.

The imaging unit 11402 includes an imaging element. The imaging unit 11402 may include one imaging element (so-called single-plate type) or a plurality of imaging elements (so-called multi-plate type). In a case where the imaging unit 11402 is configured in the multi-plate type, for example, image signals corresponding to RGB, respectively, may be generated by the respective imaging elements, and the generated image signals may be combined together, thereby obtaining a color image. Alternatively, the imaging unit 11402 may include a pair of imaging elements for acquiring image signals corresponding to three-dimensional (3D) display for a right eye and for a left eye, respectively. The 3D display enables the operator 11131 to grasp a depth of biological tissue more accurately at a surgical site. Note that, in a case where the imaging unit 11402 is configured in the multi-plate type, a plurality of lens units 11401 can be provided to correspond to the respective imaging elements.

In addition, the imaging unit 11402 is not necessarily provided in the camera head 11102. For example, the imaging unit 11402 may be provided immediately after the objective lens inside the lens barrel 11101.

The drive unit 11403 includes an actuator, and moves the zoom lens and the focus lens of the lens unit 11401 by a predetermined distance along an optical axis according to control of the camera head control unit 11405. Thus, a magnification and a focus for an image to be captured by the imaging unit 11402 can be appropriately adjusted.

The communication unit 11404 includes a communication device for transmitting and receiving various kinds of information to and from the CCU 11201. The communication unit 11404 transmits an image signal obtained from the imaging unit 11402 as RAW data to the CCU 11201 via the transmission cable 11400.

In addition, the communication unit 11404 receives a control signal for controlling driving of the camera head 11102 from the CCU 11201, and supplies the control signal to the camera head control unit 11405. The control signal includes information regarding imaging conditions, for example, information for specifying a frame rate for an image to be captured, information for specifying an exposure value at an imaging time, and/or information for specifying a magnification and a focus for an image to be captured, and the like.

Note that the imaging conditions such as frame rate, exposure value, magnification, and focus may be appropriately specified by the user, or may be automatically set by the control unit 11413 of the CCU 11201 on the basis of the acquired image signal. In the latter case, the endoscope 11100 has so-called auto exposure (AE), auto focus (AF), and auto white balance (AWB) functions.

The camera head control unit 11405 controls driving of the camera head 11102 on the basis of the control signal received from the CCU 11201 via the communication unit 11404.

The communication unit 11411 includes a communication device for transmitting and receiving various kinds of information to and from the camera head 11102. The communication unit 11411 receives an image signal transmitted from the camera head 11102 via the transmission cable 11400.

In addition, the communication unit 11411 transmits a control signal for controlling driving of the camera head 11102 to the camera head 11102. The image signal and the control signal can be transmitted by electric communication, optical communication, or the like.

The image processing unit 11412 performs various kinds of image processing on the image signal that is RAW data transmitted from the camera head 11102.

The control unit 11413 performs various kinds of control relating to imaging of a surgical site or the like by the endoscope 11100 and displaying of a captured image obtained by imaging the surgical site or the like. For example, the control unit 11413 generates a control signal for controlling driving of the camera head 11102.

In addition, the control unit 11413 causes the display device 11202 to display the captured image of the surgical site or the like on the basis of the image signal subjected to the image processing by the image processing unit 11412. At this time, the control unit 11413 may recognize various objects in the captured image using various image recognition technologies. For example, the control unit 11413 can recognize a surgical tool such as forceps, a specific biological part, bleeding, a mist at the time of using the energy treatment tool 11112, and the like by detecting edge shapes, colors, and the like of the objects included in the captured image. When displaying the captured image on the display device 11202, the control unit 11413 may superimpose various kinds of surgery support information on the image of the surgical site by using the recognition result. Since the superimposed display of the surgery support information is presented to the operator 11131, it is possible to lessen burden on the operator 11131, and the operator 11131 can reliably proceed with surgery.

The transmission cable 11400 connecting the camera head 11102 and the CCU 11201 to each other is an electric signal cable dealing with electric signal communication, an optical fiber dealing with optical communication, or a composite cable thereof.

Here, in the illustrated example, communication is performed in a wired manner using the transmission cable 11400. However, communication between the camera head 11102 and the CCU 11201 may be performed in a wireless manner.

An example of the endoscopic surgery system to which the technology according to the present disclosure can be applied has been described above. The technology according to the present disclosure can be applied to, for example, the endoscope 11100 or the imaging unit 11402 of the camera head 11102 among the above-described components. Specifically, the above-described imaging element can be applied to the imaging unit 10112. The imaging element according to the present disclosure is capable of both securing a wide sensitive region (charge accumulation electrode 12) and securing an accumulated amount Qs of charges in each pixel 101, thereby obtaining a higher quality captured image. As a result, for example, the operator 11131 can proceed with the surgery more reliably.

Note that although the endoscopic surgery system has been described as an example here, the technology according to the present disclosure may also be applied to, for example, another microscopic surgery system or the like.

5-3. Example of Application to Moving Body

The technology according to the present disclosure may be further applied to devices mounted on various types of moving bodies such as an automobile, an electric car, a hybrid electric car, a motorcycle, a bicycle, a personal mobility, an airplane, a drone, a ship, and a robot.

Figure 26:
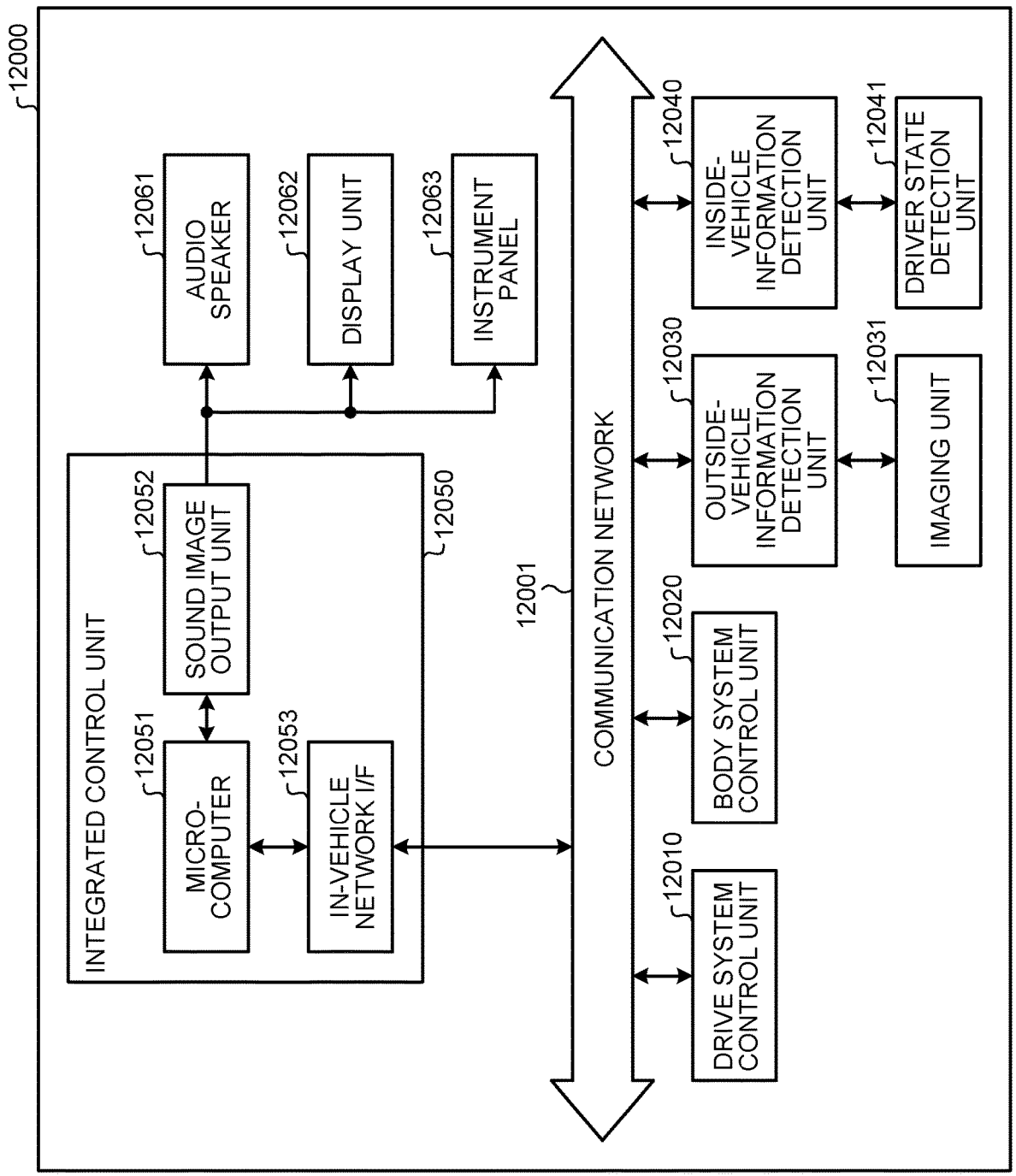
FIG. 26 is a block diagram illustrating a schematic configuration example of a vehicle control system.

FIG. 26 is a block diagram illustrating a schematic configuration example of a vehicle control system as an example of a moving body control system to which the technology according to the present disclosure can be applied.

A vehicle control system 12000 includes a plurality of electronic control units connected to each other via a communication network 12001. In the example illustrated in FIG. 26, the vehicle control system 12000 includes a drive system control unit 12010, a body system control unit 12020, an outside-vehicle information detection unit 12030, an inside-vehicle information detection unit 12040, and an integrated control unit 12050. Furthermore, as functional components of the integrated control unit 12050, a microcomputer 12051, a sound image output unit 12052, and an in-vehicle network interface (I/F) 12053 are illustrated.

The drive system control unit 12010 controls operations of devices related to a drive system of a vehicle according to various programs. For example, the drive system control unit 12010 functions as a control device for a driving force generation device for generating a driving force of the vehicle such as an internal combustion engine or a driving motor, a driving force transmission mechanism for transmitting the driving force to wheels, a steering mechanism adjusting a steering angle of the vehicle, a braking device generating a braking force of the vehicle, and the like.

The body system control unit 12020 controls operations of various devices mounted on a vehicle body according to various programs. For example, the body system control unit 12020 functions as a device for controlling a keyless entry system, a smart key system, a power window device, or various types of lamps such as a head lamp, a back lamp, a brake lamp, a blinker, and a fog lamp. In this case, radio waves transmitted from a portable machine substituting for a key or signals of various switches can be input to the body system control unit 12020. The body system control unit 12020 receives these radio waves or signals input thereto, and controls a door lock device, a power window device, a lamp, and the like of the vehicle.

The outside-vehicle information detection unit 12030 detects information on the outside of the vehicle on which the vehicle control system 12000 is mounted. For example, an imaging unit 12031 is connected to the outside-vehicle information detection unit 12030. The outside-vehicle information detection unit 12030 causes the imaging unit 12031 to capture an image of the outside of the vehicle, and receives the captured image. The outside-vehicle information detection unit 12030 may perform object detection processing or distance detection processing with respect to a person, a vehicle, an obstacle, a sign, a character on a road surface, or the like on the basis of the received image. For example, the outside-vehicle information detection unit 12030 performs image processing on the received image, and performs object detection processing or distance detection processing on the basis of the image processing result.

The imaging unit 12031 is an optical sensor receiving light and outputting an electric signal corresponding to an amount of the received light. The imaging unit 12031 can output the electric signal as an image or as distance measurement information. In addition, the light received by the imaging unit 12031 may be visible light or invisible light such as infrared light.

The inside-vehicle information detection unit 12040 detects information on the inside of the vehicle. For example, a driver state detection unit 12041 detecting a driver's state is connected to the inside-vehicle information detection unit 12040. The driver state detection unit 12041 includes, for example, a camera imaging the driver. On the basis of detection information input from the driver state detection unit 12041, the inside-vehicle information detection unit 12040 may calculate a degree of fatigue or a degree of concentration of the driver or may determine whether or not the driver is dozing off.

The microcomputer 12051 can calculate a control target value for the driving force generation device, the steering mechanism, or the braking device on the basis of the information on the inside or the outside of the vehicle acquired from the outside-vehicle information detection unit 12030 or the inside-vehicle information detection unit 12040, and output a control command to the drive system control unit 12010. For example, the microcomputer 12051 can perform cooperative control for the purpose of realizing functions of an advanced driver assistance system (ADAS) including collision avoidance or impact mitigation of the vehicle, follow-up traveling based on a distance between vehicles, constant-speed vehicle traveling, warning of vehicle collision, warning of vehicle lane departure, and the like.

Furthermore, the microcomputer 12051 can perform cooperative control for the purpose of automatic driving to autonomously travel or the like, rather than depending on a driver's operation, by controlling the driving force generation device, the steering mechanism, the braking device, or the like on the basis of the information on surroundings of the vehicle acquired from the outside-vehicle information detection unit 12030 or the inside-vehicle information detection unit 12040.

In addition, the microcomputer 12051 can output a control command to the body system control unit 12020 on the basis of the information on the outside of the vehicle acquired from the outside-vehicle information detection unit 12030. For example, the microcomputer 12051 can perform cooperative control for the purpose of preventing glare, such as switching from a high beam to a low beam, by controlling the head lamp according to a position of a preceding vehicle or an opposite vehicle detected by the outside-vehicle information detection unit 12030.

The sound image output unit 12052 transmits an output signal of at least one of a sound and an image to an output device capable of visually or acoustically notifying an occupant of the vehicle or the outside of the vehicle of information. In the example of FIG. 26, an audio speaker 12061, a display unit 12062, and an instrument panel 12063 are illustrated as the output device. For example, the display unit 12062 may include at least one of an on-board display and a head-up display.

Figure 27:
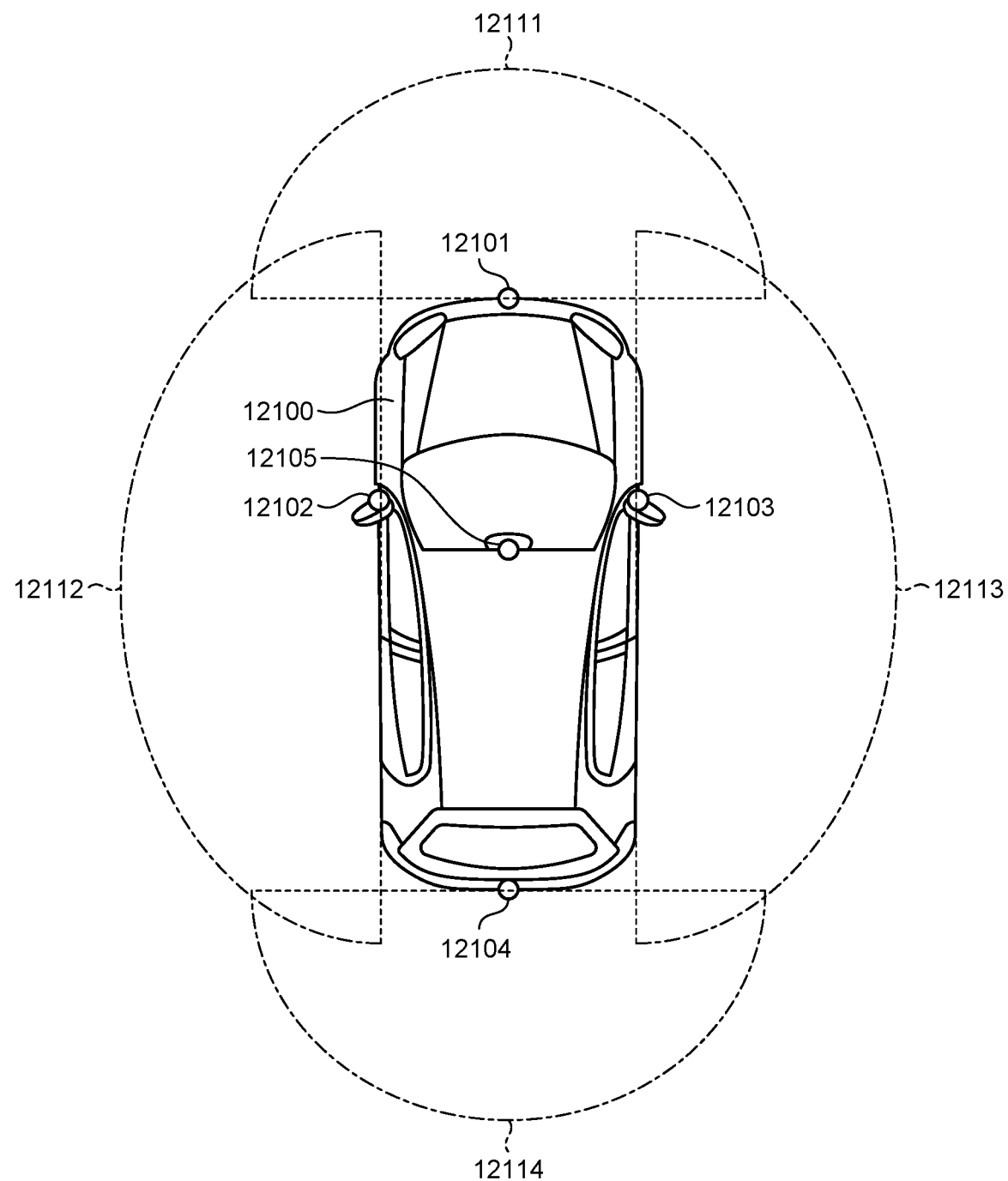
FIG. 27 is an explanatory diagram illustrating examples of positions at which an outside-vehicle information detection unit and an imaging unit are provided.

FIG. 27 is a diagram illustrating an example of a position at which the imaging unit 12031 is installed. In FIG. 27, a vehicle 12100 includes imaging units 12101, 12102, 12103, 12104, and 12105 as the imaging unit 12031.

The imaging units 12101, 12102, 12103, 12104, and 12105 are positioned, for example, at a front nose, at a side mirror, at a rear bumper, at a back door, and at an upper portion of a windshield in a vehicle interior of the vehicle 12100. The imaging unit 12101 provided at the front nose and the imaging unit 12105 provided at the upper portion of the windshield in the vehicle interior of the vehicle mainly acquire images in front of the vehicle 12100. The imaging units 12102 and 12103 provided at the side mirrors mainly acquire images around the sides of the vehicle 12100. The imaging unit 12104 provided at the rear bumper or the back door mainly acquires images behind the vehicle 12100. The front images acquired by the imaging units 12101 and 12105 are mainly used for detecting a preceding vehicle, a pedestrian, an obstacle, a traffic light, a traffic sign, a lane, and the like.

Note that an example of an imaging range of each of the imaging units 12101 to 12104 is illustrated in FIG. 27. An imaging range 12111 indicates an imaging range of the imaging unit 12101 provided at the front nose, imaging ranges 12112 and 12113 indicate imaging ranges of the imaging units 12102 and 12103 provided at the side mirrors, respectively, and an imaging range 12114 indicates an imaging range of the imaging unit 12104 provided at the rear bumper or the back door. For example, a bird's-eye view image of the vehicle 12100 as viewed from above is obtained by superimposing image data captured by the imaging units 12101 to 12104.

At least one of the imaging units 12101 to 12104 may have a function of acquiring distance information. For example, at least one of the imaging units 12101 to 12104 may be a stereo camera including a plurality of imaging elements, or may be an imaging element having pixels for detecting a phase difference.

For example, the microcomputer 12051 can obtain a distance to each three-dimensional object in the imaging ranges 12111 to 12114 and a temporal change of the distance (a relative speed with respect to the vehicle 12100) on the basis of the distance information obtained from the imaging units 12101 to 12104, thereby extracting, as a preceding vehicle, a three-dimensional object traveling at a predetermined speed (for example, 0 km/h or more) in the substantially same direction as the vehicle 12100, in particular, a three-dimensional object closest to the vehicle 12100 on a traveling track. In addition, the microcomputer 12051 can set an inter-vehicle distance to be secured in advance with respect to an immediate preceding vehicle to perform automatic brake control (including follow-up stop control), automatic acceleration control (including follow-up start control), and the like. As described above, it is possible to perform cooperative control for the purpose of automatic driving to autonomously travel or the like, rather than depending on a driver's operation.

For example, on the basis of the distance information obtained from the imaging units 12101 to 12104, the microcomputer 12051 can classify three-dimensional object data related to three-dimensional objects into a two-wheel vehicle, an ordinary vehicle, a large vehicle, a pedestrian, and other three-dimensional objects such as a utility pole, and extract the classified three-dimensional object data to be used in automatically avoiding an obstacle. For example, the microcomputer 12051 identifies obstacles around the vehicle 12100 as obstacles that can be visually recognized by the driver of the vehicle 12100 and obstacles that are difficult for the driver of the vehicle 12100 to visually recognize. Then, the microcomputer 12051 can determine a risk of collision indicating a degree of risk of collision with each obstacle. In a situation where the degree of risk of collision is higher than or equal to a set value, which indicates that there is a possibility of collision, the microcomputer 12051 can perform driving assistance to avoid the collision by outputting an alert to the driver via the audio speaker 12061 or the display unit 12062 or performing forcible deceleration or collision avoidance steering via the drive system control unit 12010.

At least one of the imaging units 12101 to 12104 may be an infrared camera detecting infrared rays. For example, the microcomputer 12051 can recognize a pedestrian by determining whether or not there is a pedestrian in images captured by the imaging units 12101 to 12104. Such recognition of a pedestrian is performed, for example, by extracting feature points in the images captured by the imaging units 12101 to 12104 as infrared cameras and performing pattern matching processing on a series of feature points indicating an outline of an object to determine whether or not the object is a pedestrian. When the microcomputer 12051 recognizes a pedestrian by determining that there is a pedestrian in the images captured by the imaging units 12101 to 12104, the sound image output unit 12052 controls the display unit 12062 to display a square contour line superimposed to emphasize the recognized pedestrian. Furthermore, the sound image output unit 12052 may control the display unit 12062 to display an icon or the like indicating a pedestrian at a desired position.

An example of the vehicle control system to which the technology according to the present disclosure can be applied has been described above. The technology according to the present disclosure can be applied to, for example, the imaging unit 12031 among the above-described components.

Specifically, the above-described imaging element can be applied to the imaging unit 12031. The imaging element according to the present disclosure is capable of both securing a wide sensitive region (charge accumulation electrode 12) and securing an accumulated amount Qs of charges in each pixel 101, thereby obtaining a higher quality captured image. This makes it possible to more accurately recognize a pedestrian and control a vehicle.

Note that the effects described in the present specification are merely examples and are not limited, and there may be other effects as well.

Note that the present technology can also have the following configurations.

(1) An imaging device comprising a pixel, wherein the pixel includes:
a photoelectric conversion layer;
a first electrode positioned close to a first surface of the photoelectric conversion layer and electrically connected to the photoelectric conversion layer;
a second electrode positioned on a second surface opposite to the first surface of the photoelectric conversion layer;
a charge accumulation electrode disposed close to the first surface of the photoelectric conversion layer and spaced apart from the first electrode in a direction parallel to the first surface; and
a third electrode disposed at a position to have a portion overlapping a gap between the first electrode and the charge accumulation electrode in a direction perpendicular to the first surface.

(2) The imaging device according to the above (1), wherein the third electrode is not connected to the first electrode and the charge accumulation electrode.

(3) The imaging device according to the above (1) or (2), wherein the third electrode has a portion overlapping at least one of the first electrode and the charge accumulation electrode in the direction perpendicular to the first surface.

(4) The imaging device according to the above (1) or (2), wherein the third electrode has no portions overlapping the first electrode and the charge accumulation electrode in the direction perpendicular to the first surface.

(5) The imaging device according to any one of the above (1) to (4), wherein the third electrode is disposed at a position to be shared by a plurality of the pixels.

(6) The imaging device according to any one of the above (1) to (5), wherein the first electrode is shared by a plurality of the pixels as a sharing unit, and
the third electrode is disposed at a position to be shared by the plurality of the pixels across the sharing unit.

(7) The imaging device according to any one of the above (1) to (6), wherein a plurality of the pixels are arranged in a matrix array, and
the third electrode is disposed at a position to be shared by pixels disposed in one row or column of the matrix array among the plurality of the pixels.

(8) The imaging device according to any one of the above (1) to (6), wherein a plurality of the pixels are arranged in a matrix array, and
the third electrode is disposed at a position to be shared by pixels disposed in adjacent two rows or adjacent two columns of the matrix array among the plurality of the pixels.

(9) The imaging device according to any one of the above (1) to (8), further comprising a separation electrode for electrically separating the pixel from another pixel adjacent thereto,
wherein the third electrode is connected to the separation electrode.

(10) The imaging device according to the above (9), wherein the third electrode is connected to the separation electrode via a vertical via.

(11) The imaging device according to any one of the above (1) to (8), wherein the photoelectric conversion layer, the first electrode, the second electrode, the charge accumulation electrode, and the third electrode are disposed close to a third surface of a semiconductor substrate, and
the third electrode is connected to a wiring disposed in a wiring layer formed on a fourth surface opposite to the third surface of the semiconductor substrate by penetrating through the semiconductor substrate.

(12) The imaging device according to any one of the above (1) to (11), wherein the pixel has a rectangular shape, and the first electrode is disposed along any side of the rectangular shape.

(13) The imaging device according to any one of the above (1) to (11), wherein the pixel has a rectangular shape, and the first electrode is disposed at any corner of the rectangular shape.

(14) The imaging device according to any one of the above (1) to (5) and (9) to (13), wherein in a first state, a first voltage is applied to the third electrode, the first voltage being lower than a voltage applied to the charge accumulation electrode, and
in a second state transitioning from the first state, a second voltage is applied to the third electrode, the second voltage being higher than the voltage applied to the charge accumulation electrode and higher than the first voltage.

(15) The imaging device according to the above (1) or (3) or (4) or (12) or (13), wherein the third electrode is connected to the first electrode.

(16) The imaging device according to the above (15), wherein in a first state, a third voltage is applied to the third electrode, and a fourth voltage higher than the third voltage is applied to the charge accumulation electrode, and
in a second state transitioning from the first state, the fourth voltage is applied to the third electrode, and the third voltage is applied to the charge accumulation electrode.

(17) An electronic device comprising:
an imaging device including a pixel, wherein the pixel includes: a photoelectric conversion layer; a first electrode positioned close to a first surface of the photoelectric conversion layer and electrically connected to the photoelectric conversion layer; a second electrode positioned on a second surface opposite to the first surface of the photoelectric conversion layer; a charge accumulation electrode disposed close to the first surface of the photoelectric conversion layer and spaced apart from the first electrode in a direction parallel to the first surface; and a third electrode disposed at a position to have a portion overlapping a gap between the first electrode and the charge accumulation electrode in a direction perpendicular to the first surface;
an image processing unit that performs image processing on a pixel signal based on a charge generated by the photoelectric conversion layer to generate image data; and
a storage unit that stores the image data generated by the image processing unit.

REFERENCE SIGNS LIST

11, 11a, 11b FIRST ELECTRODE
11ex, 200, 200$_{cen}$, 200$_{col}$, 200$_{col(a)}$, 200$_{col(b)}$, 200$_{col(c)}$, 200$_{lft}$, 200$_{rht}$, 200$^{row}$, 200$_{row(2)}$, 200$_{row(a)}$, 200$_{row(b)}$ BARRIER FORMATION ELECTRODE
12 CHARGE ACCUMULATION ELECTRODE
14 GAP
15, 15pan PHOTOELECTRIC CONVERSION LAYER 16 SECOND ELECTRODE
61 CONTACT HOLE
63 PAD
70 SEMICONDUCTOR SUBSTRATE
101, $101a$, $101b$, $101c$, $101d$, $101e_{11}$, $101e_{12}$, $101e_{13}$, $101e_{14}$, $101e_{21}$, $101e_{22}$, $101e_{23}$, $101e_{24}$, $101f_{11}$, $101f_{12}$, $101f_{13}$, $101f_{14}$, $101f_{21}$, $101f_{22}$, $101f_{23}$, $101f_{24}$, $101g_{11}$, $101g_{12}$, $101g_{13}$, $101g_{14}$, $101g_{21}$, $101g_{22}$, $101g_{23}$, $101g_{24}$, $101h_{11}$, $101h_{12}$, $101h_{13}$, $101h_{14}$, $101h_{21}$, $101h_{22}$, $101h_{23}$, $101h_{24}$ PIXEL
221 VERTICAL VIA
220 PIXEL SEPARATION ELECTRODE
240 THROUGH ELECTRODE

The invention claimed is:

1. An imaging device comprising a pixel, wherein the pixel includes:
    a photoelectric conversion layer;
    a first electrode positioned proximate to a first surface of the photoelectric conversion layer and electrically connected to the photoelectric conversion layer;
    a second electrode positioned on a second surface opposite to the first surface of the photoelectric conversion layer;
    a charge accumulation electrode disposed proximate to the first surface of the photoelectric conversion layer and spaced apart from the first electrode in a direction parallel to the first surface; and
    a third electrode disposed at a position to have a portion overlapping a gap between the first electrode and the charge accumulation electrode in a direction perpendicular to the first surface, wherein
    the first electrode is shared by a plurality of the pixels as a sharing unit, and
    the third electrode is disposed at a position to be shared by the plurality of the pixels across the sharing unit.

2. The imaging device according to claim 1, wherein the third electrode is not connected to the first electrode and the charge accumulation electrode.

3. The imaging device according to claim 1, wherein the third electrode has a portion overlapping at least one of the first electrode and the charge accumulation electrode in the direction perpendicular to the first surface.

4. The imaging device according to claim 1, wherein the third electrode has no portions overlapping the first electrode and the charge accumulation electrode in the direction perpendicular to the first surface.

5. The imaging device according to claim 1, wherein a plurality of the pixels are arranged in a matrix array, and
    the third electrode is disposed at a position to be shared by pixels disposed in one row or column of the matrix array among the plurality of the pixels.

6. The imaging device according to claim 1, wherein a plurality of the pixels are arranged in a matrix array, and
    the third electrode is disposed at a position to be shared by pixels disposed in adjacent two rows or adjacent two columns of the matrix array among the plurality of the pixels.

7. The imaging device according to claim 1, wherein the pixel has a rectangular shape, and
    the first electrode is disposed along any side of the rectangular shape.

8. The imaging device according to claim 1, wherein the pixel has a rectangular shape, and
    the first electrode is disposed at any corner of the rectangular shape.

9. An electronic device comprising:
    an imaging device according to claim 1;
    an image processing unit that performs image processing on a pixel signal based on a charge generated by the photoelectric conversion layer to generate image data; and
    a storage unit that stores the image data generated by the image processing unit.

10. An imaging device comprising a pixel, wherein the pixel includes:
    a photoelectric conversion layer;
    a first electrode positioned proximate to a first surface of the photoelectric conversion layer and electrically connected to the photoelectric conversion layer;
    a second electrode positioned on a second surface opposite to the first surface of the photoelectric conversion layer;
    a charge accumulation electrode disposed proximate to the first surface of the photoelectric conversion layer and spaced apart from the first electrode in a direction parallel to the first surface;
    a third electrode disposed at a position to have a portion overlapping a gap between the first electrode and the charge accumulation electrode in a direction perpendicular to the first surface; and
    a separation electrode for electrically separating the pixel from another pixel adjacent thereto,
    wherein the third electrode is connected to the separation electrode.

11. The imaging device according to claim 10, wherein the third electrode is connected to the separation electrode via a vertical via.

12. An electronic device comprising:
    an imaging device according to claim 9;
    an image processing unit that performs image processing on a pixel signal based on a charge generated by the photoelectric conversion layer to generate image data; and
    a storage unit that stores the image data generated by the image processing unit.

13. An imaging device comprising a pixel, wherein the pixel includes:
    a photoelectric conversion layer;
    a first electrode positioned proximate to a first surface of the photoelectric conversion layer and electrically connected to the photoelectric conversion layer;
    a second electrode positioned on a second surface opposite to the first surface of the photoelectric conversion layer;
    a charge accumulation electrode disposed proximate to the first surface of the photoelectric conversion layer and spaced apart from the first electrode in a direction parallel to the first surface; and
    a third electrode disposed at a position to have a portion overlapping a gap between the first electrode and the charge accumulation electrode in a direction perpendicular to the first surface, wherein
    the photoelectric conversion layer, the first electrode, the second electrode, the charge accumulation electrode, and the third electrode are disposed proximate to a third surface of a semiconductor substrate, and
    the third electrode is connected to a wiring disposed in a wiring layer formed on a fourth surface opposite to the third surface of the semiconductor substrate by penetrating through the semiconductor substrate.

14. An electronic device comprising:
an imaging device according to claim 13;
an image processing unit that performs image processing on a pixel signal based on a charge generated by the photoelectric conversion layer to generate image data; and
a storage unit that stores the image data generated by the image processing unit.

15. An imaging device comprising a pixel, wherein the pixel includes:
a photoelectric conversion layer;
a first electrode positioned proximate to a first surface of the photoelectric conversion layer and electrically connected to the photoelectric conversion layer;
a second electrode positioned on a second surface opposite to the first surface of the photoelectric conversion layer;
a charge accumulation electrode disposed proximate to the first surface of the photoelectric conversion layer and spaced apart from the first electrode in a direction parallel to the first surface; and
a third electrode disposed at a position to have a portion overlapping a gap between the first electrode and the charge accumulation electrode in a direction perpendicular to the first surface, wherein
in a first state, a first voltage is applied to the third electrode, the first voltage being lower than a voltage applied to the charge accumulation electrode, and
in a second state transitioning from the first state, a second voltage is applied to the third electrode, the second voltage being higher than the voltage applied to the charge accumulation electrode and higher than the first voltage.

16. An electronic device comprising:
an imaging device according to claim 15;
an image processing unit that performs image processing on a pixel signal based on a charge generated by the photoelectric conversion layer to generate image data; and
a storage unit that stores the image data generated by the image processing unit.

17. An imaging device comprising a pixel, wherein the pixel includes:
a photoelectric conversion layer;
a first electrode positioned proximate to a first surface of the photoelectric conversion layer and electrically connected to the photoelectric conversion layer;
a second electrode positioned on a second surface opposite to the first surface of the photoelectric conversion layer;
a charge accumulation electrode disposed proximate to the first surface of the photoelectric conversion layer and spaced apart from the first electrode in a direction parallel to the first surface; and
a third electrode disposed at a position to have a portion overlapping a gap between the first electrode and the charge accumulation electrode in a direction perpendicular to the first surface, wherein
the third electrode is connected to the first electrode,
in a first state, a third voltage is applied to the third electrode, and a fourth voltage higher than the third voltage is applied to the charge accumulation electrode, and
in a second state transitioning from the first state, the fourth voltage is applied to the third electrode, and the third voltage is applied to the charge accumulation electrode.

18. An electronic device comprising:
an imaging device according to claim 17;
an image processing unit that performs image processing on a pixel signal based on a charge generated by the photoelectric conversion layer to generate image data; and
a storage unit that stores the image data generated by the image processing unit.

* * * * *